US011900885B2

(12) United States Patent
Han et al.

(10) Patent No.: US 11,900,885 B2
(45) Date of Patent: Feb. 13, 2024

(54) DISPLAY PANEL AND DISPLAY APPARATUS

(71) Applicant: BOE TECHNOLOGY GROUP CO., LTD., Beijing (CN)

(72) Inventors: Ying Han, Beijing (CN); Xuehuan Feng, Beijing (CN); Yicheng Lin, Beijing (CN); Pan Xu, Beijing (CN); Guoying Wang, Beijing (CN); Xing Zhang, Beijing (CN); Zhan Gao, Beijing (CN); Mingi Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/908,021

(22) PCT Filed: Sep. 17, 2021

(86) PCT No.: PCT/CN2021/119181
§ 371 (c)(1),
(2) Date: Aug. 30, 2022

(87) PCT Pub. No.: WO2022/134681
PCT Pub. Date: Jun. 30, 2022

(65) Prior Publication Data
US 2023/0086927 A1 Mar. 23, 2023

(30) Foreign Application Priority Data
Dec. 23, 2020 (WO) ................ PCT/CN2020/138717

(51) Int. Cl.
*G09G 3/32* (2016.01)
*G09G 3/3266* (2016.01)
(Continued)

(52) U.S. Cl.
CPC ......... *G09G 3/3266* (2013.01); *G09G 3/3275* (2013.01); *G11C 19/28* (2013.01);
(Continued)

(58) Field of Classification Search
CPC .......... G09G 3/3266; G09G 3/32; G09G 3/30; G09G 3/22; G09G 3/14; G09G 3/3275;
(Continued)

(56) References Cited

U.S. PATENT DOCUMENTS 6,005,645 A * 12/1999 Hirakata ................ G09G 3/003
348/E13.058
8,471,981 B2 * 6/2013 Kim ..................... G09G 3/3674
349/151
(Continued)

FOREIGN PATENT DOCUMENTS

CN 102289123 A 12/2011
CN 104464533 A 3/2015
(Continued)

OTHER PUBLICATIONS

Fang, "Design of Gate Driver Based on Amorphous Silicon Thin Film Transistor for High Resolution Liquid Crystal Display" (with English abstract), Shanghai Jiao Tong University, Master of Engineering Dissertation, Jan. 2017, 61 pages.
(Continued)

*Primary Examiner* — Pegeman Karimi
(74) *Attorney, Agent, or Firm* — Dority & Manning, P.A.

(57) ABSTRACT

A display panel includes: a substrate, sub-pixels and a gate drive circuit. The sub-pixel includes a pixel drive circuit. The gate drive circuit includes cascaded shift registers, and a shift register is electrically connected to pixel drive circuits in a row of sub-pixels. The gate drive circuit further includes cascade input signal lines and cascade display reset signal lines. The cascade input signal line is configured to connect a shift signal terminal and an input signal terminal of two different shift register, and the cascade display reset signal line is configured to connect a shift signal terminal and a display reset signal terminal of two different shift register. The display panel has sub-pixel regions for arranging the
(Continued)

sub-pixels and first gap regions each located between two adjacent columns of sub pixel regions: the cascade display reset signal lines and the cascade input signal lines are disposed in different first gap regions.

16 Claims, 24 Drawing Sheets

(51) Int. Cl.
    *H10K 59/121*     (2023.01)
    *H10K 59/131*     (2023.01)
    *G09G 3/3275*     (2016.01)
    *G11C 19/28*     (2006.01)
    *H01L 27/12*     (2006.01)

(52) U.S. Cl.
    CPC ....... *H01L 27/124* (2013.01); *H10K 59/1213* (2023.02); *H10K 59/1216* (2023.02); *H10K 59/1315* (2023.02); *G09G 2300/0842* (2013.01); *G09G 2310/0278* (2013.01); *G09G 2310/0286* (2013.01); *G09G 2310/061* (2013.01); *G09G 2320/0233* (2013.01)

(58) Field of Classification Search
    CPC ... G09G 2300/0842; G09G 2310/0278; G09G 2310/0286; G09G 2310/061; G09G 2320/0233; G09G 3/3233; G09G 2300/0426; G11C 19/28; H01L 27/124; H10K 59/1213; H10K 59/1216; H10K 59/1315
    See application file for complete search history.

(56) References Cited

U.S. PATENT DOCUMENTS

| | | | |
|---|---|---|---|
| 10,283,063 B2 | 5/2019 | Aoki | |
| 2008/0284931 A1* | 11/2008 | Kimura | G02F 1/13624 349/39 |
| 2014/0078123 A1* | 3/2014 | Park | G02F 1/13454 345/205 |
| 2015/0220194 A1 | 8/2015 | Lin et al. | |
| 2016/0247869 A1 | 8/2016 | Li et al. | |
| 2016/0329021 A1 | 11/2016 | Nagayama et al. | |
| 2017/0117341 A1 | 4/2017 | Chen et al. | |
| 2018/0005594 A1 | 1/2018 | Takeuchi et al. | |
| 2019/0066599 A1 | 2/2019 | Kim et al. | |
| 2020/0111859 A1 | 4/2020 | Ko et al. | |
| 2020/0233274 A1 | 7/2020 | Wang | |
| 2021/0201837 A1 | 7/2021 | Kuo et al. | |
| 2021/0202677 A1 | 7/2021 | Kim et al. | |
| 2021/0358365 A1 | 11/2021 | Feng et al. | |
| 2021/0358381 A1 | 11/2021 | Wang et al. | |
| 2022/0130328 A1 | 4/2022 | Shin et al. | |
| 2022/0190093 A1 | 6/2022 | No et al. | |
| 2022/0343858 A1 | 10/2022 | Feng et al. | |

FOREIGN PATENT DOCUMENTS

| | | | |
|---|---|---|---|
| CN | 105388675 A | 3/2016 | |
| CN | 105575318 A | 5/2016 | |
| CN | 106873276 A | 6/2017 | |
| CN | 106971696 A | 7/2017 | |
| CN | 107256692 A | 10/2017 | |
| CN | 108182921 A | 6/2018 | |
| CN | 108492760 A | 9/2018 | |
| CN | 109326256 A | 2/2019 | |
| CN | 111505852 A | 8/2020 | |
| CN | 111508438 A | 8/2020 | |
| CN | 112230482 A | 1/2021 | |

OTHER PUBLICATIONS

International Search Report and Written Opinion (with English translation) for PCT/CN2020/138717, dated Aug. 27, 2021, 16 pages.
International Search Report (w/ English translation) and Written Opinion for PCT/CN2021/119181, dated Nov. 26, 2021, 10 pages.
Office Action for corresponding U.S. Appl. No. 17/791,558, dated Apr. 28, 2023, 31 pages.
Office Action for corresponding U.S. Appl. No. 17/791,558, dated Sep. 18, 2023, 22 pages.

* cited by examiner

DISPLAY PANEL AND DISPLAY APPARATUS

CROSS-REFERENCE TO RELATED APPLICATIONS

This application is a national phase entry under 35 USC 371 of International Patent Application No. PCT/CN2021/119181, filed on Sep. 17, 2021, which claims priority to International Application No. PCT/CN2020/138717, filed on Dec. 23, 2020, which are incorporated herein by reference in their entirety.

TECHNICAL FIELD

The present disclosure relates to the field of display technologies, and in particular, to a display panel and a display apparatus.

BACKGROUND

A gate drive circuit (also referred to as a scan drive circuit) is an integral part of a display apparatus. The gate drive circuit may include a plurality of cascaded shift registers, and each shift register is electrically connected to a gate line in the display apparatus. The gate drive circuit may input scan signals (also referred to as gate signals) row by row to a plurality of gate lines in the display apparatus, and drive sub-pixels in each row in the display apparatus to perform display, thereby enabling the display apparatus to display an image.

The gate drive circuit is provided in a display panel of the display apparatus, which may effectively reduce costs and improve yield.

SUMMARY

In an aspect, a display panel is provided. The display panel includes: a substrate; a plurality of sub-pixels disposed on a side of the substrate; and a gate drive circuit located on a same side of the substrate as the plurality of sub-pixels. The plurality of sub-pixels are arranged in a plurality of rows and a plurality of columns, sub-pixels in a row are arranged in a first direction and sub-pixels in a column are arranged in a second direction. A sub-pixel includes a pixel drive circuit and a light-emitting device electrically connected to the pixel drive circuit. The gate drive circuit includes a plurality of cascaded shift registers, and a shift register is electrically connected to a plurality of pixel drive circuits in a row of sub-pixels. The shift register includes a plurality of device groups, and a device group is located in a region between two adjacent sub-pixels in the corresponding row of sub-pixels. The device group includes at least one transistor and/or at least one capacitor. The gate drive circuit further includes a plurality of cascade input signal lines and a plurality of cascade display reset signal lines; a cascade input signal line is configured to connect a shift signal terminal of one shift register and an input signal terminal of another shift register; and a cascade display reset signal line is configured to connect a shift signal terminal of one shift register and a display reset signal terminal of another shift register. The display panel has a plurality of sub-pixel regions for arranging the plurality of sub-pixels and first gap regions each located between two adjacent columns of sub-pixel regions; and the cascade display reset signal lines and the cascade input signal lines are disposed in the first gap regions, and both are disposed in different first gap regions.

In some embodiments, the plurality of cascade input signal lines are divided into a plurality of groups, each group of cascade input signal lines includes at least one cascade input signal line, and at least one group of cascade input signal lines is disposed in a first gap region. The plurality cascade display reset signal lines are divided into a plurality of groups. Each group of cascade display reset signal lines includes at least one cascade display reset signal line, and at least one group of cascade display reset signal lines is disposed in another first gap region.

In some embodiments, at least one column of sub-pixels is disposed between two adjacent groups of cascade input signal lines located in different first gap regions. At least one column of sub-pixels is disposed between two adjacent groups of cascade display reset signal lines located in different first gap regions.

In some embodiments, groups of cascade input signal lines are disposed in the first gap region, and at least one row of sub-pixels is disposed between two adjacent groups of cascade input signal lines located in a same first gap region. Groups of cascade display reset signal lines are disposed in the another first gap region, and at least one row of sub-pixels is disposed between two adjacent groups of cascade display reset signal lines located in a same first gap region.

In some embodiments, the display panel further includes a plurality of data lines extending along the second direction. A data line is electrically connected to pixel drive circuits in a column of sub-pixels. The plurality of cascade input signal lines, the plurality of cascade display reset signal lines, and the plurality of data lines are made of a same material and disposed in a same layer.

In some embodiments, the plurality of sub-pixels are divided into a plurality of pixel units; a pixel unit includes at least three sub-pixels arranged in sequence in the first direction; and the plurality of pixel units are arranged in a plurality of rows and a plurality of columns, pixel units in a row are arranged in the first direction and pixel units in a column are arranged in the second direction. A region between any two adjacent columns of pixel units is a first gap region.

In some embodiments, each sub-pixel region includes a sub-pixel circuit region for arranging a corresponding pixel drive circuit and a sub-pixel light-emitting region for arranging a corresponding light-emitting device that are arranged in the second direction. In the second direction, any three adjacent rows of sub-pixel regions are a first row of sub-pixel regions, a second row of sub-pixel regions, and a third row of sub-pixel regions. A region between the first row of sub-pixel regions and the second row of sub-pixel regions is a second gap region, and a region between the second row of sub-pixel regions and the third row of sub-pixel regions is a third gap region. In the first row of sub-pixel regions and the second row of sub-pixel regions, sub-pixel light-emitting regions are all closer to the second gap region than sub-pixel circuit regions. In the second row of sub-pixel regions and the third row of sub-pixel regions, sub-pixel circuit regions are all closer to the third gap region than sub-pixel light-emitting regions.

In some embodiments, the display panel further includes a plurality of power supply voltage lines and a plurality of auxiliary power supply voltage lines. The power supply voltage lines extend along the second direction, and the auxiliary power supply voltage lines extend along the first direction. Each power supply voltage line is electrically connected to auxiliary power supply voltage lines. At least three sub-pixel regions constitute a pixel region, each row of pixel regions corresponds to at least one auxiliary power supply voltage line; and pixel drive circuits in sub-pixels in at least one pixel region corresponding to any auxiliary power supply voltage line are all electrically connected to the auxiliary power supply voltage line.

In some embodiments, the display panel further includes a passivation layer, a color filter layer and a planarization layer that are disposed on the substrate in sequence and located between pixel drive circuits and light-emitting devices in the plurality of sub-pixels. The passivation layer and the planarization layer are together provided with first via holes each penetrating through both of the passivation layer and the planarization layer; the pixel drive circuit is electrically connected to the light-emitting device through a first via hole in the first via holes. The color filter layer includes a plurality of filter portions, each filter portion is disposed in a sub-pixel light-emitting region of a corresponding sub-pixel region; in a same sub-pixel region, in the second direction, a filter portion and the first via hole have at least a portion of the pixel drive circuit located in the sub-pixel region and/or an auxiliary power supply voltage line located in the sub-pixel region therebetween.

In some embodiments, the display panel further includes: gate lines for transmitting gate signals, data lines for transmitting data signals, and first sensing signal lines for transmitting sensing signals.

The pixel drive circuit includes: a switching transistor, a storage capacitor, a driving transistor and a sensing transistor. A control electrode of the switching transistor is electrically connected to a gate line in the gate lines, and a first electrode of the switching transistor being electrically connected to a data line in the data lines. A first electrode plate of the storage capacitor being electrically connected to a second electrode of the switching transistor, and a second electrode plate of the storage capacitor being electrically connected to the light-emitting device. A control electrode of the driving transistor being electrically connected to the second electrode of the switching transistor and the first electrode plate of the storage capacitor, a first electrode of the driving transistor being electrically connected to the auxiliary power supply voltage line, and a second electrode of the driving transistor being electrically connected to the light-emitting device and the second electrode plate of the storage capacitor. A control electrode of the sensing transistor being electrically connected to the gate line, a first electrode of the sensing transistor being electrically connected to a first sensing signal line in the first sensing signal lines, and a second electrode of the sensing transistor being electrically connected to the light-emitting device, the second electrode plate of the storage capacitor and the second electrode of the driving transistor. The switching transistor and the sensing transistor are farther away from the sub-pixel light-emitting region of the sub-pixel region where the pixel drive circuit is located than the driving transistor.

In some embodiments, the display panel includes an active layer, a gate insulating layer, a gate conductive layer, an interlayer dielectric layer and a source-drain conductive layer that are disposed on the substrate in sequence. The active layer includes first electrodes, channel portions and second electrodes of the switching transistor, the driving transistor and the sensing transistor; the gate conductive layer includes control electrodes of the switching transistor, the driving transistor and the sensing transistor; and the source-drain conductive layer includes first connection patterns and second connection patterns. The interlayer dielectric layer and the gate insulating layer are together provided with second via holes each penetrating through both of the interlayer dielectric layer and the gate insulating layer, and the interlayer dielectric layer is provided with third via holes therein; a first connection pattern in the first connection patterns is electrically connected to the second electrode of the switching transistor through a second via hole in the second via holes, and is electrically connected to the control electrode of the driving transistor through a third via hole in the third via holes. The interlayer dielectric layer is further provided with fourth via holes therein, and a second connection pattern in the second connection patterns is electrically connected to the second electrode of the driving transistor through a fourth via hole in the fourth via holes. In the same sub-pixel region, in the second direction, the filter portion and the first via hole have the control electrode, the channel portion and the first electrode of the driving transistor and the auxiliary supply voltage line therebetween.

In some embodiments, the display panel further includes a first electrode layer and a buffer layer that are disposed on the substrate in sequence. The first electrode layer and the buffer layer are located on a side of the active layer proximate to the substrate; the first electrode layer includes the second electrode plate of the storage capacitor, and the active layer further includes the first electrode plate of the storage capacitor. The interlayer dielectric layer is further provided with fifth via holes therein, the first connection pattern is further electrically connected to the first electrode plate of the storage capacitor through a fifth via hole in the fifth via holes; the interlayer dielectric layer and the buffer layer are together provided with sixth via holes each penetrating through both of the interlayer dielectric layer and the buffer layer, and the second connection pattern is further electrically connected to the second electrode plate of the storage capacitor through a sixth via hole in the sixth via holes. The fifth via hole and the sixth via hole are both located on a side of the storage capacitor proximate to the third gap region.

In some embodiments, each row of pixel regions corresponds to auxiliary power supply voltage lines. In the first direction, two adjacent auxiliary power supply voltage lines are separated by the first gap region.

In some embodiments, each column of pixel regions corresponds to one power supply voltage line, and the power supply voltage line is located on a side of opposite sides of the column of pixel regions in the first direction. Each pixel region corresponds to one auxiliary power supply voltage line, and each auxiliary power supply voltage line is electrically connected to the pixel drive circuits in the sub-pixels in the corresponding pixel region.

In some embodiments, the display panel further includes: an active layer, a gate insulating layer, a gate conductive layer, an interlayer dielectric layer and a source-drain conductive layer that are disposed on the substrate in sequence. The pixel drive circuit includes a driving transistor, the active layer includes a first electrode, a channel portion and a second electrode of the driving transistor; the source-drain conductive layer includes a plurality of third connection patterns; and the plurality of auxiliary power supply voltage lines are located in the gate conductive layer. The interlayer dielectric layer is provided with seventh via holes therein, and the interlayer dielectric layer and the gate insulating layer are together provided with eighth via holes therein; a third connection pattern in the plurality of third connection patterns is electrically connected to a corresponding auxiliary power supply voltage line through a seventh via hole in the seventh via holes; and is electrically connected to the first electrode of the driving transistor through an eighth via hole in the eighth via holes. The power supply voltage lines are located in the source-drain conductive layer. In a same pixel region, a third connection pattern in third connection patterns that is closest to a power supply voltage line corresponding to the pixel region is electrically connected to the power supply voltage line.

In some embodiments, the display panel further includes a plurality of gate lines. Each of the gate lines is in a shape of a polyline and substantially extends along the first direction, and a gate line is electrically connected to pixel drive circuits in a row of sub-pixels.

The gate line includes a plurality of first extension segments, a plurality of second extension segments and a plurality of connection segments. Each of the first extension segments and each of the second extension segments substantially extend along the first direction, the plurality of first extension segments and the plurality of second extension segments are alternately arranged, and a first extension segment and an adjacent second extension segment are connected by a connection segment. In the second direction, a distance exists between extension lines of the first extension segment and the adjacent second extension segment.

The first extension segment and two connection segments connected to the first extension segment together constitute a first recess, and an opening of the first recess is disposed towards a side of the gate line away from the third gap region. The second extension segment and two connection segments connected to the second extension segment together constitute a second recess, and an opening of the second recess is disposed towards the third gap region. At least a portion of the pixel drive circuit is located in the first recess or the second recess.

In some embodiments, the pixel driver circuit includes a first sensing signal line located in the third gap region and extending along the first direction. In a case where the plurality of sub-pixels are divided into a plurality of pixel units, and a pixel unit includes at least three sub-pixels arranged in sequence in the first direction, in sub-pixels located in the second row of sub-pixel regions and the third row of sub-pixel regions, two pixel units opposite to each other in the second direction share the first sensing signal line.

In some embodiments, the sub-pixel further includes a light-shielding pattern disposed on a side of the pixel drive circuit proximate to the substrate. The first sensing signal line and the light-shielding pattern are made of a same material and disposed in a same layer.

In some embodiments, the pixel drive circuit further includes a second sensing signal line extending along the second direction. The second sensing signal line is located in a region between two adjacent columns of sub-pixels in the two pixel units opposite to each other in the second direction; and the first sensing signal line is electrically connected to the second sensing signal line through a via hole.

In some embodiments, in a case where the display panel further includes a plurality of data lines extending along the second direction, the second sensing signal line and the plurality of data lines are made of a same material and disposed in a same layer.

In some embodiments, the gate drive circuit further includes a plurality of transmission signal lines located in second gap regions and extending along the first direction. Two shift registers electrically connected to sub-pixels located in the first row of sub-pixel regions and sub-pixels located in the second row of sub-pixel regions share at least one of the plurality of transmission signal lines.

In some embodiments, the gate drive circuit further includes: a first voltage signal line electrically connected to first voltage signal terminals of the two shift registers; a second voltage signal line electrically connected to second voltage signal terminals of the two shift registers; and a third voltage signal line electrically connected to third voltage signal terminals of the two shift registers. A transmission signal line of the plurality of transmission signal lines is the first voltage signal line, the second voltage signal line, or the third voltage signal line.

In some embodiments, at least one cascade input signal line includes a first input signal sub-line and a second input signal sub-line that are located in different first gap regions, the gate drive circuit further includes an input signal connection line located in a second gap region and electrically connected to the first input signal sub-line and the second input signal sub-line, and a transmission signal line of the plurality of transmission signal lines is the input signal connection line; and/or at least one cascade display reset signal line includes a first display reset signal sub-line and a second display reset signal sub-line that are located in different first gap regions, the gate drive circuit further includes a display reset connection line located in a second gap region and electrically connected to the first display reset signal sub-line and the second display reset signal sub-line, and a transmission signal line of the plurality of transmission signal lines is the display reset connection line.

In some embodiments, the gate drive circuit further includes a plurality of node voltage transmission lines located in the second gap regions. In a same shift register, at least two device groups are electrically connected to a same node through a node voltage transmission line. In the two shift registers, at least two device groups are electrically connected to a same node through a node voltage transmission line. Transmission signal lines of the plurality of transmission signal lines are the node voltage transmission lines.

In some embodiments, the shift register includes: a first input circuit electrically connected to the input signal terminal, a pull-up node, and a leakage prevention node; the first input circuit being configured to, during a display period of a frame display phase, transmit an input signal to the pull-up node and the leakage prevention node in response to the input signal received at the input signal terminal; an output circuit electrically connected to the pull-up node, a first clock signal terminal, and a first output signal terminal; the output circuit being configured to, during the display period of the frame display phase, transmit a first clock signal received at the first clock signal terminal to the first output signal terminal under control of a voltage of the pull-up node; and a leakage prevention circuit electrically connected to the pull-up node, the first voltage signal terminal and the leakage prevention node; the leakage prevention circuit being configured to transmit a first voltage signal received at the first voltage signal terminal to the leakage prevention node under control of the voltage of the pull-up node, so as to prevent leakage of the pull-up node. The first input circuit, the output circuit, and the leakage prevention circuit each include at least one device group. At least one device group used to be electrically connected to the pull-up node in the first input circuit and at least one device group used to be electrically connected to the pull-up node in the output circuit are electrically connected to the pull-up node through a node voltage transmission line. At least one device group used to be electrically connected to the leakage prevention node in the first input circuit and at least one device group used to be electrically connected to the leakage prevention node in the leakage prevention circuit are electrically connected to the leakage prevention node through another node voltage transmission line.

In some embodiments, the gate drive circuit further includes a plurality of blanking input circuits; a blanking input circuit is electrically connected to at least two adjacent shift registers. The blanking input circuit is configured to, during a blanking period of the frame display phase, control a corresponding shift register to input a blanking control signal to pixel drive circuits in a corresponding row, so that the pixel drive circuits obtain sensing signals. The blanking input circuit includes: a selection control circuit electrically connected to a selection control signal terminal, a shift signal terminal, a second voltage signal terminal, and a first blanking node, the selection control circuit being configured to transmit a shift signal received at the shift signal terminal to the first blanking node under control of a selection control signal transmitted by the selection control signal terminal; a second input circuit electrically connected to the first blanking node, a second blanking node, and a second clock signal terminal or the first voltage signal terminal, the second input circuit being configured to transmit a second clock signal received at the second clock signal terminal or the first voltage signal received at the first voltage signal terminal to the second blanking node under control of a voltage of the first blanking node; and at least two transmission circuits, a transmission circuit being electrically connected to the pull-up node of a corresponding shift register, the transmission circuit being further electrically connected to the second blanking node and the second clock signal terminal, and the transmission circuit being configured to transmit the second clock signal or the first voltage signal received at the second blanking node to the pull-up node under control of the second clock signal transmitted by the second clock signal terminal. The second input circuit and the transmission circuit each include at least one device group; and each of device groups included in the second input circuit and the transmission circuit is located in a region between two adjacent sub-pixels in a row of sub-pixels where a corresponding shift register is located. At least one device group used to be electrically connected to the second blanking node in the second input circuit and at least one device group used to be electrically connected to the second blanking node in the at least two transmission circuits are electrically connected to the second blanking node through a node voltage transmission line.

In some embodiments, the display panel further includes a plurality of gate lines extending along the first direction. A gate line is electrically connected to the pixel drive circuits in the row of sub-pixels. The plurality of transmission signal lines and the plurality of gate lines are made of a same material and disposed in a same layer.

In some embodiments, the gate drive circuit further includes a plurality of control signal lines extending along the second direction. The shift register is electrically connected to at least part of the plurality of control signal lines; and the shift register is configured to provide an output signal to the pixel drive circuits in the corresponding row of sub-pixels under control of the at least part of the control signal lines electrically connected to the shift register.

In some embodiments, at least one of the plurality of control signal lines is located in a first gap region.

In another aspect, a display apparatus is provided. The display apparatus includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, and an actual process of a method involved in the embodiments of the present disclosure.

FIG. 13b and FIG. 13c are partial enlarged views of A in FIG. 13a;

DETAILED DESCRIPTION

Figure 1:
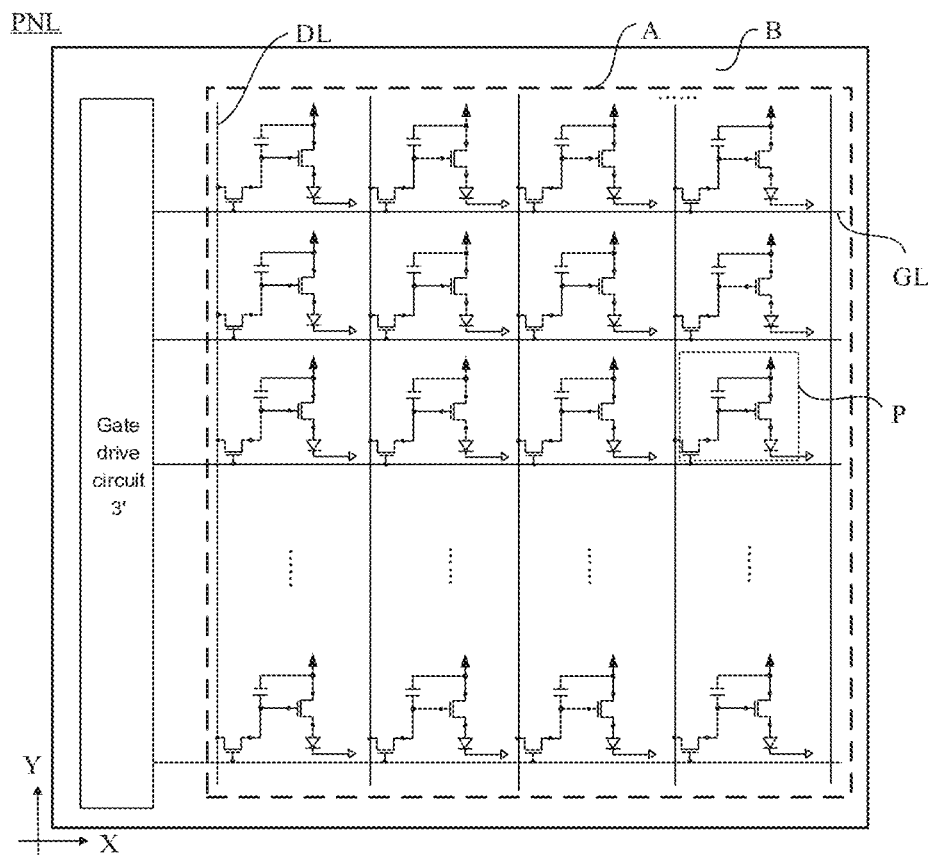
FIG. 1 is a structural diagram of a display panel, in accordance with the related art.

Technical solutions in some embodiments of the present disclosure will be described clearly and completely below with reference to the accompanying drawings. However, the described embodiments are merely some but not all embodiments of the present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of", "the plurality of" or "multiple" means two or more unless otherwise specified.

In the description of some embodiments, the term "electrically connected" and derivatives thereof may be used. For example, the term "electrically connected" may be used in the description of some embodiments to indicate that two or more components are in direct physical or electrical contact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting," depending on the context. Similarly, the phrase "if it is determined" or "if [a stated condition or event] is detected" is optionally construed as "in a case where it is determined" or "in response to determining" or "in a case where [the stated condition or event] is detected" or "in response to detecting [the stated condition or event]," depending on the context.

The phrase "applicable to" or "configured to" used herein has an open and inclusive meaning, which does not exclude devices that are applicable to or configured to perform additional tasks or steps.

In addition, the use of the phrase "based on" indicates openness and inclusiveness, since a process, step, calculation or other action that is "based on" one or more stated conditions or values may, in practice, be based on additional conditions or values exceeding those stated.

Terms such as "about" or "approximately" as used herein include a stated value and an average value within an acceptable range of deviation of a particular value. The acceptable range of deviation is determined by a person of ordinary skill in the art in view of the measurement in question and errors associated with the measurement of a particular quantity (i.e., limitations of the measurement system).

Exemplary embodiments are described herein with reference to sectional views and/or plan views as idealized exemplary drawings. In the accompanying drawings, thicknesses of layers and sizes of regions are enlarged for clarity. Thus, variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Transistors used in circuits provided in embodiments of the present disclosure may be thin film transistors, field effect transistors (e.g., oxide thin film transistors) or other switching devices with same properties, and the embodiments of the present disclosure are described by taking the thin film transistors as examples.

In some embodiments, a control electrode of each transistor used in a shift register is a gate of the transistor, a first electrode of the transistor is one of a source and a drain of the transistor, and a second electrode of the transistor is the other of the source and the drain of the transistor. Since the source and the drain of the transistor may be symmetrical in structure, the source and the drain of the transistor may be indistinguishable in structure. That is, the first electrode and the second electrode of the transistor in the embodiments of the present disclosure may be indistinguishable in structure. For example, in a case where the transistor is a P-type transistor, the first electrode of the transistor is the source, and the second electrode is the drain. For example, in a case where the transistor is an N-type transistor, the first electrode of the transistor is the drain, and the second electrode is the source.

In a circuit provided in embodiments of the present disclosure, nodes such as a first pull-up node, a second pull-up node, a first pull-down node, and a second pull-down node do not represent actual components, but rather represent junctions of related electrical connections in circuit diagrams. That is, these nodes are equivalent nodes of the junctions of the related electrical connections in the circuit diagram.

In the embodiments of the present disclosure, the term "pull-up" refers to charging of a node or an electrode of a transistor, so that an absolute value of a level of the node or the electrode increases, thereby realizing an operation (e.g., turning on) of the corresponding transistor. The term "pull-down" refers to discharge of a node or an electrode of a transistor, so that an absolute value of a level of the node or the electrode decreases, thereby realizing an operation (e.g., turning off) of the corresponding transistor.

In the circuits provided in the embodiments of the present disclosure, descriptions are made below by taking an example in which the transistors are all N-type transistors.

Some embodiments of the present disclosure provide a display panel and a display apparatus. The display panel and the display apparatus will be respectively introduced below.

Figure 2:
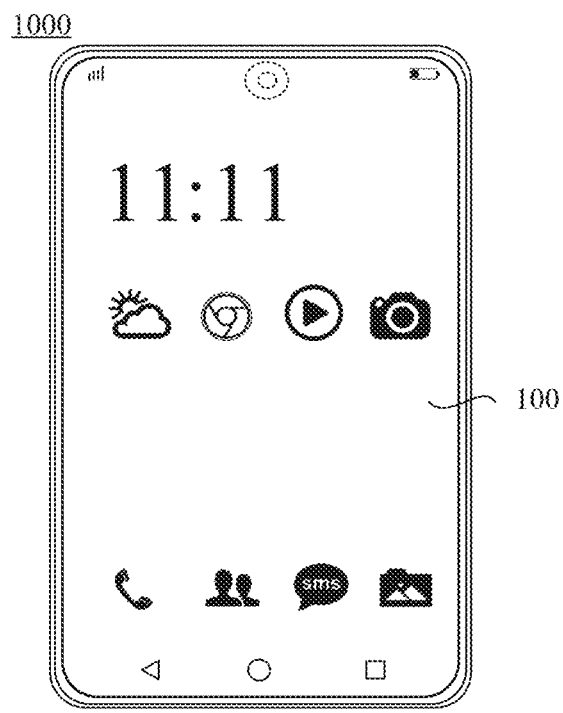
FIG. 2 is a structural diagram of a display apparatus, in accordance with some embodiments of the present disclosure.

As for the display apparatus 1000 provided in some embodiments, as shown in FIG. 2, the display apparatus 1000 may be any apparatus that displays images whether in motion (e.g., a video) or stationary (e.g., a static image), and whether literal or graphical. More specifically, it is anticipated that the embodiments may be implemented in or associated with a plurality of electronic devices. The plurality of electronic devices may include (but are not limit to), for example, mobile telephones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (e.g., odometer displays), navigators, cabin controllers and/or displays, camera-view displays (e.g., a display of a rear-view camera in a vehicle), electronic photos, electronic billboards or signs, projectors, architectural structures, packaging and aesthetic structures (e.g., a display for an image of a piece of jewelry).

In some examples, the display apparatus 1000 includes a frame, and the display panel 100 (as shown in FIG. 2), a circuit board, a display driver integrated circuit (IC) and other electronic accessories that are disposed in the frame.

In some examples, a shape of the display panel 100 may be non-rectangular. For example, in a case where the display panel 100 is applied to a building, the shape of the display panel 100 may be set according to the shape of the building and the requirements of an application site environment.

For example, the display panel 100 may be in a shape of a circle, an ellipse, an arc, or a rhombus.

The display panel 100 may be, for example, an organic light-emitting diode (OLED) display panel, a quantum dot light-emitting diode (QLED) display panel, or a micro light-emitting diode (micro LED) display panel, which is not specifically limited in the present disclosure.

Some embodiments of the present disclosure will be schematically described below by taking an example in which the display panel 100 is the OLED display panel.

Figure 3:
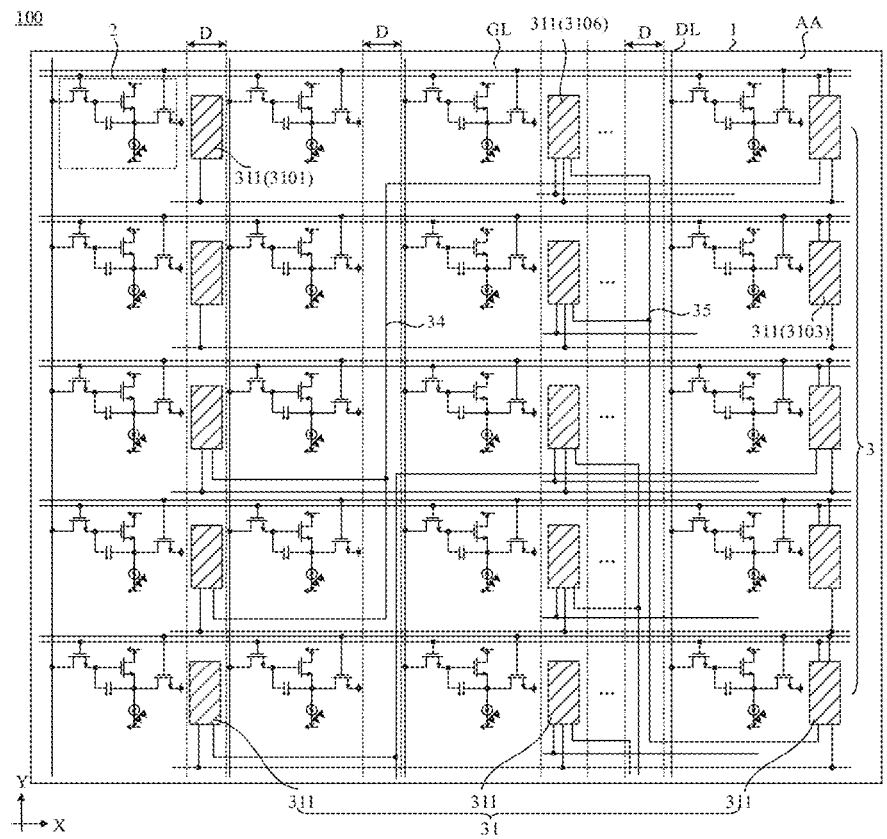
FIG. 3 is a structural diagram of a display panel, in accordance with some embodiments of the present disclosure.

In some embodiments, as shown in FIG. 3, the display panel 100 may include: a substrate 1, a plurality of sub-pixels 2, and a gate drive circuit 3.

There are various types of the substrate 1, which may be selectively set according to actual needs.

For example, the substrate 1 may be a rigid substrate. The rigid substrate may be, for example, a glass substrate or a polymethyl methacrylate (PMMA) substrate.

For example, the substrate 1 may be a flexible substrate. The flexible substrate may be, for example, a polyethylene terephthalate (PET) substrate, a polyethylene naphthalate two formic acid glycol ester (PEN) substrate, or a polyimide (PI) substrate. In this case, the display panel 100 may be a flexible display panel.

In some examples, as shown in FIG. 3, the plurality of sub-pixels 2 are disposed on a side of the substrate 1. The plurality of sub-pixels 2 may be, for example, arranged in a plurality of rows and a plurality of columns. Each row of sub-pixels 2 may include sub-pixels 2 arranged in a first direction X, and each column of sub-pixels 2 may include sub-pixels 2 arranged in a second direction Y.

Here, the first direction X and the second direction Y cross each other. An included angle between the first direction X and the second direction Y may be selectively set according to actual needs. For example, the included angle between the first direction X and the second direction Y may be 85°, 89°, or 90°.

For example, a shape of the substrate 1 may be the same as the shape of the display panel 100. That is, the shape of the substrate 1 may be non-rectangular. Based on this, the number of sub-pixels 2 included in each of columns of sub-pixels (i.e., some columns of sub-pixels 2 each arranged in the second direction Y) at different positions of the substrate 1 may be different, and the number of sub-pixels 2 included in each of rows of sub-pixels (i.e., some rows of sub-pixels 2 each arranged in the first direction X) at different positions of the substrate 1 may be different.

In some examples, as shown in FIG. 3, the display panel 100 may include: a plurality of gate lines GL extending along a first direction X, a plurality of data lines DL extending along a second direction Y, first sensing signal lines (not shown in FIG. 3) and power supply voltage lines, all of which are disposed on the side of the substrate 1. The gate lines GL are used for transmitting gate signals, the data lines DL are used for transmitting data signals, and the first sensing signal lines are used for transmitting sensing signals. For example, the data lines DL are located on a side of the gate lines GL away from the substrate 1, and the data lines DL and the gate lines GL are insulated from each other.

Figure 4:
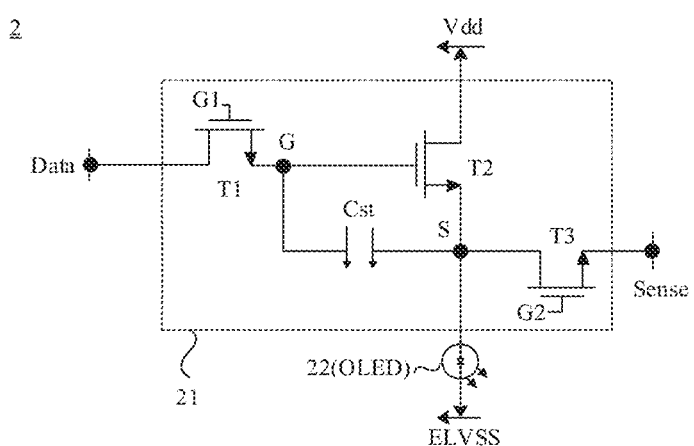
FIG. 4 is a circuit diagram of a sub-pixel, in accordance with some embodiments of the present disclosure.

In some examples, as shown in FIG. 4, each sub-pixel 2 of the plurality of sub-pixels 2 may include a pixel drive circuit 21 and a light-emitting device 22 electrically connected to the pixel drive circuit 21.

For example, as shown in FIGS. 3 and 4, a gate line GL may be electrically connected to pixel drive circuits 21 in the same row of sub-pixels 2, and a data line DL may be electrically connected to pixel drive circuits 21 in the same column of sub-pixels 2. The number of gate lines GL electrically connected to the pixel drive circuits 21 in the same row of sub-pixels 2 may be set according to a structure of the pixel drive circuit 21.

The structure of the pixel drive circuit 21 may be various, which may be selectively set according to actual needs. For example, the structure of the pixel drive circuit 21 may be a "2T1C", "6T1C", "7T1C", "6T2C" or "7T2C" structure. Here, "T" represents a thin film transistor, and the number before "T" represents the number of thin film transistors; "C" represents a storage capacitor, and the number before "C" represents the number of storage capacitors. The pixel drive circuit 21 may include at least a switching transistor and a driving transistor.

Here, during the use of the display panel 100, stabilities of the thin film transistor in the pixel driver circuit 21 and the light-emitting device 22 may decrease (for example, a threshold voltage of the driving transistor drifts), which affects a display effect of the display panel 100. Therefore, the sub-pixel 2 needs to be compensated.

There are many ways to compensate for the sub-pixel 2, which may be selectively set according to actual needs. For example, a pixel compensation circuit may be provided in the sub-pixel 2, so that the pixel compensation circuit may be used to achieve internal compensation for the sub-pixel 2. As another example, the driving transistor or the light-emitting device 22 may be sensed through a thin film transistor in the sub-pixel 2, and sensed data may be transmitted to an external sensing circuit, so as to use the external sensing circuit to calculate a driving voltage value that needs to be compensated and give feedback, thereby achieving external compensation for the sub-pixel 2.

A structure and an operating process of the sub-pixel 2 will be schematically illustrated by taking an example in which an external compensation method (to sense the driving transistor) is adopted and the pixel drive circuit 21 adopts a 3T1C structure.

For example, as shown in FIG. 4, the pixel drive circuit 21 may include: a switching transistor T1, a driving transistor T2, a sensing transistor T3, and a storage capacitor Cst.

For example, as shown in FIG. 4, a control electrode of the switching transistor T1 is electrically connected to a first gate signal terminal G1 (a gate line GL), a first electrode of the switching transistor T1 is electrically connected to a data signal terminal Data (a data line DL), and a second electrode of the switching transistor T1 is electrically connected to a first node G. The switching transistor T1 is configured to transmit data signals received at the data signal terminal Data to the first node G in response to a first gate signal received at the first gate signal terminal G1.

Here, the data signals include, for example, a detection data signal and a display data signal.

For example, as shown in FIG. 4, a control electrode of the driving transistor T2 is electrically connected to the first node G, a first electrode of the driving transistor T2 is electrically connected to a fourth voltage signal terminal Vdd (a power supply voltage line), and a second electrode of the driving transistor T2 is electrically connected to a second node S. The driving transistor T2 is configured to transmit a fourth voltage signal received at the fourth voltage signal terminal Vdd to the second node S under control of a voltage of the first node G, so as to drive the light-emitting device 22 to emit light.

For example, as shown in FIG. 4, a first electrode plate of the storage capacitor Cst is electrically connected to the first node G, and a second electrode plate of the storage capacitor Cst is electrically connected to the second node S. The switching transistor T1 charges the storage capacitor Cst while charging the first node G.

For example, as shown in FIG. 4, an anode of the light-emitting device 22 is electrically connected to the second node 5, and a cathode of the light-emitting device 22 is electrically connected to a fifth voltage signal terminal ELVSS.

Here, a level of a fourth voltage signal may be, for example, in a range of −5 V to 5 V, inclusive. A fifth voltage signal is, for example, a fixed voltage signal. A level of the fixed voltage signal may be, for example, less than or equal to 0 V.

For example, as shown in FIG. 4, a control electrode of the sensing transistor T3 is electrically connected to a second gate signal terminal G2 (a gate line GL), a first electrode of the sensing transistor T3 is electrically connected to the second node S, and a second electrode of the sensing transistor T3 is electrically connected to a sensing signal terminal Sense (a first sensing signal line). The sensing transistor T3 is configured to sense an electrical property of the driving transistor T2 to achieve the external compensation, in response to a second gate signal received at the second gate signal terminal G2. The electrical property includes, for example, a threshold voltage and/or carrier mobility of the driving transistor T2.

Here, the sensing signal terminal Sense may provide a reset signal or obtain a sensing signal. The reset signal is used to reset the second node S, and the obtained sensing signal is used to obtain the threshold voltage of the driving transistor T2.

Based on the structure of the pixel drive circuit 21, in some examples, the pixel drive circuits 21 in the same row of sub-pixels 2 may be electrically connected to two gate lines GL (i.e., a first gate line and a second gate line). For example, first gate signal terminals G1 electrically connected to the pixel drive circuits 21 in the same row of sub-pixels 2 may be electrically connected to the first gate line and receive the first gate signal transmitted by the first gate line; and second gate signal terminals G2 electrically connected to the pixel drive circuits 21 in the same row of sub-pixels 2 may be electrically connected to the second gate line and receive the second gate signal transmitted by the second gate line. In some other examples, the pixel drive circuits 21 in the same row of sub-pixels 2 may also be electrically connected to a same gate line GL. By reducing the number of the gate lines GL, it may be possible to save an arrangement space of the gate lines GL in the display panel 100, which helps increase pixels per inch (PPI) of the display panel 100. For example, the control electrode of the switching transistor T1 and the control electrode of the sensing transistor T3 are both electrically connected to the same gate line GL and receive a gate signal transmitted by the gate line GL.

In this example, a frame display phase may include, for example, a display period and a blanking period that are sequentially performed.

During the display period of the frame display phase, the operating process of the sub-pixel 2 may include, for example, a reset phase, a data writing phase, and a light-emitting phase.

In the reset phase, a level of the second gate signal provided by the second gate signal terminal G2 is a high level, and the sensing signal terminal Sense provides the reset signal (a level of the reset signal is, for example, a low level). The sensing transistor T3 is turned on under control of the second gate signal, receives the reset signal, and transmits the reset signal to the second node S to reset the second node S.

In the data writing phase, a level of the first gate signal provided by the first gate signal terminal G1 is a high level, and a level of the display data signal provided by the data signal terminal Data is a high level. The switching transistor T1 is turned on under control of the first gate signal, receives the display data signal, transmits the display data signal to the first node G, and charges the storage capacitor Cst at the same time.

In the light-emitting phase, a level of the first gate signal provided by the first gate signal terminal G1 is a low level, a level of the second gate signal provided by the second gate signal terminal G2 is a low level, and a level of the fourth voltage signal provided by the fourth voltage signal terminal Vdd is a high level. The switching transistor T1 is turned off under the control of the first gate signal, and the sensing transistor T3 is turned off under the control of the second gate signal. The storage capacitor Cst starts to discharge, so that a voltage of the first node G is maintained at a high level. The driving transistor T2 is turned on under control of the voltage of the first node G, receives the fourth voltage signal, and transmits the fourth voltage signal to the second node 5, so that the light-emitting device 22 emits light.

During the blanking period of the frame display phase, the operating process of the sub-pixel 2 may include, for example, a first phase and a second phase.

In the first phase, a level of the first gate signal provided by the first gate signal terminal G1 and a level of the second gate signal provided by the second gate signal terminal G2 are both high levels, and a level of the detection data signal provided by the data signal terminal Data is a high level. The switching transistor T1 is turned on under the control of the first gate signal, receives the detection data signal, and transmits the detection data signal to the first node G to charge the first node G. The sensing transistor T3 is turned on under the control of the second gate signal, receives the reset signal provided by the sensing signal terminal Sense, and transmits the reset signal to the second node S.

In the second phase, the sensing signal terminal Sense is in a floating state. The driving transistor T2 is turned on under the control of the voltage of the first node G, receives the fourth voltage signal provided by the fourth voltage signal terminal Vdd, and transmits the fourth voltage signal to the second node S to charge the second node S, so that a voltage of the second node S increases until the driving transistor T2 is turned off. At this time, a voltage difference Vgs between the first node G and the second node S is equal to a threshold voltage Vth of the driving transistor T2.

Since the sensing transistor T3 is in a turn-on state and the sensing signal terminal Sense is in the floating state, the driving transistor T2 charges the sensing signal terminal Sense while charging the second node S. By sampling a voltage of the sensing signal terminal Sense (that is, obtaining the sensing signal), the threshold voltage Vth of the driving transistor T2 may be calculated according to a relationship between the voltage of the sensing signal terminal Sense and the level of the detection data signal.

After the threshold voltage Vth of the driving transistor T2 is calculated, the threshold voltage Vth may be compensated into a display data signal during a display period of a next-frame display phase to complete the external compensation for the sub-pixel 2.

In some examples, the gate drive circuit 3 and the plurality of sub-pixels 2 are located on the same side of the substrate 1. The gate drive circuit 3 may include a plurality of cascaded shift registers 31, and a shift register 31 may be electrically connected to pixel drive circuits 21 in at least one row of sub-pixels 2.

It will be noted that, in a frame display phase, the first gate signal transmitted by the first gate signal terminal G1 and the second gate signal transmitted by the second gate signal terminal G2 are both provided by the gate drive circuit 3. That is, each shift register 31 in the gate drive circuit 3 may be electrically connected to the first gate signal terminals G1 through the first gate line, and transmit the first gate signal to the first gate signal terminals G1 through the first gate line. Moreover, each shift register 31 in the gate drive circuit 3 may be electrically connected to the second date signal terminals G2 through the second gate line, and transmit the second gate signal to the second gate signal terminals G2 through the second gate line.

A structure of the shift register 31 is various, which may be selectively set according to actual needs. Structures of two types of shift registers 31 will be schematically described below, but the shift register 31 in the embodiments of the present disclosure is not limited to these two structures.

Figure 5:
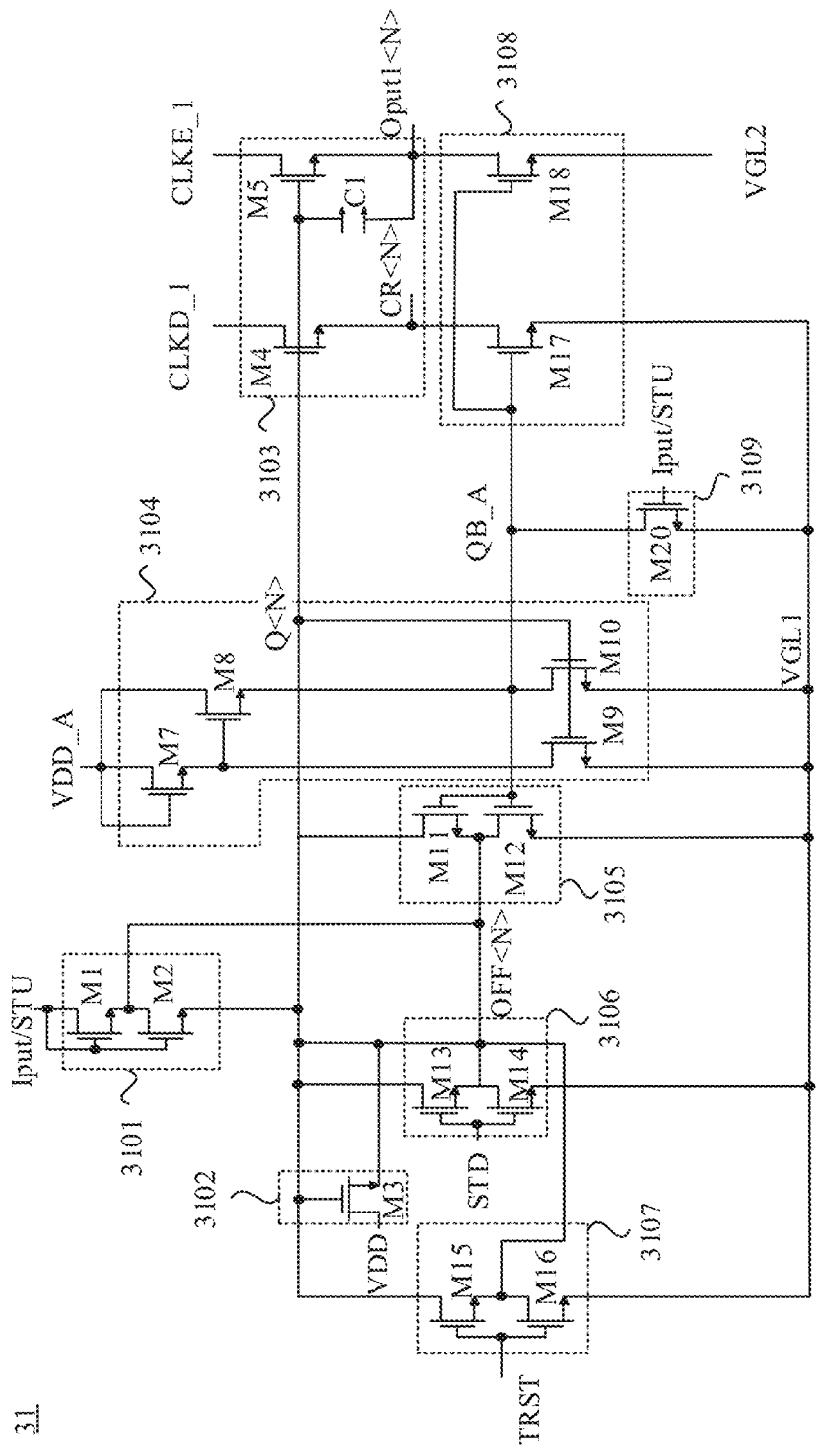
FIG. 5 is a circuit diagram of a shift register, in accordance with some embodiments of the present disclosure.
Figure 6:
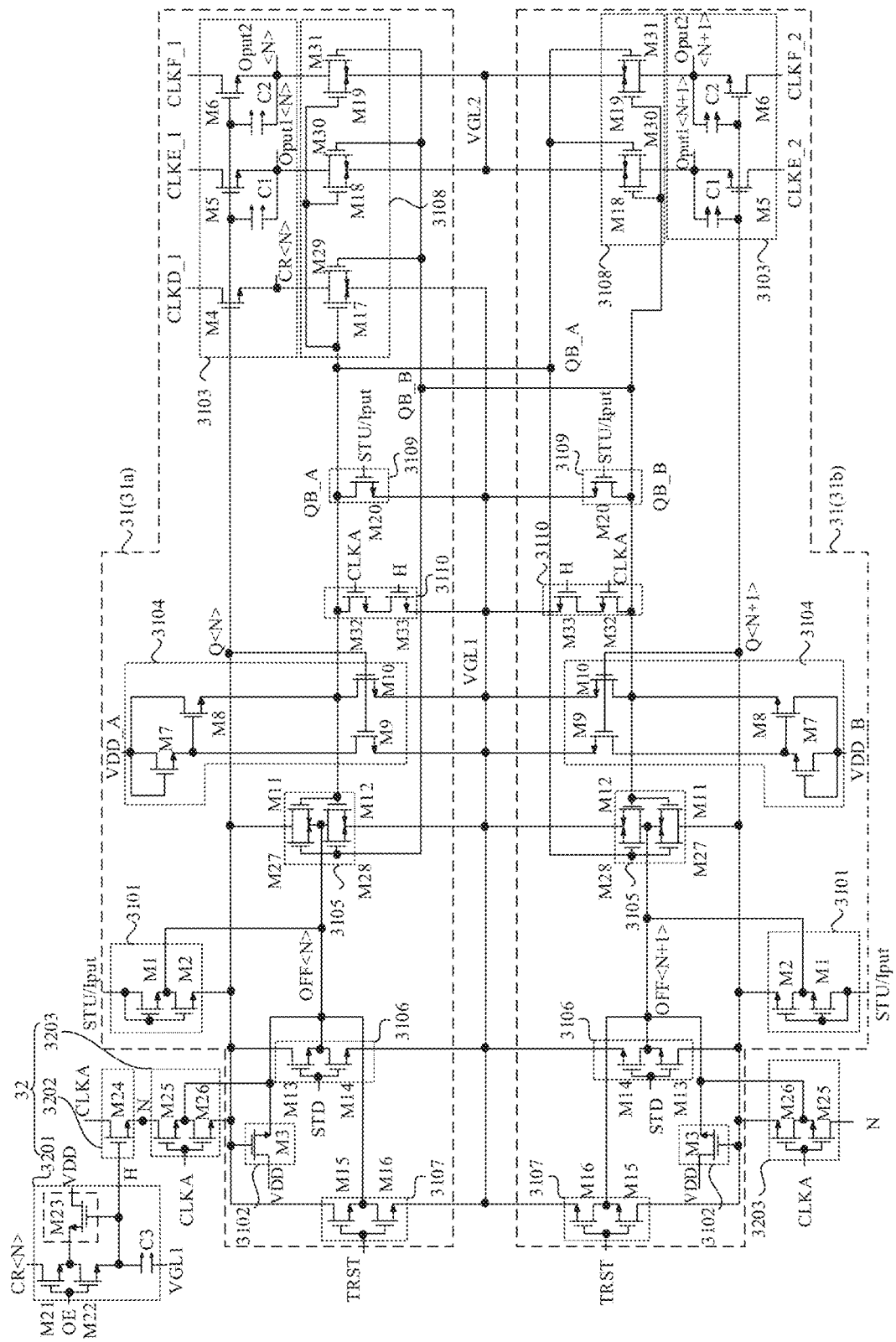
FIG. 6 is a circuit diagram of two adjacent shift registers, in accordance with some embodiments of the present disclosure.

In some examples, as shown in FIGS. 5 and 6, the shift register 31 may include: a first input circuit 3101 a leakage prevention circuit 3102, an output circuit 3103, a control circuit 3104, a first reset circuit 3105, a second reset circuit 3106, a third reset circuit 3107, a fourth reset circuit 3108, and a fifth reset circuit 3109.

For example, as shown in FIGS. 5 and 6, the first input circuit 3101 is electrically connected to an input signal terminal Input (abbreviated as Iput in the drawings and the following content), a pull-up node Q<N>, and a leakage prevention node OFF<N>. The first input circuit 3101 is configured to, during the display period of the frame display phase, transmit an input signal to the pull-up node Q<N> and the leakage prevention node OFF<N> in response to the input signal received at the input signal terminal Iput. N is a positive integer, and N represents a serial number of a row of sub-pixels electrically connected to the shift register 31.

For example, during the display period of the frame display phase, in a case where a level of the input signal is a high level, the first input circuit 3101 may be turned on under an action of the input signal, and transmit the input signal to the pull-up node Q<N> to charge the pull-up node Q<N>, so that a voltage of the pull-up node Q<N> increases.

Optionally, as shown in FIGS. 5 and 6, the first input circuit 3101 may include a first transistor M1 and a second transistor M2.

For example, as shown in FIGS. 5 and 6, a control electrode of the first transistor M1 is electrically connected to the input signal terminal Iput, a first electrode of the first transistor M1 is electrically connected to the input signal terminal Iput, and a second electrode of the first transistor M1 is electrically connected to a first electrode of the second transistor M2 and the leakage prevention node OFF<N>. A control electrode of the second transistor M2 is electrically connected to the input signal terminal Iput, and a second electrode of the second transistor M2 is electrically connected to the pull-up node Q<N>.

Here, during the display period of the frame display phase, in the case where the level of the input signal transmitted by the input signal terminal Iput is the high level, the first transistor M1 and the second transistor M2 may be turned on simultaneously under the action of the input signal. The first transistor M1 may receive the input signal transmitted by the input signal terminal Iput, and transmit the received input signal to the first electrode of the second transistor M2 and the leakage prevention node OFF<N>. The second transistor M2 may transmit the received input signal to the pull-up node Q<N> to charge the pull-up node Q<N>, so that the voltage of the pull-up node Q<N> increases.

For example, as shown in FIGS. 5 and 6, the leakage prevention circuit 3102 is electrically connected to the pull-up node Q<N>, a first voltage signal terminal VDD, and the leakage prevention node OFF<N>. The leakage prevention circuit 3102 is configured to transmit a first voltage signal transmitted by the first voltage signal terminal VDD to the leakage prevention node OFF<N> under control of the voltage of the pull-up node Q<N>, so as to prevent the pull-up node Q<N> from leakage. The first voltage signal is, for example, a constant high-voltage signal.

For example, in a case where the voltage of the pull-up node Q<N> is at a high level, the leakage prevention circuit 3102 may be turned on under the control of the voltage of the pull-up node Q<N>, receive and transmit the first voltage signal to the leakage prevention node OFF<N>, so that a voltage of the leakage prevention node OFF<N> increases.

Optionally, as shown in FIGS. 5 and 6, the leakage prevention circuit 3102 may include a third transistor M3.

For example, as shown in FIGS. 5 and 6, a control electrode of the third transistor M3 is electrically connected to the pull-up node Q<N>, a first electrode of the third transistor M3 is electrically connected to the first voltage signal terminal VDD, and a second electrode of the third transistor M3 is electrically connected to the leakage prevention node OFF<N>.

Here, in the case where the voltage of the pull-up node Q<N> is at the high level, the third transistor M3 may be turned on under the control of the voltage of the pull-up node Q<N>, and transmit the first voltage signal to the leakage prevention node OFF<N>, so that the voltage of the leakage prevention node OFF<N> increases, and a voltage difference between the control electrode and the first electrode of the second transistor M2 is less than zero, which ensures that the second transistor M2 is completely or relatively completely turned off. In this way, it is possible to prevent charges at the pull-up node Q<N> from leaking through the first input circuit 3101, so that the pull-up node Q<N> may be maintained at a relatively high and stable voltage.

For example, as shown in FIGS. 5 and 6, the output circuit 3103 is electrically connected to the pull-up node Q<N>, a first clock signal terminal CLKE_1, and a first output signal terminal Output1<N> (abbreviated as Oput1<N> in the drawings and the following content). The output circuit 3103 is configured to, during the display period of the frame display phase, transmit a first clock signal received at the first clock signal terminal CLKE_1 to the first output signal terminal Oput1<N> under control of the voltage of the pull-up node Q<N>.

Of course, as shown in FIGS. 5 and 6, the output circuit 3103 may further be, for example, electrically connected to a third clock signal terminal CLKD_1 and a shift signal terminal CR<N>. The output circuit 3103 is further configured to, during the display period of the frame display phase, transmit a third clock signal received at the third clock signal terminal CLKD_1 to the shift signal terminal CR<N> under control of the voltage of the pull-up node Q<N>.

Of course, as shown in FIG. 6, the output circuit 3103 may further be, for example, electrically connected to a fourth clock signal terminal CLKF_1 and a second output signal terminal Output2<N> (abbreviated as Oput2<N> in the drawings and the following content). The output circuit 3103 is further configured to, during the blanking period of the frame display phase, transmit a fourth clock signal received at the fourth clock signal terminal CLKF_1 to the second output signal terminal Oput2<N> under control of the voltage of the pull-up node Q<N>.

For example, during the display period of the frame display phase, in a case where the voltage of the pull-up node Q<N> increases, the output circuit 3103 may be turned on under the control of the voltage of the pull-up node Q<N>, output the third clock signal received at the third clock signal terminal CLKD_1 as a shift signal from the shift signal terminal CR<N>, and output the first clock signal received at the first clock signal terminal CLKE_1 as a first output signal from the first output signal terminal Oput1<N>. During the blanking period of the frame display phase, in a case where the voltage of the pull-up node Q<N> increases, the output circuit 3103 may be turned on under the control of the voltage of the pull-up node Q<N>, and output the fourth clock signal received at the fourth clock signal terminal CLKF_1 as a second output signal from the second output signal terminal Oput2<N>.

In this example, the first output signal terminal Oput1<N> may be electrically connected to the first gate line, and the first output signal output by the first output signal terminal Oput1<N> may be used as the first gate signal to be transmitted to pixel drive circuits 21 through the first gate line and first gate signal terminals G1 electrically connected to the pixel drive circuits 21 in sequence. The second output signal terminal Oput2<N> may be electrically connected to the second gate line, and the second output signal output by the second output signal terminal Oput2<N> may be used as the second gate signal to be transmitted to the pixel drive circuits 21 through the second gate line and second gate signal terminals G2 electrically connected to the pixel drive circuits 21 in sequence.

Optionally, as shown in FIG. 6, the output circuit 3103 may include: a fourth transistor M4, a fifth transistor M5, a sixth transistor M6, a first capacitor C1, and a second capacitor C2.

For example, as shown in FIG. 6, a control electrode of the fourth transistor M4 is electrically connected to the pull-up node Q<N>, a first electrode of the fourth transistor M4 is electrically connected to the third clock signal terminal CLKD_1, and a second electrode of the fourth transistor M4 is electrically connected to the shift signal terminal CR<N>.

During the display period of the frame display phase, in a case where the first input circuit 3101 is turned on to cause the voltage of the pull-up node Q<N> to increase, the fourth transistor M4 may be turned on under the control of a high voltage of the pull-up node Q<N>, transmit the third clock signal to the shift signal terminal CR<N>, and output the third clock signal as the shift signal from the shift signal terminal CR<N>.

For example, as shown in FIG. 6, a control electrode of the fifth transistor M5 is electrically connected to the pull-up node Q<N>, a first electrode of the fifth transistor M5 is electrically connected to the first clock signal terminal CLKE_1, and a second electrode of the fifth transistor M5 is electrically connected to the first output signal terminal Oput1<N>. A first terminal of the first capacitor C1 is electrically connected to the pull-up node Q<N>, and a second terminal of the first capacitor C1 is electrically connected to the first output signal terminal Oput1<N>.

During the display period of the frame display phase, the first capacitor C1 is charged while the first input circuit 3101 is turned on to cause the voltage of the pull-up node Q<N> to increase. In a case where the first input circuit 3101 is turned off, the first capacitor C1 may be discharged, so that the voltage of the pull-up node Q<N> is maintained at a high level. As a result, the fifth transistor M5 may be maintained in a turn-on state, transmit the first clock signal to the first output signal terminal Oput1<N>, and output the first clock signal as the first output signal from the first output signal terminal Oput1<N>.

For example, as shown in FIG. 6, a control electrode of the sixth transistor M6 is electrically connected to the pull-up node Q<N>, a first electrode of the sixth transistor M6 is electrically connected to the fourth clock signal terminal CLKF_1, and a second electrode of the sixth transistor M6 is electrically connected to the second output signal terminal Oput2<N>. A first terminal of the second capacitor C2 is electrically connected to the pull-up node Q<N>, and a second terminal of the second capacitor C2 is electrically connected to the second output signal terminal Oput2<N>.

During the blanking period of the frame display phase, while the voltage of the pull-up node Q<N> increases, the second capacitor C2 will be charged. In a corresponding period, the second capacitor C2 may be discharged, so that the voltage of the pull-up node Q<N> is maintained at the high level. As a result, the sixth transistor M6 may be maintained in a turn-on state, transmit the fourth clock signal to the second output signal terminal Oput2<N>, and output the fourth clock signal as the second output signal from the second output signal terminal Oput2<N>.

Here, after the plurality of shift registers 31 are cascaded to constitute the gate drive circuit 3, the shift signal terminal CR<N> of an N-th shift register 31 may be, for example, electrically connected to the input signal terminal Iput of an (N+1)-th shift register 31. As a result, the shift signal output by the shift signal terminal CR<N> of the N-th shift register 31 is used as the input signal input into the (N+1)-th shift register 31. Of course, a cascade relationship of the plurality of shift registers 31 is not limited thereto.

In addition, input signal terminal(s) Iput of part of the shift registers 31 may be electrically connected to a start signal terminal STU, so as to receive a start signal transmitted by the start signal terminal STU as the input signal. The part of the shift registers 31 may be, for example, a first shift register 31 in the gate drive circuit 3, or the first shift register 31 and a second shift register 31.

Here, the number of shift registers 31 electrically connected to the start signal terminal STU is not limited, which may be selectively set according to actual needs.

For example, as shown in FIGS. 5 and 6, the control circuit 3104 is electrically connected to the pull-up node Q<N>, a sixth voltage signal terminal VDD_A, a pull-down node QB_A, and a second voltage signal terminal VGL1. The control circuit 3104 is configured to, under control of the voltage of the pull-up node Q<N>, transmit a sixth voltage signal transmitted by the sixth voltage signal terminal VDD_A or a second voltage signal transmitted by the second voltage signal terminal VGL1 to the pull-down node QB_A, so as to control a voltage of the pull-down node QB_A. A level of the sixth voltage signal may be, for example, unchanged in the frame display phase. The second voltage signal terminal VGL1 may be configured to transmit a direct-current (DC) low-level signal (e.g., being lower than or equal to a low-level portion of a clock signal). The second voltage signal terminal VGL1 may be, for example, grounded.

For example, in the case where the voltage of the pull-up node Q<N> increases, the control circuit 3104 may transmit the second voltage signal transmitted by the second voltage signal terminal VGL1 to the pull-down node QB_A, so as to pull down the voltage of the pull-down node QB_A to be at a low level. In a case where the voltage of the pull-up node Q<N> is at a low level, the control circuit 3104 may transmit the sixth voltage signal transmitted by the sixth voltage signal terminal VDD_A to the pull-down node QB_A, so as to pull up the voltage of the pull-down node QB_A to be at a high level.

Optionally, as shown in FIGS. 5 and 6, the control circuit 3104 may include: a seventh transistor M7, an eighth transistor M8, a ninth transistor M9, and a tenth transistor M10.

For example, as shown in FIGS. 5 and 6, a control electrode of the seventh transistor M7 is electrically connected to the sixth voltage signal terminal VDD_A, a first electrode of the seventh transistor M7 is electrically connected to the sixth voltage signal terminal VDD_A, and a second electrode of the seventh transistor M7 is electrically connected to a control electrode of the eighth transistor M8 and a first electrode of the ninth transistor M9. A first electrode of the eighth transistor M8 is electrically connected to the sixth voltage signal terminal VDD_A, and a second electrode of the eighth transistor M8 is electrically connected to the pull-down node QB_A and a first electrode of the tenth transistor M10. A control electrode of the ninth transistor M9 is electrically connected to the pull-up node Q<N>, and a second electrode of the ninth transistor M9 is electrically connected to the second voltage signal terminal VGL1. A control electrode of the tenth transistor M10 is electrically connected to the pull-up node Q<N>, and a second electrode of the tenth transistor M10 is electrically connected to the second voltage signal terminal VGL1.

In a case where the level of the sixth voltage signal transmitted by the sixth voltage signal terminal VDD_A is a high level, the seventh transistor M7 may be turned on under an action of the sixth voltage signal, and receive and transmit the sixth voltage signal to the control electrode of the eighth transistor M8 and the first electrode of the ninth transistor M9. The eighth transistor M8 may be turned on under the action of the sixth voltage signal, and receive and transmit the sixth voltage signal to the pull-down node QB_A and the first electrode of the tenth transistor M10.

In the case where the voltage of the pull-up node Q<N> is at the high level, the ninth transistor M9 and the tenth transistor M10 may be turned on under control of the voltage of the pull-up node Q<N>. The ninth transistor M9 may transmit the second voltage signal transmitted by the second voltage signal terminal VGL1 to the control electrode of the eighth transistor M8, so that the eighth transistor M8 is turned off. The tenth transistor M10 may transmit the second voltage signal to the pull-down node QB_A, so as to pull down the voltage of the pull-down node QB_A to be at the low level.

In the case where the voltage of the pull-up node Q<N> is at the low level, the ninth transistor M9 and the tenth transistor M10 may be turned off under control of the voltage of the pull-up node Q<N>. The eighth transistor M8 may transmit the received sixth voltage signal to the pull-down node QB_A, so as to pull up the voltage of the pull-down node QB_A to be at the high level.

For example, as shown in FIGS. 5 and 6, the first reset circuit 3105 is electrically connected to the pull-down node QB_A, the pull-up node Q<N>, the second voltage signal terminal VGL1, and the leakage prevention node OFF<N>. The first reset circuit 3105 is configured to, under control of a voltage of the pull-down node QB_A, transmit the second voltage signal transmitted by the second voltage signal terminal VGL1 to the leakage prevention node OFF<N> and the pull-up node Q<N>, so as to reset the leakage prevention node OFF<N> and the pull-up node Q<N>.

For example, in a case where the voltage of the pull-down node QB_A is at the high level, the first reset circuit 3105 may be turned on under an action of the voltage of the pull-down node QB_A to transmit the second voltage signal transmitted by the second voltage signal terminal VGL1 to the leakage prevention node OFF<N> and the pull-up node Q<N>, so as to pull down and reset the leakage prevention node OFF<N> and the pull-up node Q<N>.

Optionally, as shown in FIGS. 5 and 6, the first reset circuit 3105 may include an eleventh transistor M11 and a twelfth transistor M12.

For example, as shown in FIGS. 5 and 6, a control electrode of the eleventh transistor M11 is electrically connected to the pull-down node QB_A, a first electrode of the eleventh transistor M11 is electrically connected to the pull-up node Q<N>, and a second electrode of the eleventh transistor M11 is electrically connected to a first electrode of the twelfth transistor M12 and the leakage prevention node OFF<N>. A control electrode of the twelfth transistor M12 is electrically connected to the pull-down node QB_A, and a second electrode of the twelfth transistor M12 is electrically connected to the second voltage signal terminal VGL1.

In the case where the voltage of the pull-down node QB_A is at the high level, the eleventh transistor M11 and the twelfth transistor M12 may be turned on simultaneously under the action of the voltage of the pull-down node QB_A, the twelfth transistor M12 may transmit the second voltage signal transmitted by the second voltage signal terminal VGL1 to the leakage prevention node OFF<N>, and the eleventh transistor M11 may transmit the second voltage signal from the leakage prevention node OFF<N> to the pull-up node Q<N> to reset the pull-up node Q<N>.

Here, in a case where the voltage of the pull-up node Q<N> is at the high level and the first reset circuit 3105 is in a non-operating state, the third transistor M3 may be turned on under the control of the voltage of the pull-up node Q<N>, and transmit the first voltage signal to the leakage prevention node OFF<N>, so that the voltage of the leakage prevention node OFF<N> increases. As a result, a voltage difference between the control electrode and the second electrode of the eleventh transistor M11 is less than zero, which ensures that the eleventh transistor M11 is completely or relatively completely turned off. In this way, it is possible to prevent charges at the pull-up node Q<N> from leaking through the first reset circuit 3105, so that the pull-up node Q<N> may be maintained at the relatively high and stable voltage.

For example, as shown in FIGS. 5 and 6, the second reset circuit 3106 is electrically connected to a display reset signal terminal STD, the pull-up node Q<N>, the second voltage signal terminal VGL1, and the leakage prevention node OFF<N>. The second reset circuit 3106 is configured to reset the pull-up node Q<N> under control of a display reset signal transmitted by the display reset signal terminal STD.

For example, in a case where a level of the display reset signal is a high level, the second reset circuit 3106 may be turned on under an action of the display reset signal, transmit the second voltage signal transmitted by the second voltage signal terminal VGL1 to the pull-up node Q<N> to pull down and reset the pull-up node Q<N>.

Optionally, as shown in FIGS. 5 and 6, the second reset circuit 3106 may include a thirteenth transistor M13 and a fourteenth transistor M14.

For example, as shown in FIGS. 5 and 6, a control electrode of the thirteenth transistor M13 is electrically connected to the display reset signal terminal STD, a first electrode of the thirteenth transistor M13 is electrically connected to the pull-up node Q<N>, and a second electrode of the thirteenth transistor M13 is electrically connected to a first electrode of the fourteenth transistor M14 and the leakage prevention node OFF<N>. A control electrode of the fourteenth transistor M14 is electrically connected to the display reset signal terminal STD, and a second electrode of the fourteenth transistor M14 is electrically connected to the second voltage signal terminal VGL1.

In the case where the level of the display reset signal is the high level, the thirteenth transistor M13 and the fourteenth transistor M14 may be turned on simultaneously under the action of the display reset signal. The fourteenth transistor M14 may transmit the second voltage signal transmitted by the second voltage signal terminal VGL1 to the leakage prevention node OFF<N>. The thirteenth transistor M13 may transmit the second voltage signal from the leakage prevention node OFF<N> to the pull-up node Q<N> to reset the pull-up node Q<N>.

Here, in a case where the voltage of the pull-up node Q<N> is at the high level and the second reset circuit 3106 is in a non-operating state, the third transistor M3 may be turned on under the control of the voltage of the pull-up node Q<N>, and transmit the first voltage signal to the leakage prevention node OFF<N>, so that the voltage of the leakage prevention node OFF<N> increases. As a result, a voltage difference between the control electrode and the second electrode of the thirteenth transistor M13 is less than zero, which ensures that the thirteenth transistor M13 is completely or relatively completely turned off. In this way, it is possible to prevent charges at the pull-up node Q<N> from leaking through the second reset circuit 3106, so that the pull-up node Q<N> may be maintained at the relatively high and stable voltage.

Here, after the plurality of shift registers 31 are cascaded to constitute the gate drive circuit 3, the display reset signal terminal STD of the N-th shift register 31 may be, for example, electrically connected to the shift signal terminal CR<N+4> of an (N+4)-th shift register 31. As a result, a shift signal output by the shift signal terminal CR<N+4> of the (N+4)-th shift register 31 is used as the display reset signal of the N-th shift register 31. Of course, the cascade relationship of the plurality of shift registers 31 is not limited thereto.

For example, as shown in FIGS. 5 and 6, the third reset circuit 3107 is electrically connected to a global reset signal terminal TRST, the pull-up node Q<N>, the second voltage signal terminal VGL1, and the leakage prevention node OFF<N>. The third reset circuit 3107 is configured to, under control of a global reset signal transmitted by the global reset signal terminal TRST, transmit the second voltage signal transmitted by the second voltage signal terminal VGL1 to the leakage prevention node OFF<N> and the pull-up node Q<N>, so as to reset the leakage prevention node OFF<N> and the pull-up node Q<N>.

For example, in a case where a level of the global reset signal is a high level, the third reset circuit 3107 may be turned on under an action of the global reset signal to transmit the second voltage signal transmitted by the second voltage signal terminal VGL1 to the leakage prevention node OFF<N> and the pull-up node Q<N>, so as to pull down and reset the leakage prevention node OFF<N> and the pull-up node Q<N>.

Optionally, as shown in FIGS. 5 and 6, the third reset circuit 3107 may include a fifteenth transistor M15 and a sixteenth transistor M16.

For example, as shown in FIGS. 5 and 6, a control electrode of the fifteenth transistor M15 is electrically connected to the global reset signal terminal TRST, a first electrode of the fifteenth transistor M15 is electrically connected to the pull-up node Q<N>, and a second electrode of the fifteenth transistor M15 is electrically connected to a first electrode of the sixteenth transistor M16 and the leakage prevention node OFF<N>. A control electrode of the sixteenth transistor M16 is electrically connected to the global reset signal terminal TRST, and a second electrode of the sixteenth transistor M16 is electrically connected to the second voltage signal terminal VGL1.

In the case where the level of the global reset signal is the high level, the fifteenth transistor M15 and the sixteenth transistor M16 may be turned on simultaneously under the action of the global reset signal. The sixteenth transistor M16 may transmit the second voltage signal transmitted by the second voltage signal terminal VGL1 to the leakage prevention node OFF<N>, and the fifteenth transistor M15 may transmit the second voltage signal from the leakage prevention node OFF<N> to the pull-up node Q<N> to reset the pull-up node Q<N>.

Here, in a case where the voltage of the pull-up node Q<N> is at the high level and the third reset circuit 3107 is in a non-operating state, the third transistor M3 may be turned on under the control of the voltage of the pull-up node Q<N>, and transmit the first voltage signal to the leakage prevention node OFF<N>, so that the voltage of the leakage prevention node OFF<N> increases. As a result, a voltage difference between the control electrode and the second electrode of the fifteenth transistor M15 is less than zero, which ensures that the fifteenth transistor M15 is completely or relatively completely turned off. In this way, it is possible to prevent charges at the pull-up node Q<N> from leaking through the third reset circuit 3107, so that the pull-up node Q<N> may be maintained at the relatively high and stable voltage.

For example, as shown in FIG. 6, the fourth reset circuit 3108 is electrically connected to the pull-down node QB_A, the shift signal terminal CR<N>, the first output signal terminal Oput1<N>, the second output signal terminal Oput2<N>, the second voltage signal terminal VGL1, and a third voltage signal terminal VGL2. The fourth reset circuit 3108 is configured to, under control of a voltage of the pull-down node QB_A, transmit the second voltage signal transmitted by the second voltage signal terminal VGL1 to the shift signal terminal CR<N> to reset the shift signal terminal CR<N>, and transmit a third voltage signal transmitted by the third voltage signal terminal VGL2 to the first output signal terminal Oput1<N> and the second output signal terminal Oput2<N> to reset the first output signal terminal Oput1<N> and the second output signal terminal Oput2<N>. The third voltage signal terminal VGL2 is configured to transmit a DC low level signal (e.g., being lower than or equal to the low-level portion of the clock signal). The third voltage signal terminal VGL2 may be, for example, grounded. Levels of the low-level signals transmitted by the second voltage signal terminal VGL1 and the third voltage signal terminal VGL2 may be equal or unequal.

For example, in the case where the voltage of the pull-down node QB_A is at the high level, the fourth reset circuit 3108 may be turned on under an action of the voltage of the pull-down node QB_A, transmit the second voltage signal transmitted by the second voltage signal terminal VGL1 to the shift signal terminal CR<N> to pull down and reset the shift signal terminal CR<N>, transmit the third voltage signal transmitted by the third voltage signal terminal VGL2 to the first output signal terminal Oput1<N> to pull down and reset the first output signal terminal Oput1<N>, and transmit the third voltage signal transmitted by the third voltage signal terminal VGL2 to the second output signal terminal Oput2<N> to pull down and reset the second output signal terminal Oput2<N>.

Optionally, as shown in FIG. 6, the fourth reset circuit 3108 may include: a seventeenth transistor M17, an eighteenth transistor M18, and a nineteenth transistor M19.

For example, as shown in FIG. 6, a control electrode of the seventeenth transistor M17 is electrically connected to the pull-down node QB_A, a first electrode of the seventeenth transistor M17 is electrically connected to the shift signal terminal CR<N>, and a second electrode of the seventeenth transistor M17 is electrically connected to the second voltage signal terminal VGL1.

In the case where the voltage of the pull-down node QB_A is at the high level, the seventeenth transistor M17 may be turned on under the action of the voltage of the pull-down node QB_A, and transmit the second voltage signal transmitted by the second voltage signal terminal VGL1 to the shift signal terminal CR<N> to pull down and reset the shift signal terminal CR<N>.

For example, as shown in FIG. 6, a control electrode of the eighteenth transistor M18 is electrically connected to the pull-down node QB_A, a first electrode of the eighteenth transistor M18 is electrically connected to the first output signal terminal Oput1<N>, and a second electrode of the eighteenth transistor M18 is electrically connected to the third voltage signal terminal VGL2.

In the case where the voltage of the pull-down node QB_A is at the high level, the eighteenth transistor M18 may be turned on under the action of the voltage of the pull-down node QB_A, and transmit the third voltage signal transmitted by the third voltage signal terminal VGL2 to the first output signal terminal Oput1<N> to pull down and reset the first output signal terminal Oput1<N>.

For example, as shown in FIG. 6, a control electrode of the nineteenth transistor M19 is electrically connected to the pull-down node QB_A, a first electrode of the nineteenth transistor M19 is electrically connected to the second output signal terminal Oput2<N>, and a second electrode of the nineteenth transistor M19 is electrically connected to the third voltage signal terminal VGL2.

In the case where the voltage of the pull-down node QB_A is at the high level, the nineteenth transistor M19 may be turned on under the action of the voltage of the pull-down node QB_A, and transmit the third voltage signal transmitted by the third voltage signal terminal VGL2 to the second output signal terminal Oput2<N> to pull down and reset the second output signal terminal Oput2<N>.

For example, as shown in FIGS. 5 and 6, the fifth reset circuit 3109 is electrically connected to the input signal terminal Iput, the pull-down node QB_A, and the second voltage signal terminal VGL1. The fifth reset circuit 3109 is configured to, under control of the input signal transmitted by the input signal terminal Iput, transmit the second voltage signal transmitted by the second voltage signal terminal VGL1 to the pull-down node QB_A, so as to reset the pull-down node QB_A.

For example, in the case where the level of the input signal is the high level, the fifth reset circuit 3109 may be turned on under an action of the input signal, and transmit the second voltage signal transmitted by the second voltage signal terminal VGL1 to the pull-down node QB_A to pull down and reset the pull-down node QB_A.

Optionally, as shown in FIGS. 5 and 6, the fifth reset circuit 3109 may include a twentieth transistor M20.

For example, as shown in FIGS. 5 and 6, a control electrode of the twentieth transistor M20 is electrically connected to the input signal terminal Iput, a first electrode of the twentieth transistor M20 is electrically connected to the pull-down node QB_A, and a second electrode of the twentieth transistor M20 is electrically connected to the second voltage signal terminal VGL1.

In the case where the level of the input signal is the high level, the twentieth transistor M20 may be turned on under the action of the input signal, and transmit the second voltage signal transmitted by the second voltage signal terminal VGL1 to the pull-down node QB_A to pull down and reset the pull-down node QB_A.

It will be noted that, the gate drive circuit 3 may further include a plurality of blanking input circuits 32 (only one blanking input circuit 32 is shown in FIG. 6). A blanking input circuit 32 may be electrically connected to at least two adjacent shift registers 31. That is, at least two shift registers 31 share one blanking input circuit 32. The blanking input circuit 32 is configured to, during the blanking period of the frame display phase, control a corresponding shift register 31 to input a blanking control signal to pixel drive circuits 21 in a corresponding row, so that the pixel drive circuits 21 obtain sensing signals.

Here, as shown in FIG. 6, the blanking input circuit 32 may include, for example, a selection control circuit 3201, a second input circuit 3202, and at least two transmission circuits 3203.

For example, as shown in FIG. 6, the selection control circuit 3201 is electrically connected to a selection control signal terminal OE, the shift signal terminal CR<N>, the second voltage signal terminal VGL1, and a first blanking node H. The selection control circuit 3201 is configured to transmit the shift signal received at the shift signal terminal CR<N> electrically connected to the selection control circuit 3201 to the first blanking node H under control of a selection control signal transmitted by the selection control signal terminal OE. The selection control circuit 3201 is further configured to maintain a voltage of the first blanking node H under control of the second voltage signal transmitted by the second voltage signal terminal VGL1.

For example, in a case where a level of the selection control signal is a high level, the selection control circuit 3201 may be turned on under the control of the selection control signal, transmit the received shift signal to the first blanking node H, and charge the first blanking node H, so that a voltage of the first blanking node H increases.

During the blanking period of the frame display phase, in a case where the sensing signal is needed to be obtained, a timing waveform of the selection control signal and a timing waveform of the input signal may be the same, so that the selection control circuit 3201 is turned on.

Optionally, as shown in FIG. 6, the selection control circuit 3201 may include: a twenty-first transistor M21, a twenty-second transistor M22, and a third capacitor C3.

For example, as shown in FIG. 6, a control electrode of the twenty-first transistor M21 is electrically connected to the selection control signal terminal OE, a first electrode of the twenty-first transistor M21 is electrically connected to the shift signal terminal CR<N>, and a second electrode of the twenty-first transistor M21 is electrically connected to a first electrode of the twenty-second transistor M22. A control electrode of the twenty-second transistor M22 is electrically connected to the selection control signal terminal OE, and a second electrode of the twenty-second transistor M22 is electrically connected to the first blanking node H.

In the case where the level of the selection control signal transmitted by the selection control signal terminal OE is the high level, the twenty-first transistor M21 and the twenty-second transistor M22 may be turned on simultaneously under an action of the selection control signal. The twenty-first transistor M21 may transmit the shift signal transmitted by the shift signal terminal CR<N> to the first electrode of the twenty-second transistor M22, and the twenty-second transistor M22 may receive and transmit the shift signal to the first blanking node H to charge the first blanking node H.

For example, as shown in FIG. 6, a first terminal of the third capacitor C3 is electrically connected to the first blanking node H, and a second terminal of the third capacitor C3 is electrically connected to the second voltage signal terminal VGL1.

The selection control circuit 3201 also charges the third capacitor C3 in a process of charging the first blanking node H. In this way, in a case where the selection control circuit 3201 is turned off, the first blanking node H is maintained at a high level by utilizing the discharge of the third capacitor C3.

In addition, as shown in FIG. 6, the selection control circuit 3201 may further include, for example, a twenty-third transistor M23. A control electrode of the twenty-third transistor M23 is electrically connected to the first blanking node H, a first electrode of the twenty-third transistor M23 is electrically connected to the first voltage signal terminal VDD, and a second electrode of the twenty-third transistor M23 is electrically connected to the first electrode of the twenty-second transistor M22.

In a case where the voltage of the first blanking node H is at the high level and the twenty-first transistor M21 and the twenty-second transistor M22 are not operating, the twenty-third transistor M23 may be turned on under control of the voltage of the first blanking node H, and transmit the first voltage signal transmitted by the first voltage signal terminal VDD to the first electrode of the twenty-second transistor M22, so that a voltage of the first electrode of the twenty-second transistor M22 increases. As a result, a voltage difference between the control electrode and the first electrode of the twenty-second transistor M22 is less than zero, which ensures that the twenty-second transistor M22 is completely or relatively completely turned off. In this way, it is possible to prevent charges at the first blanking node H from leaking through the twenty-second transistor M22, so that the first blanking node H may be maintained at a relatively high and stable voltage.

For example, as shown in FIG. 6, the second input circuit 3202 is electrically connected to the first blanking node H, a second blanking node N, and a second clock signal terminal CLKA or the first voltage signal terminal VDD. The second input circuit 3202 is configured to transmit a second clock signal received at the second clock signal terminal CLKA or the first voltage signal received at the first voltage signal terminal VDD to the second blanking node N under control of the voltage of the first blanking node H.

For example, in a case where the selection control circuit 3201 is turned on to cause the voltage of the first blanking node H to increase, the second input circuit 3202 may be turned on under the control of the voltage of the first blanking node H, receive the second clock signal transmitted by the second clock signal terminal CLKA, and transmit the second clock signal to the second blanking node N.

Optionally, as shown in FIG. 6, the second input circuit 3202 may include a twenty-fourth transistor M24.

For example, as shown in FIG. 6, a control electrode of the twenty-fourth transistor M24 is electrically connected to the first blanking node H, a first electrode of the twenty-fourth transistor M24 is electrically connected to the second clock signal terminal CLKA or the first voltage signal terminal VDD, and a second electrode of the twenty-fourth transistor M24 is electrically connected to the second blanking node N.

In a case where the voltage of the first blanking node H is at the high level, the twenty-fourth transistor M24 may be turned on under the control of the voltage of the first blanking node H, and transmit the second clock signal received at the second clock signal terminal CLKA or the first voltage signal received at the first voltage signal terminal VDD to the second blanking node N.

For example, as shown in FIG. 6, the at least two transmission circuits 3203 may be electrically connected to at least two shift registers 31 in a one-to-one correspondence. A transmission circuit 3203 is electrically connected to the second blanking node N, the second clock signal terminal CLKA, and the pull-up node Q<N> of one shift register 31. The transmission circuit 3202 is configured to transmit the second clock signal or the first voltage signal received at the second blanking node N to the pull-up node Q<N> under control of the second clock signal transmitted by the second clock signal terminal CLKA.

For example, in a case where a level of the second clock signal transmitted by the second clock signal terminal CLKA is a high level, the transmission circuit 3202 may be turned on under the control of the second clock signal, receive the second clock signal or the first voltage signal from the second blanking node N, and transmit the received second clock signal or first voltage signal to the pull-up node Q<N>, so that the voltage of the pull-up node Q<N> increases. As a result, the output circuit 3103 may be turned on, and thus the second output signal terminal Oput2<N> of the output circuit 3103 outputs the second output signal (i.e., the blanking control signal).

Optionally, as shown in FIG. 6, the transmission circuit 3203 may include a twenty-fifth transistor M25 and a twenty-sixth transistor M26.

For example, as shown in FIG. 6, a control electrode of the twenty-fifth transistor M25 is electrically connected to the second clock signal terminal CLKA, a first electrode of the twenty-fifth transistor M25 is electrically connected to the second blanking node N, and a second electrode of the twenty-fifth transistor M25 is electrically connected to a first electrode of the twenty-sixth transistor M26. A control electrode of the twenty-sixth transistor M26 is electrically connected to the second clock signal terminal CLKA, and a second electrode of the twenty-sixth transistor M26 is electrically connected to the pull-up node Q<N>.

In the case where the level of the second clock signal transmitted by the second clock signal terminal CLKA is the high level, the twenty-fifth transistor M25 and the twenty-sixth transistor M26 may be simultaneously turned on under an action of the second clock signal. The twenty-fifth transistor M25 may transmit the second clock signal or the first voltage signal from the second blanking node N to the first electrode of the twenty-sixth transistor M26. The twenty-sixth transistor M26 may receive and transmit the second clock signal or the first voltage signal to the pull-up node Q<N> to charge the pull-up node Q<N>. The sixth transistor M6 in the output circuit 3103 may be turned on under the control of the voltage of the pull-up node Q<N>, receive the fourth clock signal, and output the fourth clock signal as the second output signal from the second output signal terminal Oput2<N>.

In a case where the transmission circuit 3203 is further electrically connected to the leakage prevention node OFF<N>, as shown in FIG. 6, the first electrode of the twenty-sixth transistor M26 may be electrically connected to the leakage prevention node OFF<N> and the second electrode of the twenty-fifth transistor M25.

Here, in a case where the voltage of the pull-up node Q<N> is at the high level and the transmission circuit 3203 is in a non-operating state, the third transistor M3 may be turned on under the control of the voltage of the pull-up node Q<N>, and transmit the first voltage signal to the leakage prevention node OFF<N>, so that the voltage of the leakage prevention node OFF<N> increases. As a result, a voltage difference between the control electrode and the first electrode of the twenty-sixth transistor M26 is less than zero, which ensures that the twenty-sixth transistor M26 is completely or relatively completely turned off. In this way, it is possible to prevent charges at the pull-up node Q<N> from leaking through the transmission circuit 3203, so that the pull-up node Q<N> may be maintained at the relatively high and stable voltage.

For example, as shown in FIG. 6, in a case where the gate drive circuit 3 further includes the blanking input circuit 32, the shift register 31 may further include a sixth reset circuit 3110. The sixth reset circuit 3110 is electrically connected to the second clock signal terminal CLKA, the first blanking node H, the pull-down node QB_A, and the second voltage signal terminal VGL1. The sixth reset circuit 3110 is configured to, during the blanking period of the frame display phase, transmit the second voltage signal transmitted by the second voltage signal terminal VGL1 to the pull-down node QB_A to reset the pull-down node QB_A under control of both the second clock signal transmitted by the second clock signal terminal CLKA and the voltage of the first blanking node H.

For example, during the blanking period of the frame display phase, in a case where the level of the second clock signal is the high level and the voltage of the first blanking node H is at the high level, the sixth reset circuit 3110 may be turned on under the control of both the second clock signal and the voltage of the first blanking node H, and transmit the second voltage signal transmitted by the second voltage signal terminal VGL1 to the pull-down node QB_A to pull down and reset the pull-down node QB_A.

Optionally, as shown in FIG. 6, the sixth reset circuit 3110 may include a thirty-second transistor M32 and a thirty-third transistor M33.

For example, as shown in FIG. 6, a control electrode of the thirty-second transistor M32 is electrically connected to the second clock signal terminal CLKA, a first electrode of the thirty-second transistor M32 is electrically connected to the pull-down node QB_A, and a second electrode of the thirty-second transistor M32 is electrically connected to a first electrode of the thirty-third transistor M33. A control electrode of the thirty-third transistor M33 is electrically connected to the first blanking node H, and a second electrode of the thirty-third transistor M33 is electrically connected to the second voltage signal terminal VGL1.

In the case where the level of the second clock signal is the high level and the voltage of the first blanking node H is at the high level, the thirty-third transistor M33 may be turned on under control of the voltage of the first blanking node H and transmit the second voltage signal to the first electrode of the thirty-third transistor M33; and the thirty-second transistor M32 may be turned on under control of the second clock signal and transmit the second voltage signal from the first electrode of the thirty-third transistor M33 to the pull-down node QB_A to pull down and reset the pull-down node QB_A.

As shown in FIG. 6, a structure of the gate drive circuit 3 is schematically illustrated by taking an example in which two adjacent shift registers 31 share one blanking input circuit 32. N is a positive odd number.

Here, as shown in FIG. 6, in the two adjacent shift registers 31, the fourth transistor M4 may not be provided in the output circuit 3103 in a latter shift register 31, and the output circuit 3103 in the latter shift register 31 may not be electrically connected to the third clock signal terminal CLKD_1.

Based on this, the shift signal terminal CR<N> of the N-th shift register 31 may be electrically connected to input signal terminals Iput of an (N+2)-th shift register 31 and an (N+3)-th shift register 31. As a result, the shift signal output by the shift signal terminal CR<N> of the N-th shift register 31 is used as an input signal of the (N+2)-th shift register 31 and an input signal of the (N+3)-th shift register 31. Display reset signal terminals STD of the N-th shift register 31 and an (N+1)-th shift register 31 may be, for example, electrically connected to the shift signal terminal CR<N+4> of an (N+4)-th shift register 31. As a result, the shift signal output by the shift signal terminal CR<N+4> of the (N+4)-th shift register 31 is used as the display reset signal of the N-th shift register 31 and an display reset signal of the (N+1)-th shift register 31. Of course, the cascade relationship of the plurality of shift registers 31 is not limited thereto.

For example, the shift signal terminal CR<1> of the first shift register 31 may be electrically connected to input signal terminals Iput of a third shift register and a fourth shift register 31. The shift signal terminal CR<5> of a fifth shift register 31 may be electrically connected to display reset signal terminals STD of the first shift register and a second shift register 31.

This is beneficial to simplify the structure of the gate drive circuit 3 and reduce space occupancy of the gate drive circuit 3 in the display panel 100.

For example, as shown in FIG. 6, a previous shift register 31 (i.e., the Nth shift register 31) in the two adjacent shift registers 31 may be referred to as a first scanning unit 31a, and a latter shift register 31 (i.e., the (N+1)-th shift register 31) in the two adjacent shift registers 31 may be referred to as a second scanning unit 31b. In this case, the pull-up node Q<N> of the first scanning unit 31a may be referred to as a first pull-up node Q<N>, and the pull-up node Q<N> of the second scanning unit 31b may be referred to as a second pull-up node Q<N+1>. The pull-down node QB_A of the first scanning unit 31a may be referred to as a first pull-down node QB_A, and the pull-down node QB_A of the second scanning unit 31b may be referred to as a second pull-down node QB_B. The leakage prevention node OFF<N> of the first scanning unit 31a may be referred to as a first leakage prevention node OFF<N>, and the leakage prevention node OFF<N> of the second scanning unit 31b may be referred to as a second leakage prevention node OFF<N+1>. The first clock signal terminal CLKE_1 of the second scanning unit 31b may be referred to as a fifth clock signal terminal CLKE_2, and the fourth clock signal terminal CLKF_1 of the second scanning unit 31b may be referred to as a sixth clock signal terminal CLKF_2. The first output signal terminal Oput1<N> of the first scanning unit 31a may be referred to as a first sub-output signal terminal Oput1<N>, the second output signal terminal Oput2<N> of the first scanning unit 31a may be referred to as a second sub-output signal terminal Oput2<N>, the first output signal terminal Oput1<N> of the second scanning unit 31b may be referred to as a third sub-output signal terminal Oput1<N+1>, and the second output signal terminal Oput2<N> of the second scanning unit 31b may be referred to as a fourth sub-output signal terminal Oput2<N+1>.

For example, as shown in FIG. 6, the control circuit 3104 in the second scanning unit 31b may be electrically connected to a seventh voltage signal terminal VDD_B, and the sixth voltage signal terminal VDD_A is replaced by the seventh voltage signal terminal VDD_B. In the frame display phase, the sixth voltage signal transmitted by the sixth voltage signal terminal VDD_A and a seventh voltage signal transmitted by the seventh voltage signal terminal VDD_B are inverse signals.

For example, as shown in FIG. 6, the first reset circuit 3105 in the first scanning unit 31a may further be electrically connected to the second pull-down node QB_B. The first reset circuit 3105 in the first scanning unit 31a is further configured to reset the first pull-up node Q<N> under control of a voltage of the second pull-down node QB_B.

For example, in a case where the voltage of the second pull-down node QB_B is at a high level, the first reset circuit 3105 in the first scanning unit 31a may be turned on under an action of the voltage of the second pull-down node QB_B, and transmit the second voltage signal transmitted by the second voltage signal terminal VGL1 to the first pull-up node Q<N> to pull down and reset the first pull-up node Q<N>.

Optionally, as shown in FIG. 6, the first reset circuit 3105 in the first scanning unit 31a may further include a twenty-seventh transistor M27 and a twenty-eighth transistor M28.

For example, as shown in FIG. 6, in the first scanning unit 31a, a control electrode of the twenty-seventh transistor M27 is electrically connected to the second pull-down node QB_B, a first electrode of the twenty-seventh transistor M27 is electrically connected to the first pull-up node Q<N>, and a second electrode of the twenty-seventh transistor M27 is electrically connected to a first electrode of the twenty-eighth transistor M28 and the first leakage prevention node OFF<N>. A control electrode of the twenty-eighth transistor M28 is electrically connected to the second pull-down node QB_B, and a second electrode of the twenty-eighth transistor M28 is electrically connected to the second voltage signal terminal VGL1.

In the case where the voltage of the second pull-down node QB_B is at the high level, the twenty-seventh transistor M27 and the twenty-eighth transistor M28 may be simultaneously turned on under the action of the voltage of the second pull-down node QB_B. The twenty-eighth transistor M28 may transmit the second voltage signal transmitted by the second voltage signal terminal VGL1 to the first leakage prevention node OFF<N>, and the twenty-seventh transistor M27 may transmit the second voltage signal from the first leakage prevention node OFF<N> to the first pull-up node Q<N> to reset the first pull-up node Q<N>.

For example, as shown in FIG. 6, the first reset circuit 3105 in the second scanning unit 31b may further be electrically connected to the first pull-down node QB_A. The first reset circuit 3105 in the second scanning unit 31b is further configured to reset the second pull-up node Q<N+1> under control of a voltage of the first pull-down node QB_A.

For example, in a case where the voltage of the first pull-down node QB_A is at a high level, the first reset circuit 3105 in the second scanning unit 31b may be turned on under an action of the voltage of the first pull-down node QB_A, and transmit the second voltage signal transmitted by the second voltage signal terminal VGL1 to the second pull-up node Q<N+1> to pull down and reset the second pull-up node Q<N+1>.

Optionally, as shown in FIG. 6, the first reset circuit 3105 in the second scanning unit 31b may further include a twenty-seventh transistor M27 and a twenty-eighth transistor M28.

For example, as shown in FIG. 6, in the second scanning unit 31b, a control electrode of the twenty-seventh transistor M27 is electrically connected to the first pull-down node QB_A, a first electrode of the twenty-seventh transistor M27 is electrically connected to the second pull-up node Q<N+1>, and a second electrode of the twenty-seventh transistor M27 is electrically connected to a first electrode of the twenty-eighth transistor M28 and the second leakage prevention node OFF<N+1>. A control electrode of the twenty-eighth transistor M28 is electrically connected to the first pull-down node QB_A, and a second electrode of the twenty-eighth transistor M28 is electrically connected to the second voltage signal terminal VGL1.

In the case where the voltage of the first pull-down node QB_A is at the high level, the twenty-seventh transistor M27 and the twenty-eighth transistor M28 may be simultaneously turned on under the action of the voltage of the first pull-down node QB_A, the twenty-eighth transistor M28 may transmit the second voltage signal transmitted by the second voltage signal terminal VGL1 to the second leakage prevention node OFF<N+1>, and the twenty-seventh transistor M27 may transmit the second voltage signal from the second leakage prevention node OFF<N+1> to the second pull-up node Q<N+1> to reset the second pull-up node Q<N+1>.

For example, as shown in FIG. 6, the fourth reset circuit 3108 in the first scanning unit 31a may further be electrically connected to the second pull-down node QB_B. The fourth reset circuit 3108 in the first scanning unit 31a is further configured to reset the shift signal terminal CR<N>, the first sub-output signal terminal Oput1<N>, and the second sub-output signal terminal Oput2<N> under control of the voltage of the second pull-down node QB_B.

For example, in the case where the voltage of the second pull-down node QB_B is at the high level, the fourth reset circuit 3108 in the first scanning unit 31*a* may be turned on under an action of the voltage of the second pull-down node QB_B, transmit the second voltage signal transmitted by the second voltage signal terminal VGL1 to the shift signal terminal CR<N> to pull down and reset the shift signal terminal CR<N>, and transmit the third voltage signal transmitted by the third voltage signal terminal VGL2 to the first sub-output signal terminal Oput1<N> and the second sub-output signal terminal Oput2<N> to pull down and reset the first sub-output signal terminal Oput1<N> and the second sub-output signal terminal Oput2<N>.

Optionally, as shown in FIG. 6, the fourth reset circuit 3108 in the first scanning unit 31*a* may further include: a twenty-ninth transistor M29, a thirtieth transistor M30, and a thirty-first transistor M31.

For example, as shown in FIG. 6, a control electrode of the twenty-ninth transistor M29 is electrically connected to the second pull-down node QB_B, a first electrode of the twenty-ninth transistor M29 is electrically connected to the shift signal terminal CR<N>, and a second electrode of the twenty-ninth transistor M29 is electrically connected to the second voltage signal terminal VGL1.

In the case where the voltage of the second pull-down node QB_B is at the high level, the twenty-ninth transistor M29 may be turned on under the action of the voltage of the second pull-down node QB_B, and transmit the second voltage signal transmitted by the second voltage signal terminal VGL1 to the shift signal terminal CR<N> to pull down and reset the shift signal terminal CR<N>.

For example, as shown in FIG. 6, a control electrode of the thirtieth transistor M30 is electrically connected to the second pull-down node QB_B, a first electrode of the thirtieth transistor M30 is electrically connected to the first sub-output signal terminal Oput1<N>, and a second electrode of the thirtieth transistor M30 is electrically connected to the third voltage signal terminal VGL2.

In the case where the voltage of the second pull-down node QB_B is at the high level, the thirtieth transistor M30 may be turned on under the action of the voltage of the second pull-down node QB_B, and transmit the third voltage signal transmitted by the third voltage signal terminal VGL2 to the first sub-output signal terminal Oput1<N> to pull down and reset the first sub-output signal terminal Oput1<N>.

For example, as shown in FIG. 6, a control electrode of the thirty-first transistor M31 is electrically connected to the second pull-down node QB_B, a first electrode of the thirty-first transistor M31 is electrically connected to the second sub-output signal terminal Oput2<N>, and a second electrode of the thirty-first transistor M31 is electrically connected to the third voltage signal terminal VGL2.

In the case where the voltage of the second pull-down node QB_B is at the high level, the thirty-first transistor M31 may be turned on under the action of the voltage of the second pull-down node QB_B, and transmit the third voltage signal transmitted by the third voltage signal terminal VGL2 to the second sub-output signal terminal Oput2<N> to pull down and reset the second sub-output signal terminal Oput2<N>.

For example, as shown in FIG. 6, the fourth reset circuit 3108 in the second scanning unit 31*b* may further be electrically connected to the first pull-down node QB_A. The fourth reset circuit 3108 in the second scanning unit 31*b* is further configured to reset the third sub-output signal terminal Oput1<N+1> and the fourth sub-output signal terminal Oput2<N+1> under control of the voltage of the first pull-down node QB_A.

For example, in the case where the voltage of the first pull-down node QB_A is at the high level, the fourth reset circuit 3108 in the second scanning unit 31*b* may be turned on under an action of the voltage of the first pull-down node QB_A, transmit the third voltage signal transmitted by the third voltage signal terminal VGL2 to the third sub-output signal terminal Oput1<N+1> to pull down and reset the third sub-output signal terminal Oput1<N+1>, and transmit the third voltage signal transmitted by the third voltage signal terminal VGL2 to the fourth sub-output signal terminal Oput2<N+1> to pull down and reset the fourth sub-output signal terminal Oput2<N+1>.

Optionally, as shown in FIG. 6, the fourth reset circuit 3108 in the second scanning unit 31*b* may further include a thirtieth transistor M30 and a thirty-first transistor M31.

For example, as shown in FIG. 6, a control electrode of the thirtieth transistor M30 is electrically connected to the first pull-down node QB_A, a first electrode of the thirtieth transistor M30 is electrically connected to the third sub-output signal terminal Oput1<N+1>, and a second electrode of the thirtieth transistor M30 is electrically connected to the third voltage signal terminal VGL2.

In the case where the voltage of the first pull-down node QB_A is at the high level, the thirtieth transistor M30 may be turned on under the action of the voltage of the first pull-down node QB_A, and transmit the third voltage signal transmitted by the third voltage signal terminal VGL2 to the third sub-output signal terminal Oput1<N+1> to pull down and reset the third sub-output signal terminal Oput1<N+1>.

For example, as shown in FIG. 6, a control electrode of the thirty-first transistor M31 is electrically connected to the first pull-down node QB_A, a first electrode of the thirty-first transistor M31 is electrically connected to the fourth sub-output signal terminal Oput2<N+1>, and a second electrode of the thirty-first transistor M31 is electrically connected to the third voltage signal terminal VGL2.

In the case where the voltage of the first pull-down node QB_A is at the high level, the thirty-first transistor M31 may be turned on under the action of the voltage of the first pull-down node QB_A, and transmit the third voltage signal transmitted by the third voltage signal terminal VGL2 to the fourth sub-output signal terminal Oput2<N+1> to pull down and reset the fourth sub-output signal terminal Oput2<N+1>.

Figure 8:
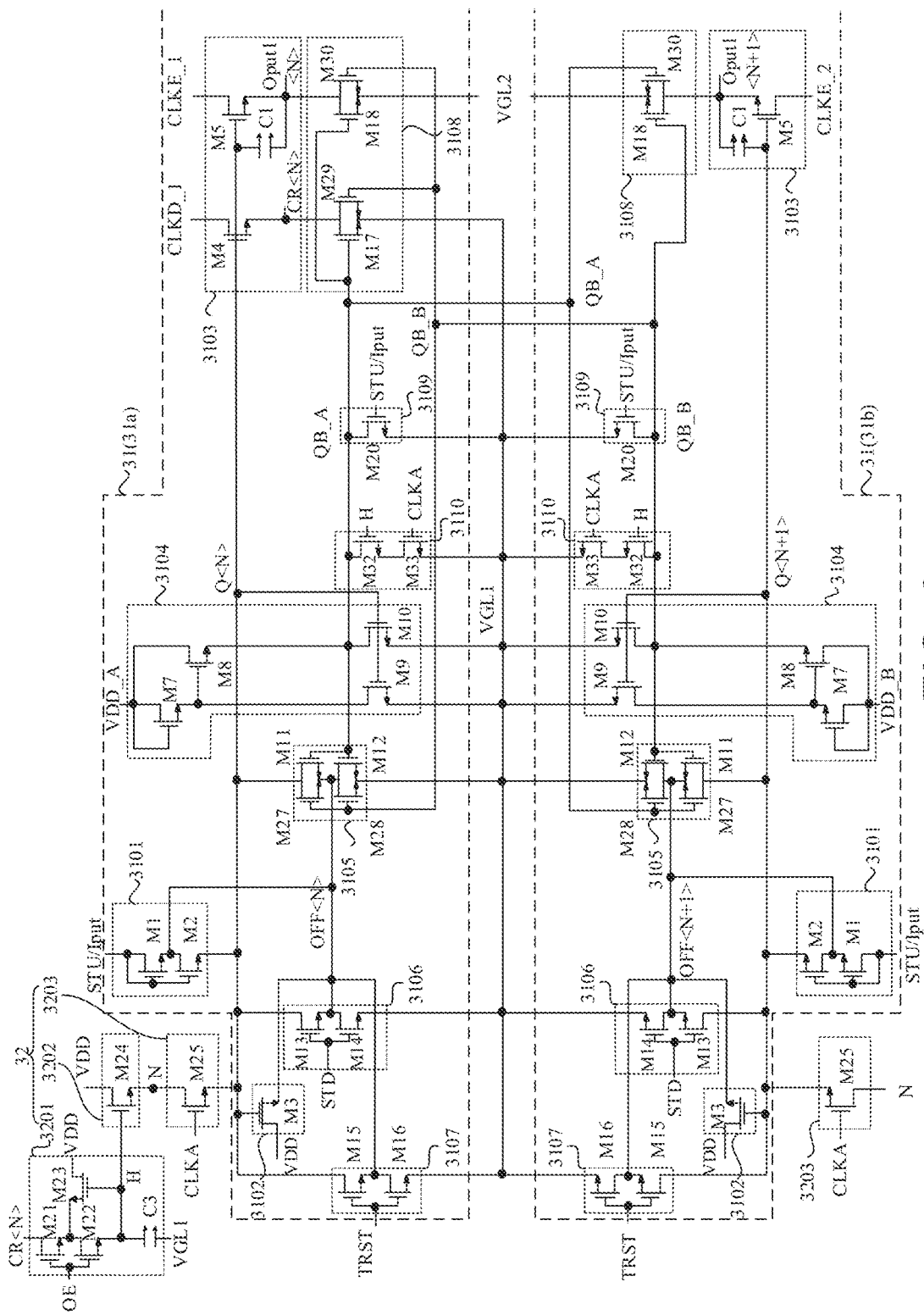
FIG. 8 is another circuit diagram of two adjacent shift registers, in accordance with some embodiments of the present disclosure.

In some other examples, as shown in FIGS. 5 and 8, the shift register 31 may include: a first input circuit 3101, a leakage prevention circuit 3102, an output circuit 3103, a control circuit 3104, a first reset circuit 3105, a second reset circuit 3106, a third reset circuit 3107, a fourth reset circuit 3108, and a fifth reset circuit 3109.

For example, the first input circuit 3101 in these examples may have the same structure and function as the first input circuit 3101 in the above examples. The leakage prevention circuit 3102 in these examples may have the same structure and function as the leakage prevention circuit 3102 in the above examples. The control circuit 3104 in these examples may have the same structure and function as the control circuit 3104 in the above examples. The first reset circuit 3105 in these examples may have the same structure and function as the first reset circuit 3105 in the above examples. The second reset circuit 3106 in these examples may have the same structure and function as the second reset circuit 3106 in the above examples. The third reset circuit 3107 in these examples may have the same structure and function as the third reset circuit 3107 in the above examples. The fifth reset circuit 3109 in these examples may have the same structure and function as the fifth reset circuit 3109 in the above examples. Structures and functions of same circuits will not be repeated here.

For example, as shown in FIGS. 5 and 8, the output circuit 3103 is electrically connected to a pull-up node Q<N>, a first clock signal terminal CLKE_1, and a first output signal terminal Oput1<N>. The output circuit 3103 is configured to, during the display period of the frame display phase, transmit a first clock signal received at the first clock signal terminal CLKE_1 to the first output signal terminal Oput1<N> under control of a voltage of the pull-up node Q<N>; and during the blanking period of the frame display phase, transmit a first clock signal received at the first clock signal terminal CLKE_1 to the first output signal terminal Oput1<N> under the control of the voltage of the pull-up node Q<N>.

Of course, as shown in FIGS. 5 and 8, the output circuit 3103 may, for example, be further electrically connected to a third clock signal terminal CLKD_1 and a shift signal terminal CR<N>. The output circuit 3103 is further configured to, during the display period of the frame display phase, transmit a third clock signal received at the third clock signal terminal CLKD_1 to the shift signal terminal CR<N> under the control of the voltage of the pull-up node Q<N>.

For example, during the display period of the frame display phase, in a case where the voltage of the pull-up node Q<N> increases, the output circuit 3103 may be turned on under the control of the voltage of the pull-up node Q<N>, and output the third clock signal received at the third clock signal terminal CLKD_1 as a shift signal from the shift signal terminal CR<N>; and output the first clock signal received at the first clock signal terminal CLKE_1 as an output signal (i.e., a first gate signal received by the pixel drive circuit 21) from the first output signal terminal Oput1<N>. During the blanking period of the frame display phase, in a case where the voltage of the pull-up node Q<N> increases, the output circuit 3103 may be turned on under the control of the voltage of the pull-up node Q<N>, and output the first clock signal received at the first clock signal terminal CLKE_1 as an output signal (i.e., a second gate signal received by the pixel drive circuit 21) from the first output signal terminal Oput1<N>.

For example, the first output signal terminal Oput1<N> of the shift register 31 may be electrically connected not only to the first gate line, but also to the second gate line, so that during the display period of the frame display phase, the first output signal terminal Oput1<N> of the shift register 31 may transmit the first gate signal to pixel drive circuits 21 through the first gate line and first gate signal terminals G1 electrically connected to the pixel drive circuits 21 in sequence; and during the blanking period of the frame display phase, the first output signal terminal Oput1<N> of the shift register 31 may transmit the second gate signal to the pixel drive circuits 21 through the second gate line and second gate signal terminals G2 electrically connected to the pixel drive circuits 21 in sequence. As another example, the first output signal terminal Oput1<N> of the shift register 31 may be electrically connected to the first gate signal terminals G1 and the second gate signal terminals G2 through one gate line, so that during the display period of the frame display phase, the first output signal terminal Oput1<N> of the shift register 31 may transmit the first gate signal to the pixel drive circuits 21 through the gate line and the first gate signal terminals G1 electrically connected to the pixel drive circuits 21 in sequence; and during the blanking period of the frame display phase, the first output signal terminal Oput1<N> of the shift register 31 may transmit the second gate signal to the pixel drive circuits 21 through the gate line and the second gate signal terminals G2 electrically connected to the pixel drive circuits 21 in sequence.

Optionally, as shown in FIGS. 5 and 8, the output circuit 3103 may include: a fourth transistor M4, a fifth transistor M5, and a first capacitor C1.

For example, as shown in FIGS. 5 and 8, a control electrode of the fourth transistor M4 is electrically connected to the pull-up node Q<N>, a first electrode of the fourth transistor M4 is electrically connected to the third clock signal terminal CLKD_1, and a second electrode of the fourth transistor M4 is electrically connected to the shift signal terminal CR<N>.

During the display period of the frame display phase, in a case where the first input circuit 3101 is turned on to cause the voltage of the pull-up node Q<N> to increase, the fourth transistor M4 may be turned on under the control of a high voltage of the pull-up node Q<N>, transmit the third clock signal to the shift signal terminal CR<N>, and output the third clock signal as the shift signal from the shift signal terminal CR<N>.

For example, as shown in FIGS. 5 and 8, a control electrode of the fifth transistor M5 is electrically connected to the pull-up node Q<N>, a first electrode of the fifth transistor M5 is electrically connected to the first clock signal terminal CLKE_1, and a second electrode of the fifth transistor M5 is electrically connected to the first output signal terminal Oput1<N>. A first terminal of the first capacitor C1 is electrically connected to the pull-up node Q<N>, and a second terminal of the first capacitor C1 is electrically connected to the first output signal terminal Oput1<N>.

During the display period of the frame display phase, the first capacitor C1 is charged while the first input circuit 3101 is turned on to cause the voltage of the pull-up node Q<N> to increase. In a case where the first input circuit 3101 is turned off, the first capacitor C1 may be discharged, so that the pull-up node Q<N> is maintained at a high level. As a result, the fifth transistor M5 may be maintained in a turn-on state, transmit the first clock signal to the first output signal terminal Oput1<N>, and output the first clock signal as the output signal (i.e., the first gate signal received by the pixel drive circuit 21) from the first output signal terminal Oput1<N>.

During the blanking period of the frame display phase, the first capacitor C1 is charged while the voltage of the pull-up node Q<N> increases. In a corresponding phase, the first capacitor C1 may be discharged, so that the pull-up node Q<N> is maintained at the high level. As a result, the fifth transistor M5 may be maintained in the turn-on state, transmit the first clock signal to the first output signal terminal Oput1<N>, and output the first clock signal as the output signal (i.e., the second gate signal received by the pixel drive circuit 21) from the first output signal terminal Oput1<N>.

For example, as shown in FIGS. 5 and 8, the fourth reset circuit 3108 is electrically connected to a pull-down node QB_A, the shift signal terminal CR<N>, the first output signal terminal Oput1<N>, a second voltage signal terminal VGL1, and a third voltage signal terminal VGL2. The fourth reset circuit 3108 is configured to, under control of a voltage of the pull-down node QB_A, transmit a second voltage signal transmitted by the second voltage signal terminal VGL1 to the shift signal terminal CR<N> to reset the shift signal terminal CR<N>, and transmit a third voltage signal transmitted by the third voltage signal terminal VGL2 to the first output signal terminal Oput1<N> to reset the first output signal terminal Oput1<N>.

For example, in a case where the voltage of the pull-down node QB_A is at a high level, the fourth reset circuit 3108 may be turned on under an action of the voltage of the pull-down node QB_A, transmit the second voltage signal transmitted by the second voltage signal terminal VGL1 to the shift signal terminal CR<N> to pull down and reset the shift signal terminal CR<N>, and transmit the third voltage signal transmitted by the third voltage signal terminal VGL2 to the first output signal terminal Oput1<N> to pull down and reset the first output signal terminal Oput1<N>.

Optionally, as shown in FIGS. 5 and 8, the fourth reset circuit 3108 may include a seventeenth transistor M17 and an eighteenth transistor M18.

For example, as shown in FIGS. 5 and 8, a control electrode of the seventeenth transistor M17 is electrically connected to the pull-down node QB_A, a first electrode of the seventeenth transistor M17 is electrically connected to the shift signal terminal CR<N>, and a second electrode of the seventeenth transistor M17 is electrically connected to the second voltage signal terminal VGL1.

In the case where the voltage of the pull-down node QB_A is at the high level, the seventeenth transistor M17 may be turned on under the action of the voltage of the pull-down node QB_A, and transmit the second voltage signal transmitted by the second voltage signal terminal VGL1 to the shift signal terminal CR<N> to pull down and reset the shift signal terminal CR<N>.

For example, as shown in FIGS. 5 and 8, a control electrode of the eighteenth transistor M18 is electrically connected to the pull-down node QB_A, a first electrode of the eighteenth transistor M18 is electrically connected to the first output signal terminal Oput1<N>, and a second electrode of the eighteenth transistor M18 is electrically connected to the third voltage signal terminal VGL2.

In the case where the voltage of the pull-down node QB_A is at the high level, the eighteenth transistor M18 may be turned on under the action of the voltage of the pull-down node QB_A, and transmit the third voltage signal transmitted by the third voltage signal terminal VGL2 to the first output signal terminal Oput1<N> to pull down and reset the first output signal terminal Oput1<N>.

It will be noted that, the gate drive circuit 3 may further include a plurality of blanking input circuits 32 (only one blanking input circuit 32 is shown in FIG. 8). A blanking input circuit 32 may be electrically connected to at least two adjacent shift registers 31. That is, at least two shift registers 31 share one blanking input circuit 32. The blanking input circuit 32 is configured to, during the blanking period of the frame display phase, control a corresponding shift register 31 to input a blanking control signal to pixel drive circuits 21 in a corresponding row, so that the pixel drive circuits 21 obtain sensing signals.

Here, as shown in FIG. 8, the blanking input circuit 32 may include, for example, a selection control circuit 3201, a second input circuit 3202, and at least two transmission circuits 3203.

For example, the selection control circuit 3201 in the blanking input circuit 32 in these examples may have the same structure and function as the selection control circuit 3201 in the blanking input circuit 32 in the above examples, and the second input circuit 3202 in the blanking input circuit 32 in these examples may have the same structure and function as the second input circuit 3202 in the blanking input circuit 32 in the above examples. Structures and functions of same circuits will not be repeated here.

For example, as shown in FIG. 8, the at least two transmission circuits 3203 may be electrically connected to at least two shift registers 31 in a one-to-one correspondence. A transmission circuit 3203 is electrically connected to a second blanking node N, a second clock signal terminal CLKA, and the pull-up node Q<N> of one shift register 31. The transmission circuit 3202 is configured to, during the blanking period of the frame display phase, transmit a second clock signal or a first voltage signal received at the second blanking node N to the pull-up node Q<N> under control of the second clock signal transmitted by the second clock signal terminal CLKA.

For example, during the blanking period of the frame display phase, in a case where a level of the second clock signal transmitted by the second clock signal terminal CLKA is a high level, the transmission circuit 3202 may be turned on under the control of the second clock signal, receive the second clock signal or the first voltage signal from the second blanking node N, and transmit the received second clock signal or first voltage signal to the pull-up node Q<N>, so that the voltage of the pull-up node Q<N> increases. As a result, the output circuit 3103 may be turned on, and thus the first output signal terminal Oput1<N> of the output circuit 3103 outputs a signal (i.e., the second gate signal).

Optionally, as shown in FIG. 8, the transmission circuit 3203 may include a twenty-fifth transistor M25.

For example, as shown in FIG. 8, a control electrode of the twenty-fifth transistor M25 is electrically connected to the second clock signal terminal CLKA, a first electrode of the twenty-fifth transistor M25 is electrically connected to the second blanking node N, and a second electrode of the twenty-fifth transistor M25 is electrically connected to the pull-up node Q<N>.

During the blanking period of the frame display phase, in the case where the level of the second clock signal transmitted by the second clock signal terminal CLKA is the high level, the twenty-fifth transistor M25 may be turned on under an action of the second clock signal, and transmit the second clock signal or the first voltage signal from the second blanking node N to the pull-up node Q<N> to charge the pull-up node Q<N>. The fifth transistor M5 in the output circuit 3103 may be turned on under the control of the voltage of the pull-up node Q<N>, receive the first clock signal, and output the first clock signal as the second gate signal (i.e., the blanking control signal) from the first output signal terminal Oput1<N>.

For example, as shown in FIG. 8, in a case where the gate drive circuit 3 further includes the blanking input circuit 32, the shift register 31 may further include a sixth reset circuit 3110. The sixth reset circuit 3110 is electrically connected to the second clock signal terminal CLKA, a first blanking node H, the pull-down node QB_A, and the second voltage signal terminal VGL1. The sixth reset circuit 3110 is configured to, during the blanking period of the frame display phase, transmit the second voltage signal transmitted by the second voltage signal terminal VGL1 to the pull-down node QB_A to reset the pull-down node QB_A under control of both the second clock signal transmitted by the second clock signal terminal CLKA and a voltage of the first blanking node H.

For example, during the blanking period of the frame display phase, in a case where the level of the second clock signal is the high level and the voltage of the first blanking node H is at a high level, the sixth reset circuit 3110 may be turned on under the control of both the second clock signal and the voltage of the first blanking node H, and transmit the second voltage signal transmitted by the second voltage signal terminal VGL1 to the pull-down node QB_A to pull down and reset the pull-down node QB_A.

Optionally, as shown in FIG. 8, the sixth reset circuit 3110 may include a thirty-second transistor M32 and a thirty-third transistor M33.

For example, as shown in FIG. 8, a control electrode of the thirty-second transistor M32 is electrically connected to the first blanking node H, a first electrode of the thirty-second transistor M32 is electrically connected to the pull-down node QB_A, and a second electrode of the thirty-second transistor M32 is electrically connected to a first electrode of the thirty-third transistor M33. A control electrode of the thirty-third transistor M33 is electrically connected to the second clock signal terminal CLKA, and a second electrode of the thirty-third transistor M33 is electrically connected to the second voltage signal terminal VGL1.

In the case where the level of the second clock signal is the high level and the voltage of the first blanking node H is at the high level, the thirty-third transistor M33 may be turned on under control of the second clock signal, and transmit the second voltage signal to the first electrode of the thirty-third transistor M33; and the thirty-second transistor M32 may be turned on under control of the voltage of the first blanking node H, and transmit the second voltage signal from the first electrode of the thirty-third transistor M33 to the pull-down node QB_A to pull down and reset the pull-down node QB_A.

As shown in FIG. 8, a structure of the gate drive circuit 3 is schematically illustrated by taking an example in which two adjacent shift registers 31 share one blanking input circuit 32. N is a positive odd number.

Here, as shown in FIG. 8, in the two adjacent shift registers 31, the fourth transistor M4 may not be provided in the output circuit 3103 in a latter shift register 31, and the output circuit 3103 in the latter shift register 31 may not be electrically connected to the third clock signal terminal CLKD_1.

For example, a cascade relationship of the plurality of shift registers 31 in these examples may be the same as the cascade relationship of the plurality of shift registers 31 in the above examples, which will not be repeated here.

For example, in the two adjacent shift registers 31, a previous (i.e., the N-th) shift register 31 may be referred to as a first scanning unit 31a, and the latter (i.e., the (N+1)-th) shift register 31 may be referred to as a second scanning unit 31b. In this case, the pull-up node Q<N> of the first scanning unit 31a may be referred to as a first pull-up node Q<N>, and the pull-up node Q<N> of the second scanning unit 31b may be referred to as a second pull-up node Q<N+1>. The pull-down node QB_A of the first scanning unit 31a may be referred to as a first pull-down node QB_A, and the pull-down node QB_A of the second scanning unit 31b may be referred to as a second pull-down node QB_B. The leakage prevention node OFF<N> of the first scanning unit 31a may be referred to as a first leakage prevention node OFF<N>, and the leakage prevention node OFF<N> of the second scanning unit 31b may be referred to as a second leakage prevention node OFF<N+1>. The first clock signal terminal CLKE_1 of the second scanning unit 31b may be referred to as a fifth clock signal terminal CLKE_2. The first output signal terminal Oput1<N> of the first scanning unit 31a may be referred to as a first sub-output signal terminal Oput1<N>, and the first output signal terminal Oput1<N> of the second scanning unit 31b may be referred to as a second sub-output signal terminal Oput1<N+1>.

For example, as shown in FIG. 8, the control circuit 3104 in the second scanning unit 31b may be electrically connected to a seventh voltage signal terminal VDD_B, and a sixth voltage signal terminal VDD_A electrically connected to the control circuit 3104 in the first scanning unit 31a is replaced by the seventh voltage signal terminal VDD_B. In the frame display phase, a sixth voltage signal transmitted by the sixth voltage signal terminal VDD_A and the seventh voltage signal transmitted by the seventh voltage signal terminal VDD_B are inverse signals.

For example, a structure and function of the first reset circuit 3105 in the first scanning unit 31a in this example may be the same as the structure and function of the first reset circuit 3105 in the first scanning unit 31a in the above examples, and a structure and function of the first reset circuit 3105 in the second scanning unit 31b in this example may be the same as the structure and function of the first reset circuit 3105 in the second scanning unit 31b in the above examples. Structures and functions of same circuits will not be repeated here.

For example, as shown in FIG. 8, the fourth reset circuit 3108 in the first scanning unit 31a may further be electrically connected to the second pull-down node QB_B. The fourth reset circuit 3108 in the first scanning unit 31a is further configured to reset the shift signal terminal CR<N> and the first sub-output signal terminal Oput1<N> under control of a voltage of the second pull-down node QB_B.

For example, in a case where the voltage of the second pull-down node QB_B is at a high level, the fourth reset circuit 3108 in the first scanning unit 31a may be turned on under an action of the voltage of the second pull-down node QB_B, transmit the second voltage signal transmitted by the second voltage signal terminal VGL1 to the shift signal terminal CR<N> to pull down and reset the shift signal terminal CR<N>, and transmit the third voltage signal transmitted by the third voltage signal terminal VGL2 to the first sub-output signal terminal Oput1<N> to pull down and reset the first sub-output signal terminal Oput1<N>.

Optionally, as shown in FIG. 8, the fourth reset circuit 3108 in the first scanning unit 31a may further include a twenty-ninth transistor M29 and a thirtieth transistor M30.

For example, as shown in FIG. 8, a control electrode of the twenty-ninth transistor M29 is electrically connected to the second pull-down node QB_B, a first electrode of the twenty-ninth transistor M29 is electrically connected to the shift signal terminal CR<N>, and a second electrode of the twenty-ninth transistor M29 is electrically connected to the second voltage signal terminal VGL1.

In the case where the voltage of the second pull-down node QB_B is at the high level, the twenty-ninth transistor M29 may be turned on under the action of the voltage of the second pull-down node QB_B, and transmit the second voltage signal transmitted by the second voltage signal terminal VGL1 to the shift signal terminal CR<N> to pull down and reset the shift signal terminal CR<N>.

For example, as shown in FIG. 8, a control electrode of the thirtieth transistor M30 is electrically connected to the second pull-down node QB_B, a first electrode of the thirtieth transistor M30 is electrically connected to the first sub-output signal terminal Oput1<N>, and a second electrode of the thirtieth transistor M30 is electrically connected to the third voltage signal terminal VGL2.

In the case where the voltage of the second pull-down node QB_B is at the high level, the thirtieth transistor M30 may be turned on under the action of the voltage of the second pull-down node QB_B, and transmit the third voltage signal transmitted by the third voltage signal terminal VGL2 to the first sub-output signal terminal Oput1<N> to pull down and reset the first sub-output signal terminal Oput1<N>.

For example, as shown in FIG. 8, the fourth reset circuit 3108 in the second scanning unit 31b may further be electrically connected to the first pull-down node QB_A. The fourth reset circuit 3108 in the second scanning unit 31b is further configured to reset the second sub-output signal terminal Oput1<N+1> under control of a voltage of the first pull-down node QB_A.

For example, in a case where the voltage of the first pull-down node QB_A is at a high level, the fourth reset circuit 3108 in the second scanning unit 31b may be turned on under an action of the voltage of the first pull-down node QB_A, and transmit the third voltage signal transmitted by the third voltage signal terminal VGL2 to the second sub-output signal terminal Oput1<N+1> to pull down and reset the second sub-output signal terminal Oput1<N+1>.

Optionally, as shown in FIG. 8, the fourth reset circuit 3108 in the second scanning unit 31b may further include a thirtieth transistor M30.

For example, as shown in FIG. 8, a control electrode of the thirtieth transistor M30 is electrically connected to the first pull-down node QB_A, a first electrode of the thirtieth transistor M30 is electrically connected to the second sub-output signal terminal Oput2<N+1>, and a second electrode of the thirtieth transistor M30 is electrically connected to the third voltage signal terminal VGL2.

In the case where the voltage of the first pull-down node QB_A is at the high level, the thirtieth transistor M30 may be turned on under the action of the voltage of the first pull-down node QB_A, and transmit the third voltage signal transmitted by the third voltage signal terminal VGL2 to the second sub-output signal terminal Oput1<N+1> to pull down and reset the second sub-output signal terminal Oput1<N+1>.

The structure of the gate drive circuit 3 will further be schematically described below by taking the structure of the shift register 31 shown in FIG. 6 as an example.

Figure 7:
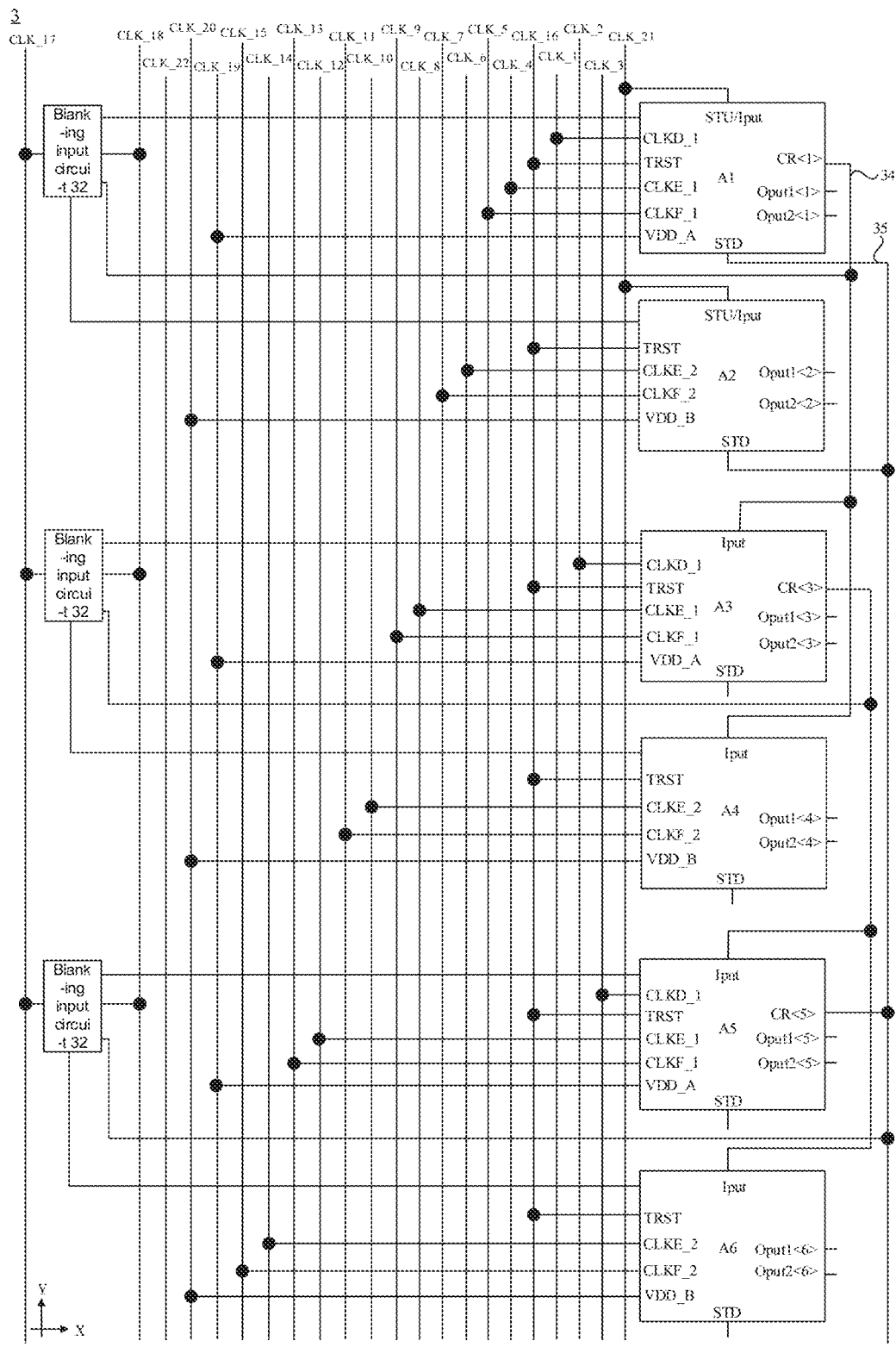
FIG. 7 is a structural diagram of a gate drive circuit, in accordance with some embodiments of the present disclosure.

In some examples, as shown in FIG. 7, the gate drive circuit 3 may further include a plurality of control signal lines 33 extending along the second direction Y. The shift register 31 is electrically connected to at least part of the plurality of control signal lines 33. The shift register 31 is configured to provide output signals to pixel drive circuits 21 in a corresponding row under control of the at least part of the control signal lines 33 electrically connected to the shift register 31.

Here, the at least part of the plurality of control signal lines 33 may refer to some of the plurality of control signal lines 33.

For example, A1, A2, A3 . . . , and A6 shown in FIG. 7 respectively represent the first shift register 31, the second shift register 31, the third shift register 31 and a sixth shift register 31, and are respectively electrically connected to pixel drive circuits 21 in a first row of sub-pixels 2, pixel drive circuits 21 in a second row of sub-pixels 2, pixel drive circuits 21 in a third row of sub-pixel 2 . . . , and pixel drive circuits 21 in a sixth row of sub-pixels 2 in the display panel 100.

A1, A3, and A5 each may be electrically connected to first gate signal terminals G1 of pixel drive circuits 21 in a corresponding row through the first sub-output signal terminal Oput1<N>, and may be electrically connected to second gate signal terminals G2 of the pixel drive circuits 21 in the corresponding row through the second sub-output signal terminal Oput2<N>. A2, A4, and A6 each may be electrically connected to first gate signal terminals G1 of pixel drive circuits 21 in a corresponding row through the third sub-output signal terminal Oput1<N+1>, and may be electrically connected to second gate signal terminals G2 of the pixel drive circuits 21 in the corresponding row through the fourth sub-output signal terminal Oput2<N+1>.

Here, A1, A3, and A5 each may be referred to as the first scanning unit 31a, and A2, A4, and A6 each may be referred to as the second scanning unit 31b.

For example, as shown in FIG. 7, the plurality of control signal lines 33 may include: a first clock signal line CLK_1, a second clock signal line CLK_2, and a third clock signal line CLK_3.

In the first shift register 100, a third clock signal terminal CLKD_1 is electrically connected to the first clock signal line CLK_1 to receive a third clock signal. In the third shift register 100, a third clock signal terminal CLKD_1 is electrically connected to the second clock signal line CLK_2 to receive a third clock signal. In the fifth shift register 100, a third clock signal terminal CLKD_1 is electrically connected to the third clock signal line CLK_3 to receive a third clock signal.

For example, as shown in FIG. 7, the plurality of control signal lines 33 may further include: a fourth clock signal line CLK_4, a fifth clock signal line CLK_5, a sixth clock signal line CLK_6, a seventh clock signal line CLK_7, an eighth clock signal line CLK_8, a ninth clock signal line CLK_9, a tenth clock signal line CLK_10, an eleventh clock signal line CLK_11, a twelfth clock signal line CLK_12, a thirteenth clock signal line CLK_13, a fourteenth clock signal line CLK_14, and a fifteenth clock signal line CLK_15.

In the first shift register 100, a first clock signal terminal CLKE_1 is electrically connected to the fourth clock signal line CLK_4 to receive a first clock signal, and a fourth clock signal terminal CLKF_1 is electrically connected to the fifth clock signal line CLK_5 to receive a fourth clock signal.

In the second shift register 100, a fifth clock signal terminal CLKE_2 is electrically connected to the sixth clock signal line CLK_6 to receive a first clock signal, and a sixth clock signal terminal CLKF_2 is electrically connected to the seventh clock signal line CLK_7 to receive a fourth clock signal.

In the third shift register 100, a first clock signal terminal CLKE_1 is electrically connected to the eighth clock signal line CLK_8 to receive a first clock signal, and a fourth clock signal terminal CLKF_1 is electrically connected to the ninth clock signal line CLK_9 to receive a fourth clock signal.

In the fourth shift register 100, a fifth clock signal terminal CLKE_2 is electrically connected to the tenth clock signal line CLK_10 to receive a first clock signal, and a sixth clock signal terminal CLKF_2 is electrically connected to the eleventh clock signal line CLK_11 to receive a fourth clock signal.

In the fifth shift register 100, a first clock signal terminal CLKE_1 is electrically connected to the twelfth clock signal line CLK_12 to receive a first clock signal, and a fourth clock signal terminal CLKF_1 is electrically connected to the thirteenth clock signal line CLK_13 to receive a fourth clock signal.

In the sixth shift register 100, a fifth clock signal terminal CLKE_2 is electrically connected to the fourteenth clock signal line CLK_14 to receive a first clock signal, and a sixth clock signal terminal CLKF_2 is electrically connected to the fifteenth clock signal line CLK_15 to receive a fourth clock signal.

For example, as shown in FIG. 7, the plurality of control signal lines 33 may further include a sixteenth clock signal line CLK_16.

The global reset signal terminal TRST of each shift register 31 is electrically connected to the sixteenth clock signal line CLK_16 to receive the global reset signal.

For example, as shown in FIG. 7, the plurality of control signal lines 33 may further include a seventeenth clock signal line CLK_17 and an eighteenth clock signal line CLK_18.

The selection control signal terminal OE of each blanking input circuit 32 is electrically connected to the seventeenth clock signal line CLK_17 to receive the selection control signal.

The second clock signal terminal CLKA of each blanking input circuit 32 is electrically connected to the eighteenth clock signal line CLK_18 to receive the second clock signal.

For example, as shown in FIG. 7, the plurality of control signal lines 33 may further include a nineteenth clock signal line CLK_19 and a twentieth clock signal line CLK_20.

A sixth voltage signal terminal VDD_A of the first shift register 31, a sixth voltage signal terminal VDD_A of the third shift register 31, and a sixth voltage signal terminal VDD_A of the fifth shift register 31 are all electrically connected to the nineteenth clock signal line CLK_19 to receive the sixth voltage signal.

A seventh voltage signal terminal VDD_B of the second shift register 31, a seventh voltage signal terminal VDD_B of the fourth shift register 31, and a seventh voltage signal terminal VDD_B of the sixth shift register 31 are all electrically connected to the twentieth clock signal line CLK_20 to receive the seventh voltage signal.

For example, as shown in FIG. 7, the plurality of control signal lines 33 may further include a twenty-first clock signal line CLK_21.

An input signal terminal put of the first shift register 31 and an input signal terminal Iput of the second shift register 31 may both be electrically connected to the twenty-first clock signal line CLK_21 to receive the start signal as the input signal.

For example, as shown in FIG. 7, the plurality of control signal lines 33 may further include a twenty-second clock signal line CLK_22.

Display reset signal terminals STD of last four shift registers 31 in the gate drive circuit 3 may all be electrically connected to the twenty-second clock signal line CLK_22 to receive the display reset signal.

For example, in the gate drive circuit 3, the shift signal terminal CR<N> of the N-th shift register 31 in odd shift registers except the last odd-numbered shift register 31 may be electrically connected to the input signal terminals put of the (N+2)-th shift register 31 and the (N+3)-th shift register 31. As a result, the shift signal output by the shift signal terminal CR<N> of the N-th shift register 31 is used as the input signal of the (N+2)-th shift register 31 and the (N+3)-th shift register 31. In other shift registers 31 except the last four shift registers 31, the display reset signal terminals STD of the N-th shift register 31 and the (N+1)-th shift register 31 may be, for example, electrically connected to the shift signal terminal CR<N+4> of the (N+4)-th shift register 31. As a result, the shift signal output by the shift signal terminal CR<N+4> of the (N+4)-th shift register 31 is used as the display reset signal of the N-th shift register 31 and the (N+1)-th shift register 31.

In the related art, as shown in FIG. 1, a display panel PNL usually has a display region A and a bezel region B surrounding the display region A. Sub-pixels P in the display panel PNL are usually provided in the display region A, and a gate drive circuit 3' electrically connected to the sub-pixels P is usually provided in the bezel region B and located on a side of gate lines GL.

As a resolution of the display panel becomes higher and higher, a display panel with a narrow bezel or even without a bezel has become a current development trend. In the display field, especially in a large-size OLED display, it is difficult to realize a narrow bezel or even no bezel in the display panel PNL by adopting an arrangement of providing the gate drive circuit 3' in the bezel region B of the display panel PNL. Moreover, a shape of the current display panel PNL is mostly designed to be non-rectangular, which makes it more difficult for the display panel PNL adopting the above-mentioned arrangement of providing the gate drive circuit 3' to realize a narrow bezel or even no bezel.

Based on this, as shown in FIG. 3, in the display panel 100 provided in some embodiments of the present disclosure, a plurality of transistors and capacitors included in each shift register 31 may be divided into a plurality of device groups 311. The plurality of device groups 311 each are arranged in a region (a first gap region D) between two adjacent sub-pixels 2 in at least one row of sub-pixels 2.

For example, as shown in FIGS. 9a to 9h, each device group 311 may include at least one transistor and/or at least one capacitor. Structures shown in FIGS. 9a to 9h are sequentially connected structures in a direction where a row of sub-pixels extends. Since it is difficult to show the structures in one figure, the structures are divided to be shown in the plurality of figures.

Here, a way of dividing the plurality of transistors and the capacitors included in the shift register 31 may be selectively set according to actual needs, as long as space occupancy of the divided device groups 311 is relatively small, and a complexity of a connection relationship between the device groups 311 is relatively low.

Figure 9A:
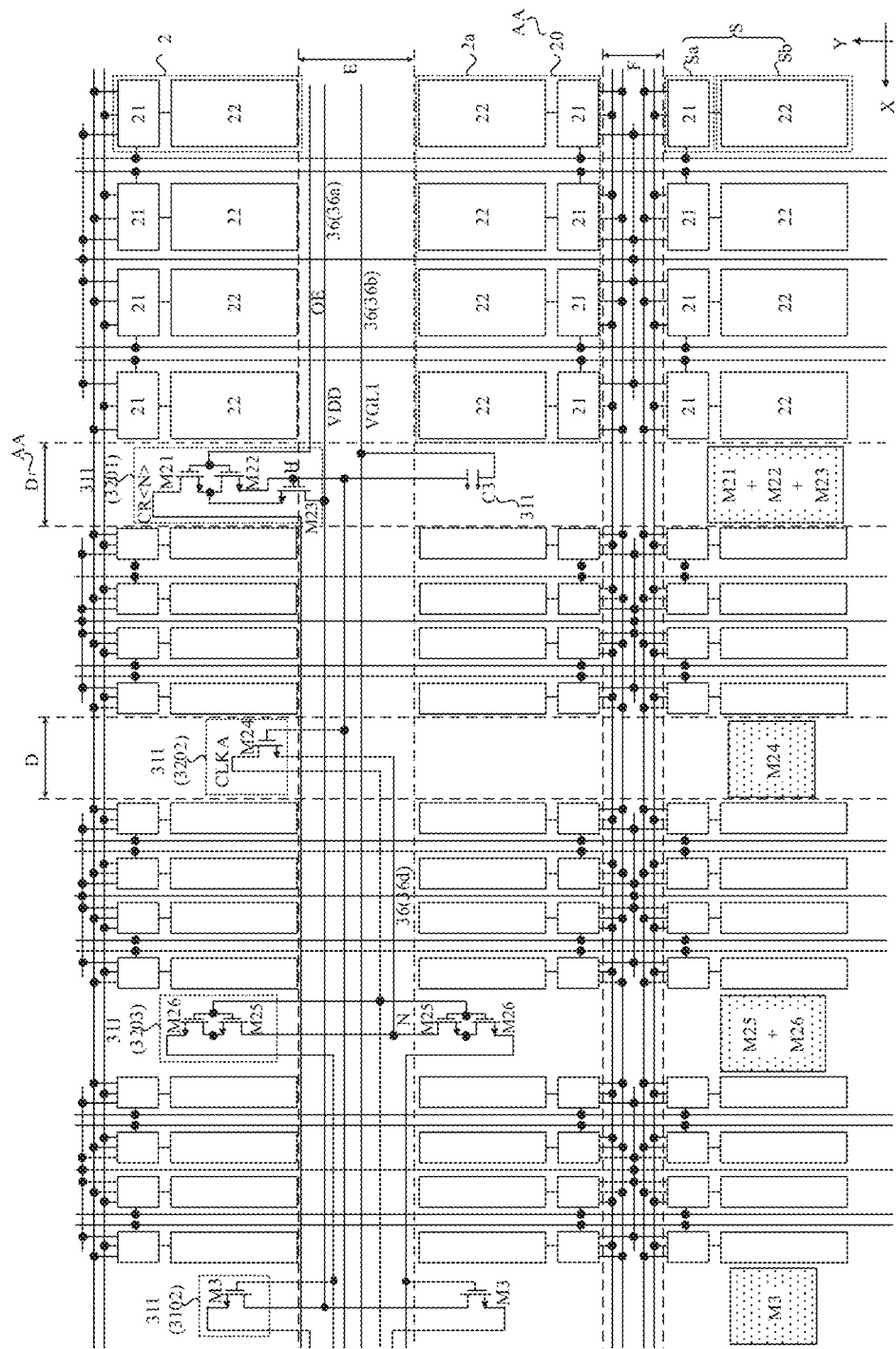
FIGS. 9a to 9h are an overall structural diagram of sub-pixels and a gate drive circuit, in accordance with some embodiments of the present disclosure.
Figure 9B:
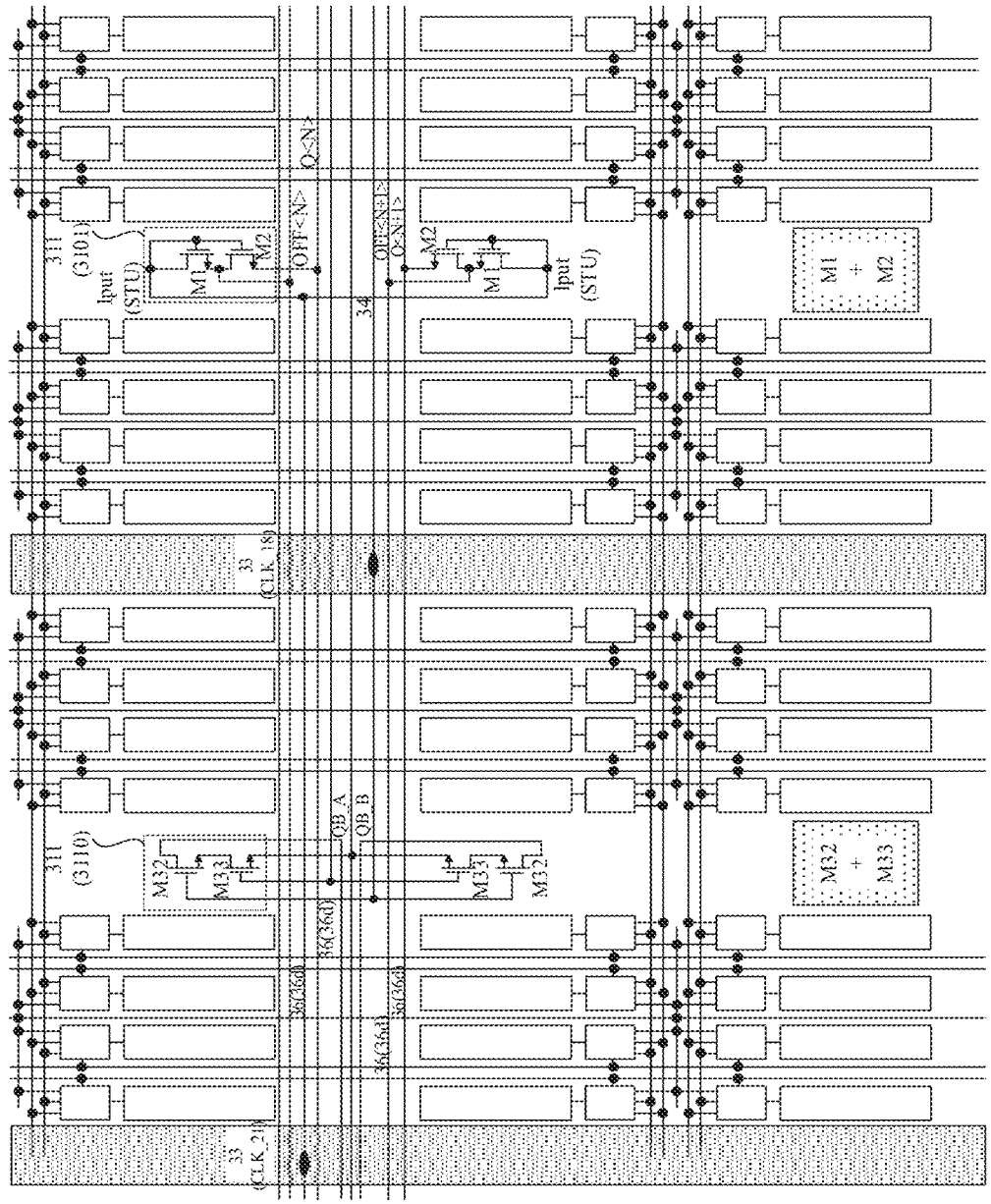

For example, as shown in FIG. 9b, a device group 311 may include the first transistor M1 and the second transistor M2 in the first input circuit 3101.

For example, as shown in FIG. 9a, a device group 311 may include the third transistor M3 in the leakage prevention circuit 3102.

Figure 9C:
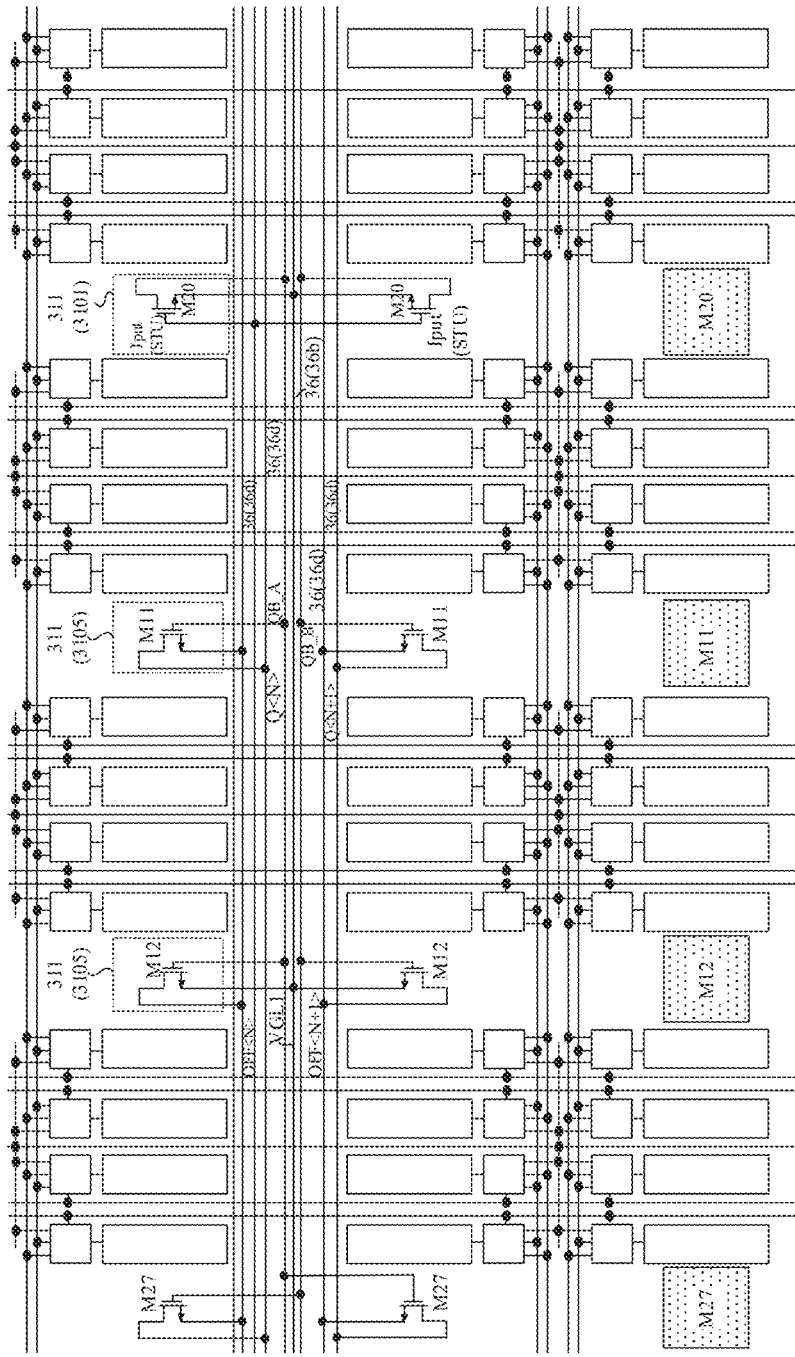
Figure 9D:
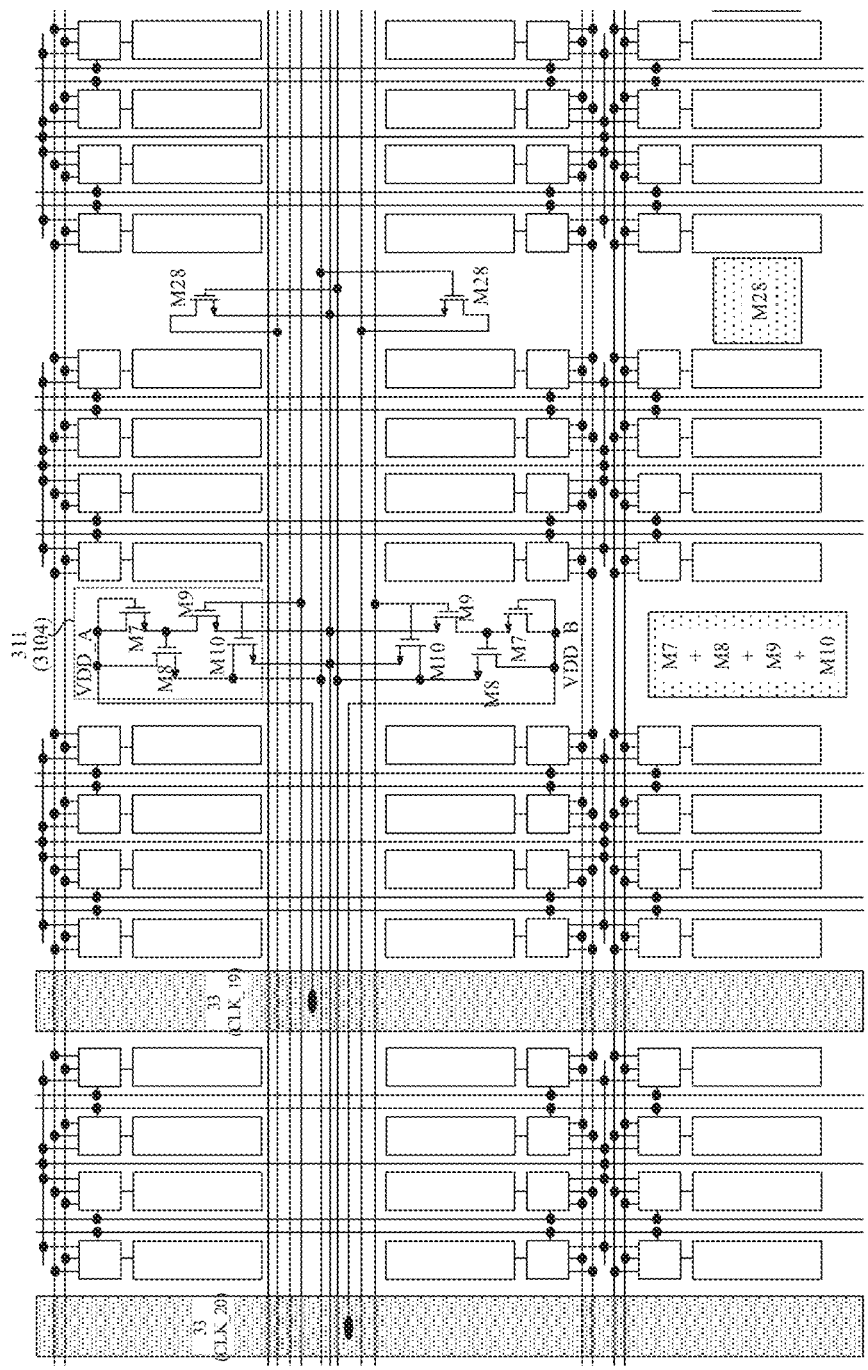
Figure 9E:
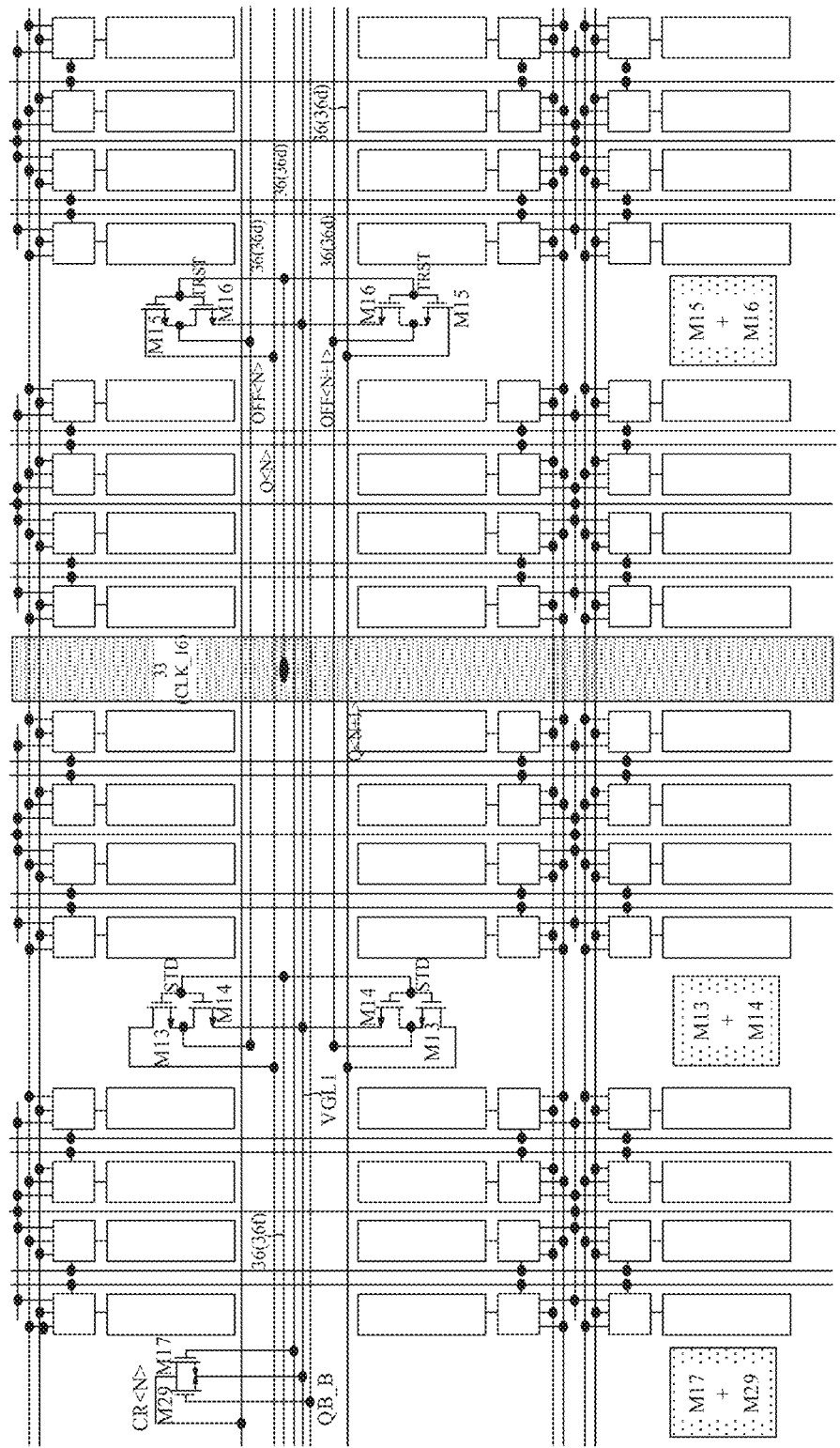
Figure 9F:
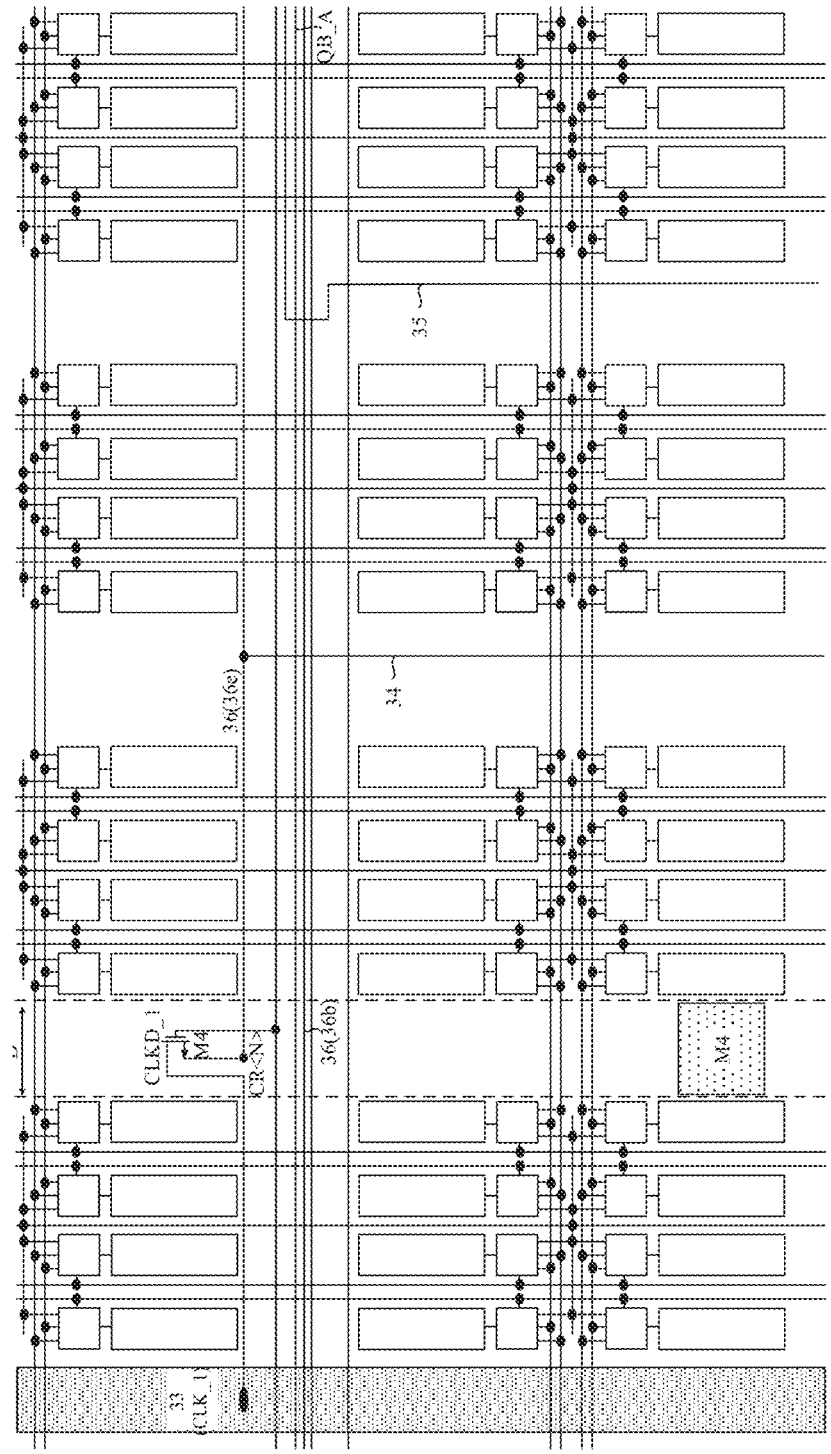
Figure 9G:
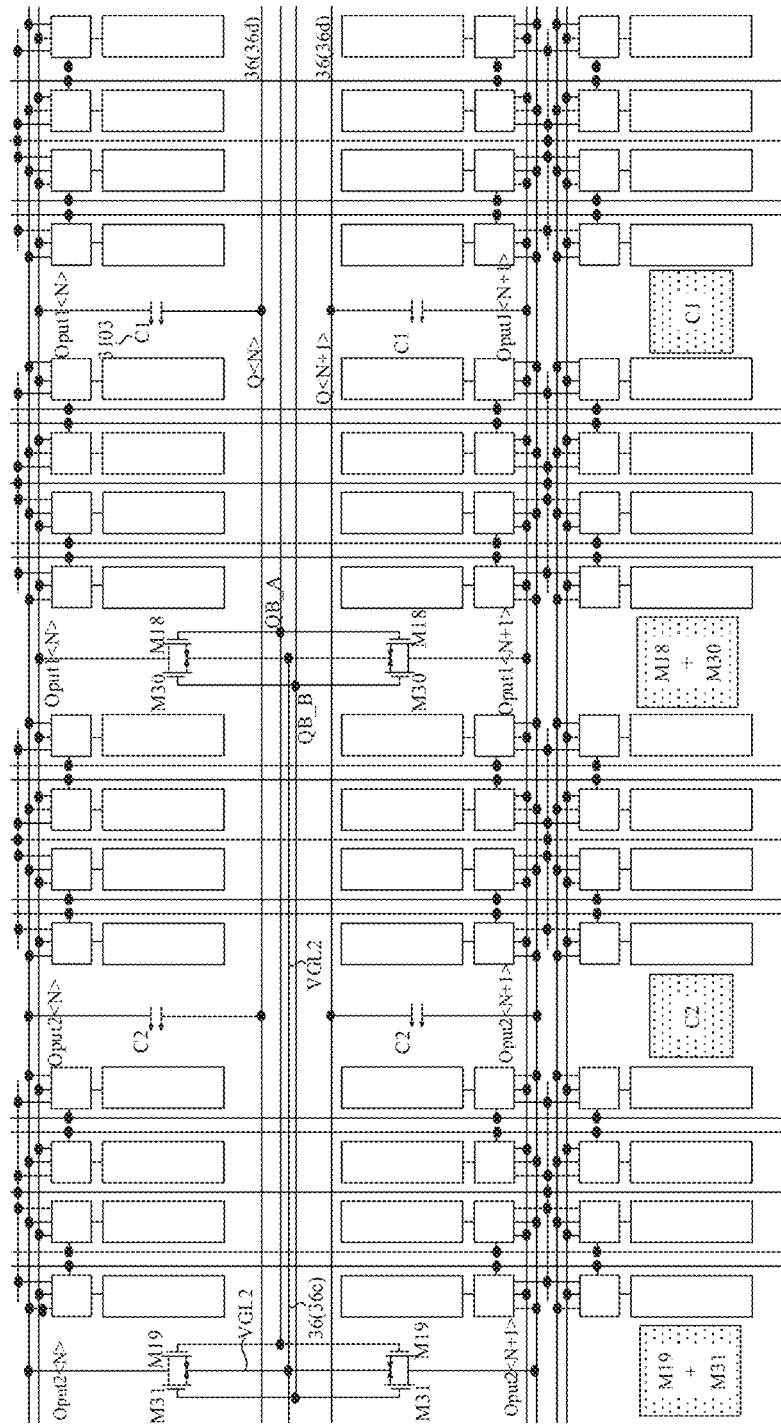

For example, as shown in FIG. 9g, a device group 311 may include the first capacitor C1 in the output circuit 3103.

For example, as shown in FIG. 9d, a device group 311 may include the seventh transistor M the eighth transistor M8, the ninth transistor M9, and the tenth transistor M10 in the control circuit 3104.

For example, as shown in FIG. 9c, a device group 311 may include the eleventh transistor M11 in the first reset circuit 3105; and another device group 311 may include the twelfth transistor M12 in the first reset circuit 3105.

It will be noted that the circuit diagrams of the shift registers 31 as shown in FIGS. 9a to 9h are equivalent circuit diagrams of the shift registers 31 in an actual product. In the actual product, some circuits each include transistors that are connected in parallel, and only one transistor in the transistors that are connected in parallel is shown in the circuit diagrams of the shift registers 31 shown in FIGS. 9a to 9h.

For example, one first transistor M1 and one second transistor M2 included in the first input circuit 3101 are shown in FIG. 9b. In the actual product, the first input circuit 3101 may include a plurality of first transistors M1 that are connected in parallel and a plurality of second transistors M2 that are connected in parallel. Each first transistor M1 and a second transistor M2 may constitute a device group 311, which is disposed in a region between two adjacent sub-pixels 2 in a corresponding row of sub-pixels 2.

Figure 9H:
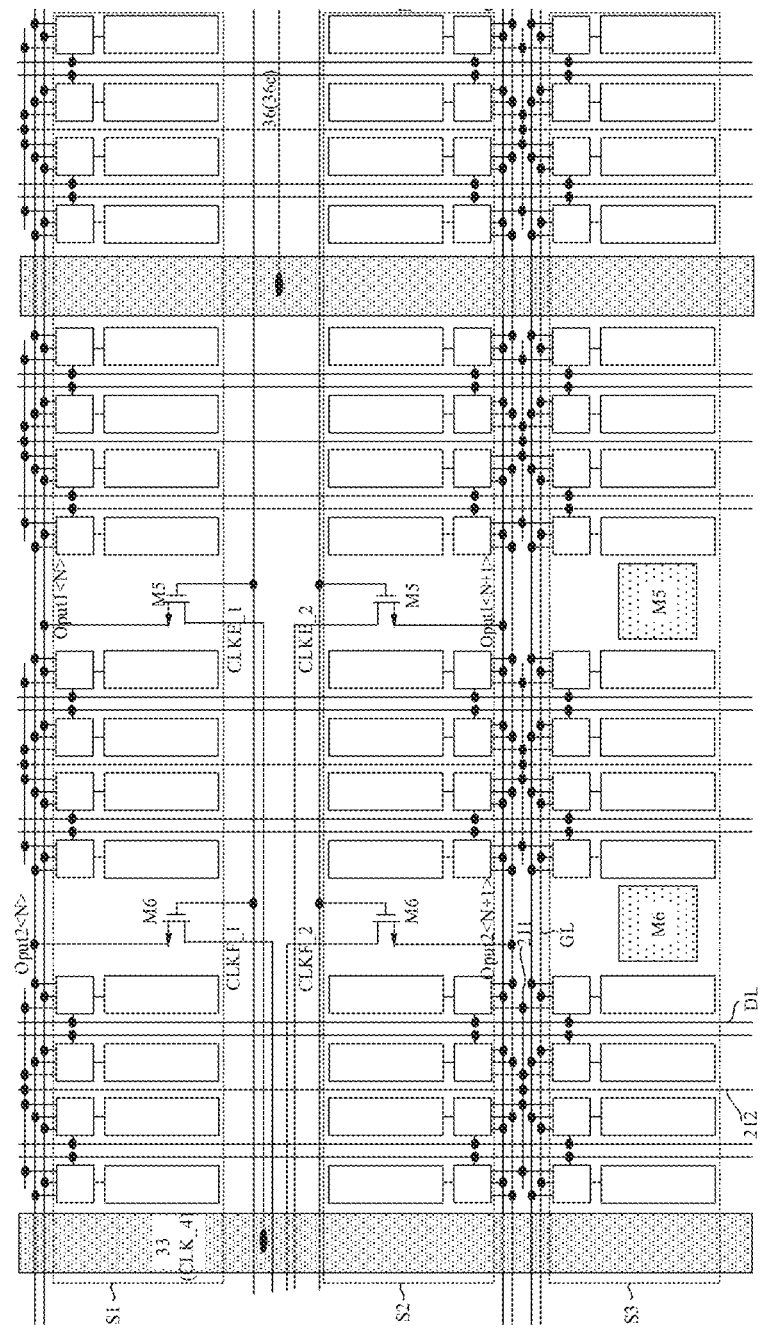

As another example, one fifth transistor M5 included in the output circuit 3103 is shown in FIG. 9h. In the actual product, the output circuit 3103 may include a plurality of fifth transistors M5 connected in parallel. Each fifth transistor M5 may constitute a device group 311, which is disposed in a region between two adjacent sub-pixels 2 in a corresponding row of sub-pixels 2.

For example, a device group 311 being located in a region between two adjacent sub-pixels 2 in a corresponding row of sub-pixels 2 means that at least part of the plurality of device groups 311 included in the shift register 31 may be located in regions between two adjacent sub-pixels 2 in the corresponding row of sub-pixels 2.

For example, as shown in FIGS. 9a to 9h, a way of arranging a device group 311 in a region between two adjacent sub-pixels 2 in a corresponding row of sub-pixels 2 may be that, in a case where the device group 311 is arranged in the region between the two adjacent sub-pixels 2 in the row of sub-pixels 2, only the device group 311 is disposed in the region. That is, the plurality of device groups 311 included in the shift register 31 are located in different regions, and at least one sub-pixel 2 is disposed between two adjacent device groups 311. "The corresponding row of sub-pixels 2" refers to a row of sub-pixels 2 electrically connected to the shift register 31, and the output signal output by the shift register 31 may be transmitted to the row of sub-pixels 2.

For example, the number of regions located between two adjacent sub-pixels 2 in a row of sub-pixels 2 may be greater than the number of device groups 311 included in the shift register 31. In this way, the device groups 311 included in the shift register 31 may be located only in part of the regions of a corresponding row of sub-pixels 2, and no device group 311 is provided in other regions.

By arranging at least part of the plurality of device groups 311 included in the shift register 31 in regions between the two adjacent sub-pixels 2 in the corresponding row of sub-pixels 2, space occupancy of a portion of the gate drive circuit 3 located in the bezel region may be effectively reduced. As a result, it is beneficial for the display panel 100 to realize a narrow bezel design or even a bezel-less design.

For example, as shown in FIGS. 9a to 9h, a division manner of the plurality of device groups 311 included in each of different shift registers 31 may be the same, and an arrangement order of the plurality of device groups 311 included in each of different shift registers 31 and arrangement positions, in a corresponding row of sub-pixels 2, of the plurality of device groups included in each of different shift registers 31 may be the same. That is, among device groups 311 included in different shift registers 31, device groups 311 with the same structure may be located in a same region between two adjacent columns of sub-pixels 2.

For example, as shown in FIG. 9a, in different shift registers 31, device groups 311 each including the third transistor M3 may be located in the same region between two adjacent columns of sub-pixels 2. As another example, as shown in FIG. 9c, in different shift registers 31, device groups 311 each including the eleventh transistor M11 may be located in the same region between two adjacent columns of sub-pixels 2.

This is beneficial to reduce a difficulty of layout design of the display panel 100 and improve a regularity of the layout of the display panel 100.

Of course, a division manner of the plurality of device groups 311 included in each of different shift registers 31 may be different, and an arrangement order of the plurality of device groups 311 included in each of different shift registers 31 and arrangement positions, in a corresponding row of sub-pixels 2, of the plurality of device groups 311 included in each of different shift registers 31 may also be different, which may be selectively set according to actual needs.

Figure 10:
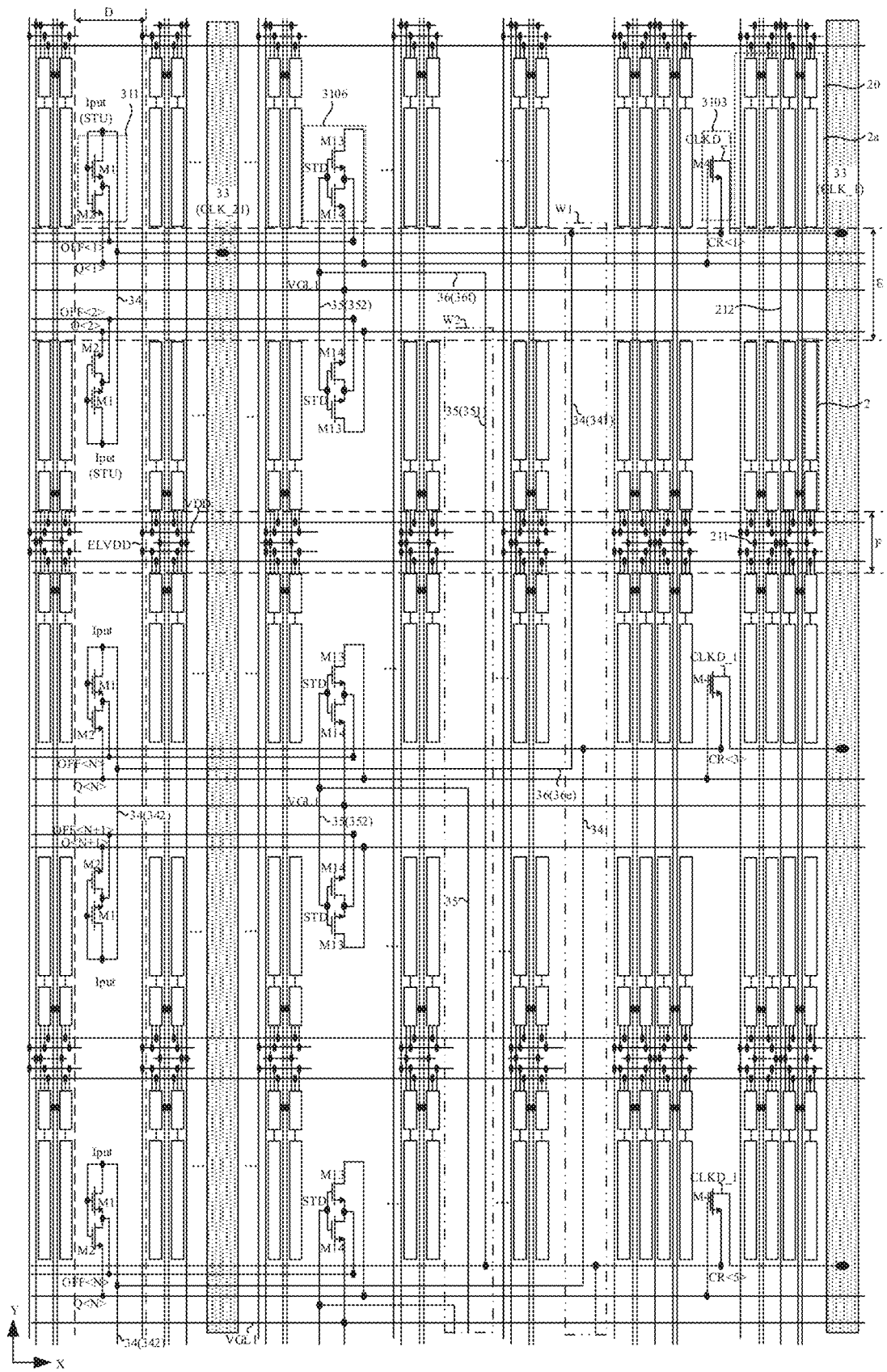
FIG. 10 is another structural diagram of sub-pixels and a gate drive circuit, in accordance with some embodiments of the present disclosure.
Figure 11:
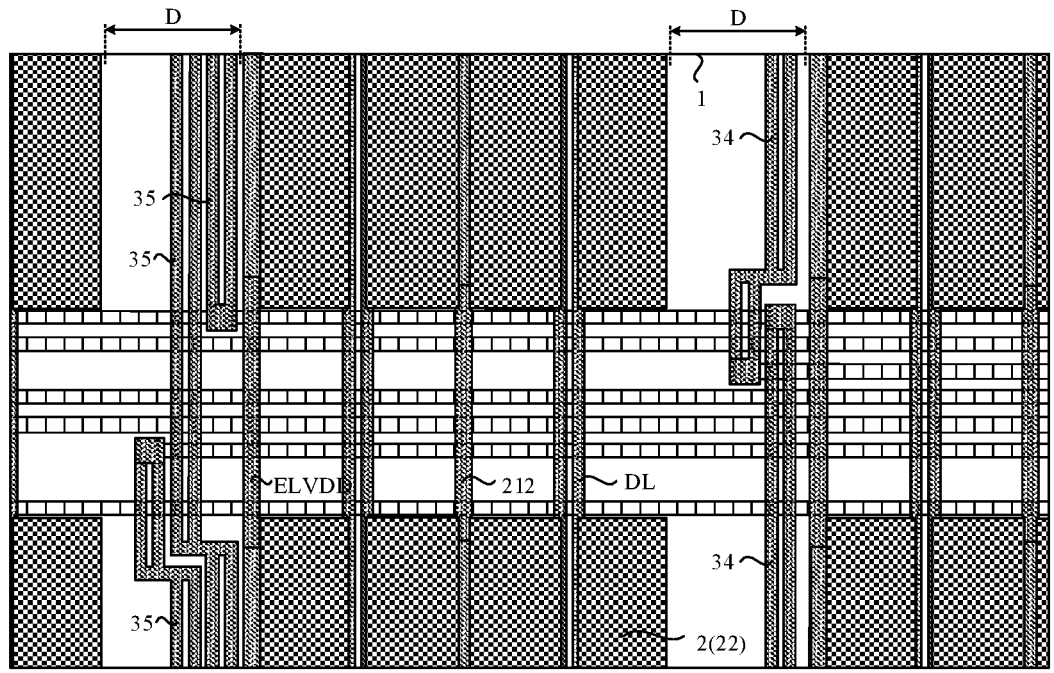
FIG. 11 is a partial enlarged view of sub-pixels and a gate drive circuit, in accordance with some embodiments of the present disclosure.
Figure 12:
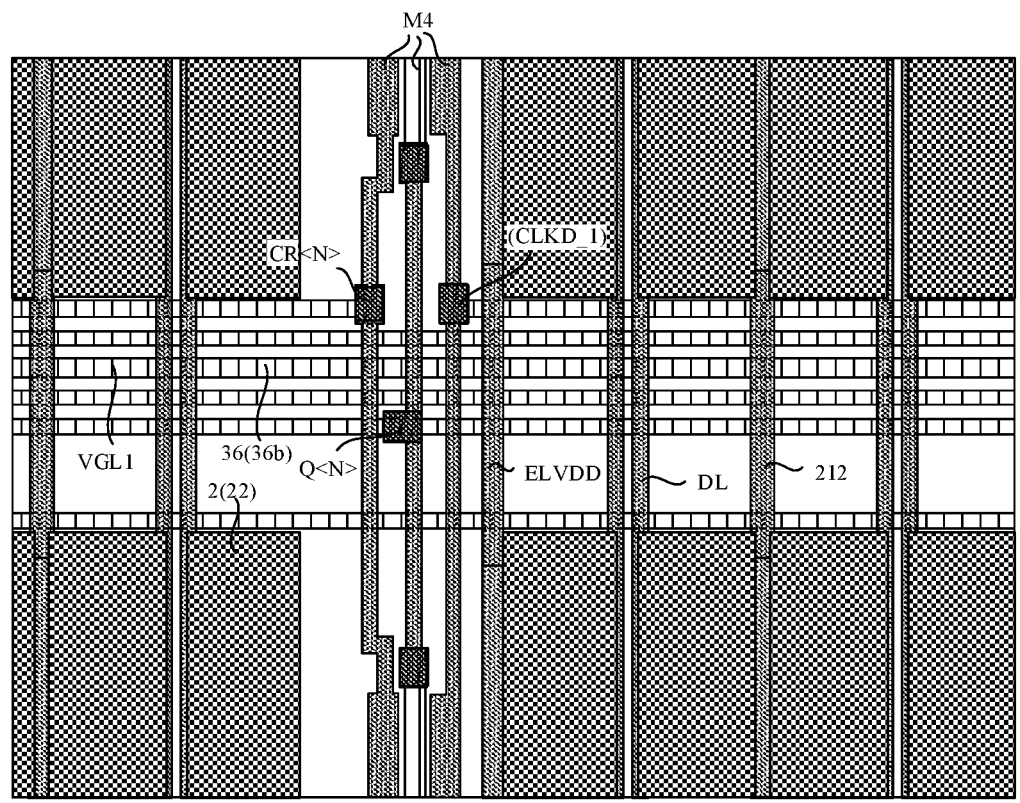
FIG. 12 is another partial enlarged view of sub-pixels and a gate drive circuit, in accordance with some embodiments of the present disclosure.

In some examples, as shown in FIGS. 3, 9f, and 10, after the plurality of shift registers 31 are cascaded to constitute the gate drive circuit 3, the gate drive circuit 3 further includes a plurality of cascade input signal lines 34 and a plurality of cascade display reset signal lines 35. Each cascade input signal line 34 is configured to connect the shift signal terminal CR<N> of one shift register 31 and the input signal terminal Iput of another shift register 31. Each cascade display reset signal line 35 is configured to connect the shift signal terminal CR<N> of one shift register 31 and the display reset signal terminal STD of another shift register 31.

For example, a cascade relationship of the gate drive circuit 3 as shown in FIGS. 3, 9f, and 10 is taken as an example.

That is, the shift signal terminal CR<N> of the N-th shift register 31 in odd shift registers except the last odd-numbered shift register 31 may be electrically connected to the input signal terminal Iput of the (N+2)-th shift register 31 through cascade input signal line(s) 34, and electrically connected to the input signal terminal Iput of the (N+3)-th shift register 31 through the cascade input signal line(s) 34.

For example, referring to FIGS. 5 to 8 and 10, an output circuit 3103 in the N-th shift register 31 may be electrically connected to a first input circuit 3101 and a fifth reset circuit 3109 in the (N+2)-th shift register 31 through cascade input signal lines 34, and electrically connected to a first input circuit 3101 and a fifth reset circuit 3109 in the (N+3)-th shift register 31 through the cascade input signal lines 34.

In this way, the shift signal output by the shift signal terminal CR<N> of the output circuit 3103 in the Nth shift register 31 may be transmitted to the first input circuit 3101 and the fifth reset circuit 3109 in the (N+2)-th shift register 31 through respective cascade input signal lines 34 as the input signal of the first input circuit 3101 and the fifth reset circuit 3109, and may be transmitted to the first input circuit 3101 and the fifth reset circuit 3109 in the (N+3)-th shift register 31 at the same time through the respective cascade input signal line 34 as the input signal of the first input circuit 3101 and the fifth reset circuit 3109.

In other shift registers 31 except the last four shift registers 31, the shift signal terminal CR<N+4> of the (N+4)-th shift register 31 may be electrically connected to the display reset signal terminal STD of the Nth shift register 31 through a cascade display reset signal line 35, and electrically connected to the display reset signal terminal STD of the (N+1)-th shift register 31 through the cascade display reset signal line 35.

For example, as shown in FIG. 10, the shift signal terminal CR<N+4> of the output circuit 3103 in the (N+4)-th shift register 31 may be electrically connected to a second reset circuit 3106 in the Nth shift register 31 through a cascade display reset signal line 35, and electrically connected to a second reset circuit 3106 in the (N+1)-th shift register 31 through the cascade display reset signal line 35.

In this way, the shift signal output by the shift signal terminal CR<N+4> of the output circuit 3103 in the (N+4)-th shift register 31 may be transmitted to the second reset circuit 3106 in the Nth shift register 31 through a corresponding cascade display reset signal line 35 as the display reset signal of the second reset circuit 3106, and may be transmitted to the second reset circuit 3106 in the (N+1)-th shift register 31 at the same time through the corresponding cascade display reset signal line 35 as the display reset signal of the second reset circuit 3106.

In some examples, as shown in FIG. 3, the display panel 100 has a display region AA, As shown in FIG. 9a, the display region AA includes a plurality of pixel regions 20 that are arranged in an array and a plurality of first gap regions D. Each pixel region 20 corresponds to at least one first gap region D, and at least one first gap region D is disposed between two adjacent pixel regions 20. Each pixel region A1 is provided with at least one sub-pixel 2 therein.

In some examples, as shown in FIG. 9a, the display panel 100 has a plurality of sub-pixel regions S. Each pixel region 20 includes at least one sub-pixel region S. The plurality of sub-pixel regions S are used for arranging the plurality of sub-pixels 2 included in the display panel 100. For example, the plurality of sub-pixel regions S and the plurality of sub-pixels 2 may be arranged in a one-to-one correspondence.

In some examples, as shown in FIG. 9a, the first gap region D is located between two adjacent columns of sub-pixel regions S. In the plurality of columns of sub-pixels 2 included in the display panel 100, the number of sub-pixels 2 included in each of different columns of sub-pixels 2 may be different, and therefore, dimensions of different first gap regions D in the second direction Y may be different.

For example, two adjacent columns of sub-pixel regions S may refer to any two adjacent columns of sub-pixel regions S in the plurality of columns of sub-pixel regions S of the display panel 100, and may also refer to two adjacent columns of sub-pixel regions S in part of the plurality of columns of sub-pixel regions S of the display panel 100.

For example, as shown in FIG. 9a, the plurality of sub-pixels 2 included in the display panel 100 are divided into a plurality of pixel units 2a. Each pixel region 20 is provided with a pixel unit 2a therein. The pixel unit 2a may include at least three sub-pixels 2 arranged in sequence in the first direction X.

For example, the pixel unit 2a may include three or four sub-pixels 2 arranged in sequence in the first direction X. In a case where the pixel unit 2a includes three sub-pixels 2 arranged in sequence in the first direction X, the three sub-pixels 2 may include a red sub-pixel, a green sub-pixel, and a blue sub-pixel. In a case where the pixel unit 2a includes four sub-pixels 2 arranged in sequence in the first direction X, the four sub-pixels 2 may include the red sub-pixel, the green sub-pixel, the blue sub-pixel, and a white sub-pixel.

For example, as shown in FIG. 9a, after the plurality of sub-pixels 2 are divided into the plurality of pixel units 2a, the plurality of pixel units 2a may be arranged in a plurality of rows and a plurality of columns. Pixel units 2a in a row are arranged in the first direction X and pixel units 2a in a column are arranged in the second direction Y.

In this case, the first gap region D may be a region between any two adjacent columns of pixel units 2a. That is, the first gap region D may be a region between two adjacent columns of sub-pixel regions S in part of the plurality of columns of sub-pixel regions S.

Based on this, in the plurality of device groups 311 included in the same shift register 31, at least one pixel unit 2a may be disposed between two adjacent device groups 311.

By dividing the plurality of sub-pixels 2 into the plurality of pixel units 2a, and setting the region between any two adjacent columns of pixel units 2a as the first gap region D, it is beneficial to reduce space occupancy of the first gap region D and increase pixels per inch (PPI) of the display panel 100.

In some examples, as shown in FIGS. 3, 9f, 10, and 11, the cascade display reset signal lines 35 and the cascade input signal lines 34 are all disposed in the first gap regions D, and they are disposed in different first gap regions D. That is, first gap regions D where the cascade display reset signal lines 35 are located are different from first gap regions D where the cascade input signal lines 34 are located, and they do not overlap with each other.

For example, no device group 311 is arranged in the first gap regions D where the cascade display reset signal lines 35 or the cascade input signal lines 34 are disposed.

It will be noted that, in the related art, since the gate drive circuit 3 includes the plurality of shift registers 31, there will be a large number of cascade display reset signal lines 35 and cascade input signal lines 34 in the gate drive circuit 3 after the plurality of shift registers 31 are cascaded. If the cascade display reset signal lines 35 and the cascade input signal lines 34 are arranged in same first gap region(s) D, a dimension of the first gap region D in the first direction X will be relatively large, which reduces space occupancy of the sub-pixels 2 and may easily cause the PPI of the display panel 100 to decrease.

In the embodiments of the present disclosure, by arranging the cascade display reset signal lines 35 and the cascade input signal lines 34 in different first gap regions D, the dimension of each first gap region D in the first direction X may be relatively small, the space occupancy of the first gap region D may be reduced, and the space occupancy of the sub-pixels 2 may increase. As a result, the PPI of the display panel 100 may be effectively improved. It has been verified that compared to a case where the cascade display reset signal lines 35 and the cascade input signal lines 34 are disposed in the same first gap region(s) D, the cascade display reset signal lines 35 and the cascade input signal lines 34 are arranged in different first gap regions D, which may increase the PPI by approximately one time.

Therefore, in the display panel 100 provided in the embodiments of the present disclosure, by dividing each shift register 31 into the plurality of device groups 311, and arranging the plurality of device groups 311 in regions each between two adjacent sub-pixels 2 in the corresponding row of sub-pixels 2, it is possible to effectively use the regions between two adjacent sub-pixels 2 and reduce the space occupancy of the portion of the gate drive circuit 3 in the bezel region, so that the display panel 100 may realize the narrow bezel design or even the bezel-less design.

Moreover, in the embodiments of the present disclosure, by arranging the cascade display reset signal lines 35 and the cascade input signal lines 34 in the gate drive circuit 3 in different first gap regions D, it may be possible to further reduce the space occupancy of the portion of the gate drive circuit 3 in the bezel region, and reduce the dimension of the first gap region D in the first direction X. As a result, the space occupancy of the sub-pixels 2 increases, and the PPI of the display panel 100 is effectively improved.

In some embodiments, as shown in FIGS. 9b, 9d, 9e, 9f, 9h, and 10, at least one of the plurality of control signal lines 33 included in the gate drive circuit 3 is located in first gap region(s) D.

That is, part of the plurality of control signal lines 33 may be located in the first gap region(s) D. Alternatively, the plurality of control signal lines 33 may all be located in first gap regions D.

In this way, a portion of or even the whole gate drive circuit 3 may be disposed in regions between the plurality of sub-pixels 2 included in the display panel 100, which reduces the space occupancy of the portion of the gate drive circuit 3 in the bezel region, so that the display panel 100 may realize the narrow bezel design or even the bezel-less design.

In some examples, as shown in FIGS. 9b, 9d, 9e, 9f, 9h, and 10, in a case where the plurality of control signal lines 33 are disposed in the first gap regions D, any control signal line 33 may be disposed in one first gap region D, and at least one column of sub-pixels 2 is disposed between two adjacent control signal lines 33.

Since a dimension of the control signal line 33 in the first direction X is relatively large, by arranging only one control signal line 33 in one first gap region D, it may be possible to avoid an increase in the dimension of the first gap region D in the first direction X, thereby avoiding an influence on the PPI of the display panel 100.

It will be noted that, in the first gap regions D where the control signal lines 33 are disposed, the device group 311, the cascade input signal line 34, and the cascade display reset signal line 35 are not disposed. This may avoid an increase in the dimension of the first gap region D in the first direction X, thereby avoiding the influence on the PPI of the display panel 100.

Here, in a case where the plurality of sub-pixels 2 are divided into the plurality of pixel units 2a, and the first gap region D is the region between any two adjacent columns of pixel units 2a, at least one column of pixel units 2a may be disposed between two control signal lines 33.

In some examples, the plurality of control signal lines 33 may be made of the same material and arranged in the same layer as the plurality of data lines DL.

It will be noted that the "same layer" mentioned herein refers to a layer structure formed by forming a film for forming specific patterns through the same film-forming process and then performing a single patterning process by using the same mask. Depending on the specific patterns, the single patterning process may include multiple exposure, development or etching processes, the specific patterns in the formed layer structure may be continuous or discontinuous, and these specific patterns may also be at different heights or have different thicknesses. In this way, the plurality of control signal lines 33 and the plurality of data lines DL may be manufactured simultaneously in a single patterning process, which is beneficial to simplifying a manufacturing process of the display panel 100.

For example, a material of the data lines DL may be a metal material. The metal material is, for example, molybdenum, titanium, copper, silver, or aluminum. A structure of the data line DL may be a single-layer structure or a laminated structure.

An arrangement of the cascade input signal lines 34 and an arrangement of the cascade display reset signal lines 35 may be various, which may be selectively set according to actual needs.

In some embodiments, the plurality of cascade input signal lines 34 may be divided into a plurality of groups W1 (only one group W1 is shown in FIG. 10), and each group W1 of cascade input signal lines 34 may include at least one cascade input signal line 34.

For example, each group of cascade input signal lines 34 may include a single cascade input signal line 34 or cascade input signal lines 34.

Here, a manner of grouping the plurality of cascade input signal lines 34 may be selectively set according to actual needs. For example, cascade input signal lines 34 located in the same first gap region D partially overlap with each other in the first direction X, and then the cascade input signal lines 34 that partially overlap with each other may be divided into a group.

For example, two cascade input signal lines 34 located in the same first gap region D partially overlap with each other in the first direction X, and then the two cascade input signal lines 34 may be divided into one group.

As another example, as shown in FIG. 10, as for three cascade input signal lines 34 located in the same first gap region D, in the second direction Y, first two cascade input signal lines 34 partially overlap with each other in the first direction X, last two cascade input signal lines 34 partially overlap with each other in the first direction X, and then the three cascade input signal lines 34 may be divided into one group W1.

In some examples, referring to FIG. 10, at least one group of cascade input signal lines 34 is disposed in a first gap region D. That is, the plurality of groups of cascade input signal lines 34 may be disposed in first gap regions D, and one group of cascade input signal lines 34 may be disposed in a first gap region D, or two groups of cascade input signal lines 34 may be disposed in the first gap region D. Alternatively, all cascade input signal lines 34 may be disposed in the first gap region D.

In some examples, referring to FIG. 10, at least one column of sub-pixels 2 is disposed between two adjacent groups of cascade input signal lines 34 located in different first gap regions D. That is, there may be no first gap region D between the two adjacent groups of cascade input signal lines 34, or there may be at least one first gap region D between the two adjacent groups of cascade input signal lines 34.

This means that the plurality of groups of cascade input signal lines 34 may be disposed in first gap regions D. In this way, it is beneficial to further reduce the dimension of the first gap region D in the first direction X and improve the PR of the display panel 100.

For example, in a case where in the first gap regions D provided with the cascade input signal lines 34 therein, each first gap region D is provided with groups of cascade input signal lines 34 therein, the two adjacent groups of cascade input signal lines 34 may refer to any group of cascade input signal lines 34 in one first gap region D and any group of cascade input signal lines 34 in another first gap region D, and the two first gap regions D where the two groups of cascade input signal lines 34 are respectively located are adjacent, or at least one first gap region D is disposed between the two first gap regions D where the two groups of cascade input signal lines 34 are respectively located and no cascade input signal line 34 is disposed in the at least one first gap region D.

For example, in the first direction X, the two adjacent groups of cascade input signal lines 34 may partially overlap or may not overlap with each other.

Here, in the case where the plurality of sub-pixels 2 are divided into the plurality of pixel units 2a, and the first gap region D is the region between any two adjacent columns of pixel units 2a, at least one column of pixel units 2a is disposed between the two adjacent groups of cascade input signal lines 34.

In some examples, groups of cascade input signal lines 34 are disposed in the first gap region D, and at least one row of sub-pixels is disposed between two adjacent groups of cascade input signal lines 34 located in the same first gap region D.

For example, one row, two rows, three rows or even more rows of sub-pixels 2 may be disposed between the two adjacent groups of cascade input signal lines 34. As the number of rows of sub-pixels disposed between the two adjacent groups of cascade input signal lines 34 increases, a difference in stage numbers of shift registers 31 corresponding to the two adjacent groups of cascade input signal lines 34 increases.

This means that, other groups of cascade input signal lines 34 that partially overlap with the two adjacent groups of cascade input signal lines 34 in the first direction X are located in other first gap regions D. The number of cascade input signal lines 34 located in the same first gap region D and partially overlapping in the first direction X is small. In this way, the dimension of the first gap region D in the first direction X may be effectively reduced, which is beneficial to improving the PPI of the display panel 100.

In some embodiments, the plurality of cascade display reset signal lines 35 may be divided into a plurality of groups W2 (only one group W2 is shown in FIG. 10), and each group W2 of cascade display reset signal lines 35 includes at least one cascade display reset signal line 35.

For example, each group of cascade display reset signal lines 35 may include one cascade display reset signal line 35, or may include cascade display reset signal lines 35.

In the embodiments, for a manner of grouping the plurality of cascade display reset signal lines 35, reference may be made to the manner of grouping the plurality of cascade input signal lines 34 in the above embodiments, which will not be repeated here.

In some examples, referring to FIG. 10, at least one group of cascade display reset signal lines 35 may be disposed in a first gap region D. That is, the plurality of groups of cascade display reset signal lines 35 may be disposed in first gap regions D, and one group of cascade display reset signal lines 35 may be disposed in a first gap region D, or two groups of cascade display reset signal lines 35 may be disposed in the first gap region D. Alternatively, all cascade display reset signal lines 35 may be disposed in the first gap region D.

In some examples, referring to FIG. 10, at least one column of sub-pixels 2 is disposed between two adjacent groups of cascade display reset signal lines 35 located in different first gap regions D. That is, there may be no first gap region D between the two adjacent groups of cascade display reset signal lines 35, or there may be at least one first gap region D between the two adjacent groups of cascade display reset signal lines 35.

This means that the plurality of groups of cascade display reset signal lines 35 may be disposed in the first gap regions D. In this way, it is beneficial to further reduce the dimension of the first gap region D in the first direction X and improve the PPI of the display panel 100.

For example, in a case where in the first gap regions D provided with the cascade display reset signal lines 35 therein, each first gap region D is provided with groups of cascade display reset signal lines 35 therein, the two adjacent groups of cascade display reset signal lines 35 may refer to any group of cascade display reset signal lines 35 in one first gap region D and any group of cascade display reset signal lines 35 in another first gap region D, and the two first gap regions D where the two groups of cascade display reset signal lines 35 are respectively located are adjacent, or at least one first gap region D is disposed between the two first gap regions D where the two groups of cascade display reset signal lines 35 are respectively located and no cascade display reset signal lines 35 is disposed in the at least one first gap region D.

For example, in the first direction X, the two adjacent groups of cascade display reset signal lines 35 may partially overlap or may not overlap with each other.

Here, in the case where the plurality of sub-pixels 2 are divided into the plurality of pixel units 2a, and the first gap region D is the region between any two adjacent columns of pixel units 2a, at least one column of pixel units 2a is disposed between the two adjacent groups of cascade display reset signal lines 35.

In some examples, groups of cascade display reset signal lines 35 are disposed in the first gap region D, and at least one row of sub-pixels 2 is disposed between two adjacent groups of cascade display reset signal lines 35 located in the same first gap region D.

For example, one row, two rows, three rows or even more rows of sub-pixels 2 may be disposed between the two adjacent groups of cascade display reset signal lines 35. As the number of rows of sub-pixels disposed between the two adjacent groups of cascade display reset signal lines 35 increases, a difference in stage numbers of shift registers 31 corresponding to the two adjacent groups of cascade display reset signal lines 35 increases.

This means that, other groups of cascade display reset signal lines 35 that partially overlap with the two adjacent groups of cascade display reset signal lines 35 in the first direction X are located in other first gap regions D. The number of cascade display reset signal lines 35 located in the same first gap region D and partially overlapping in the first direction X is small. In this way, the dimension of the first gap region D in the first direction X may be effectively reduced, which is beneficial to improving the PPI of the display panel 100.

In some embodiments, the plurality of cascade input signal lines 34 and the plurality of cascade display reset signal lines 35 may be made of the same material and arranged in the same layer as the plurality of data lines DL.

In this way, the plurality of cascade input signal lines 34, the plurality of cascade display reset signal lines 35, the plurality of control signal lines 33, and the plurality of data lines DL may be manufactured simultaneously in the single patterning process, which is beneficial to simplifying the manufacturing process of the display panel 100.

In some embodiments, as shown in FIG. 9a, each sub-pixel region S may include a sub-pixel circuit region Sa and a sub-pixel light-emitting region Sb arranged in sequence in the second direction Y. The sub-pixel circuit region Sa is used to provide a pixel drive circuit 21 in a corresponding sub-pixel 2, and the sub-pixel light-emitting region Sb is used to provide a light-emitting device 22 in the corresponding sub-pixel 2.

In some examples, as shown in FIGS. 9a to 9h, in the second direction Y, any three adjacent rows of sub-pixel regions S may be a first row of sub-pixel regions S1, a second row of sub-pixel regions S2, and a third row of sub-pixel regions S3.

For example, as shown in FIGS. 9a to 9h, a region between the first row of sub-pixel regions S1 and the second row of sub-pixel regions S2 is a second gap region E, and a region between the second row of sub-pixel regions S2 and the third row of sub-pixel regions S3 is a third gap region F.

As shown in FIGS. 9a to 9h, in the first row of sub-pixel regions S1 and the second row of sub-pixel regions S2, sub-pixel light-emitting regions Sb are all closer to the second gap region E than sub-pixel circuit regions Sa. For example, in the first row of sub-pixel regions S1 and the second row of sub-pixel regions S2, sub-pixel regions S are symmetrically arranged relative to the second gap region E, sub-pixel light-emitting regions Sb in the sub-pixel regions S are relatively close to the second gap region E, and sub-pixel circuit regions Sa in the sub-pixel regions S are relatively far away from the second gap region E.

As shown in FIGS. 9a to 9h, in the second row of sub-pixel regions S2 and the third row of sub-pixel regions S3, sub-pixel circuit regions Sa are all closer to the third clap region F than sub-pixel light-emitting regions Sb. For example, in the second row of sub-pixel regions S1 and the third row of sub-pixel regions S2, sub-pixel regions S are symmetrically arranged relative to the third gap region F, sub-pixel light-emitting regions Sb in the sub-pixel regions S are relatively far away from the third gap region F, and sub-pixel circuit regions Sa in the sub-pixel regions S are relatively close to the third gap region F.

It will be noted that this example only limits the positions of the sub-pixel circuit regions Sa and the sub-pixel light-emitting regions Sb in the sub-pixel regions S, and does not limit whether the structures of the pixel drive circuits 21 disposed in the sub-pixel circuit regions Sa and structures of the light-emitting devices 22 disposed in the sub-pixel light-emitting regions Sb are symmetrical. Since the pixel drive circuits 21 and the light-emitting devices 22 each include a plurality of film layers, in a process of manufacturing the plurality of film layers, inevitable reasons such as process errors may cause differences in sizes of the film layers included in different pixel drive circuits 21, or differences in the sizes of the film layers included in different light-emitting devices 22. As a result, pixel drive circuits 21 in the first row of sub-pixel regions S1 and pixel drive circuits 21 in the second row of sub-pixel regions S2 may not be strictly symmetrical relative to the second gap region E, light-emitting devices 22 in the first row of sub-pixel regions S1 and light-emitting devices 22 in the second row of sub-pixel regions S2 may not be strictly symmetrical relative to the second gap region E, the pixel drive circuits 21 in the second row of sub-pixel regions S2 and pixel drive circuits 21 in the third row of sub-pixel regions S2 may not be strictly symmetrical relative to the third gap region F, and the light-emitting devices 22 in the second row of sub-pixel regions S2 and light-emitting devices 22 in the third row of sub-pixel regions S2 may not be strictly symmetrical relative to the third gap region F.

In some embodiments, as shown in FIG. 10, the display panel 100 further includes a plurality of power supply voltage lines ELVDD extending along the second direction for transmitting the power supply voltage signal.

As shown in FIG. 10, the display panel 100 further includes a plurality of auxiliary power supply voltage lines VDD extending along the first direction X. Each power supply voltage line ELVDD is electrically connected to multiple auxiliary power supply voltage lines VDD.

Each row of pixel regions 20 corresponds to at least one auxiliary power supply voltage line VDD. Pixel drive circuits 21 in sub-pixels 2 in pixel regions 20 corresponding to any auxiliary power supply voltage line VDD are all electrically connected to the auxiliary power supply voltage line VDD. That is, the sub-pixels 2 in the pixel regions 20 corresponding to the auxiliary power supply voltage line VDD share the auxiliary power supply voltage line VDD.

It can be understood that, the auxiliary power supply voltage line VDD is electrically connected to the fourth voltage signal terminal Vdd of the pixel drive circuit 21. That is, the first electrode of the driving transistor T2 in the pixel drive circuit 21 is electrically connected to the auxiliary power supply voltage line VDD.

The power supply voltage signal is transmitted to the auxiliary power supply voltage line VDD electrically connected to the power supply voltage line ELVDD through the power supply voltage line ELVDD, and then the power supply voltage signal is transmitted to the pixel drive circuits 21 in the sub-pixels 2 in the corresponding pixel regions 20 through the auxiliary power supply voltage line VDD, so as to be used for driving light-emitting devices 22 electrically connected to the pixel drive circuit 21 to emit light by the pixel drive circuit 21.

In some embodiments, as shown in FIG. 10, each row of pixel regions 20 corresponds to auxiliary power supply voltage lines VDD. In the first direction X, two adjacent auxiliary power supply voltage lines VDD are separated by the first gap region D.

It will be noted that, in the related art, power supply voltage lines are designed in a grid. That is, the power supply voltage lines include horizontal power supply voltage lines extending along the first direction X, and vertical power supply voltage lines extending along the second direction Y. The vertical power supply voltage lines and the horizontal power supply voltage lines are electrically connected to each other to constitute the arid, which may reduce a voltage drop generated during the transmission of the power supply voltage signal by the power supply voltage line.

However, in the above embodiments of the present disclosure, in the first direction X, the two adjacent auxiliary power supply voltage lines VDD are separated by the first gap region D, which may prevent the auxiliary power supply voltage lines VDD from occupying a space of the first gap region D. As a result, the first gap region D may be used to arrange the signal line and the device group 311 of the gate drive circuit 3.

In some embodiments, as shown in FIG. 10, each column of pixel regions 20 corresponds to one power supply voltage line ELVDD, and the power supply voltage line ELVDD is located on a side of opposite sides of the column of pixel regions 20 in the first direction X. Each pixel region 20 corresponds to one auxiliary power supply voltage line VDD, and each auxiliary power supply voltage line VDD is electrically connected to the pixel drive circuits 21 in the sub-pixels 2 in the corresponding pixel region 20.

For example, as shown in FIG. 9a, four sub-pixels 2 are provided in each pixel region 20. Each auxiliary power supply voltage line VDD is electrically connected to the pixel drive circuits 21 in the four sub-pixels 2 in the corresponding pixel region 20.

In some embodiments, as shown in FIGS. 14c to 14e and 15, from the perspective of film layers, the display panel 100 includes an active layer 104, a gate insulating layer 105, a gate conductive layer 106, an interlayer dielectric layer 107 and a source-drain conductive layer 108 that are disposed on the substrate 1 in sequence. The active layer 104 includes first electrodes T21, channel portions T22 and second electrodes T23 of driving transistors T2. The source-drain conductive layer 108 includes a plurality of third connection patterns 108C. The auxiliary power supply voltage lines VDD are located in the gate conductive layer 106.

Figure 14A:
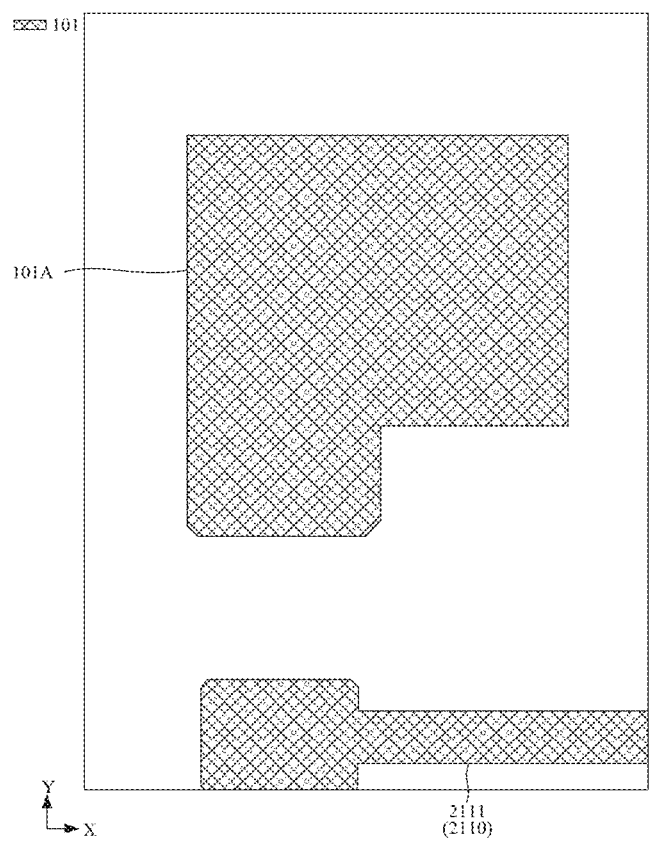
FIGS. 14a to 14e are top views of film layers at B in FIG. 13b.
Figure 14B:
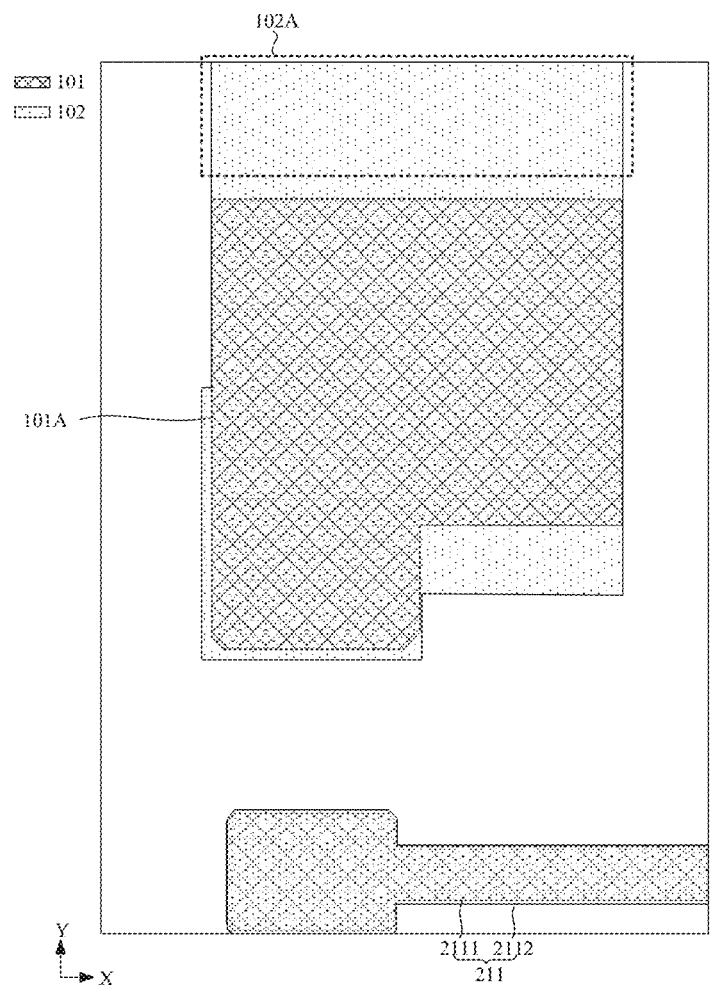
Figure 14C:
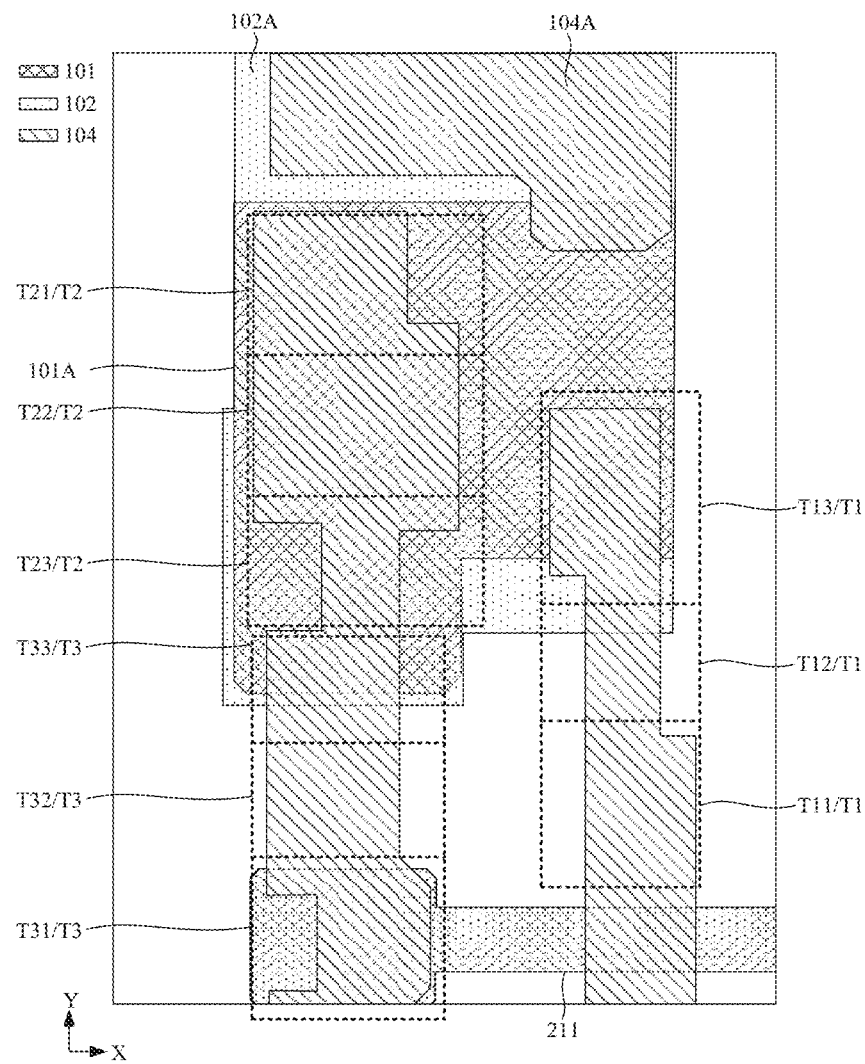
Figure 14D:
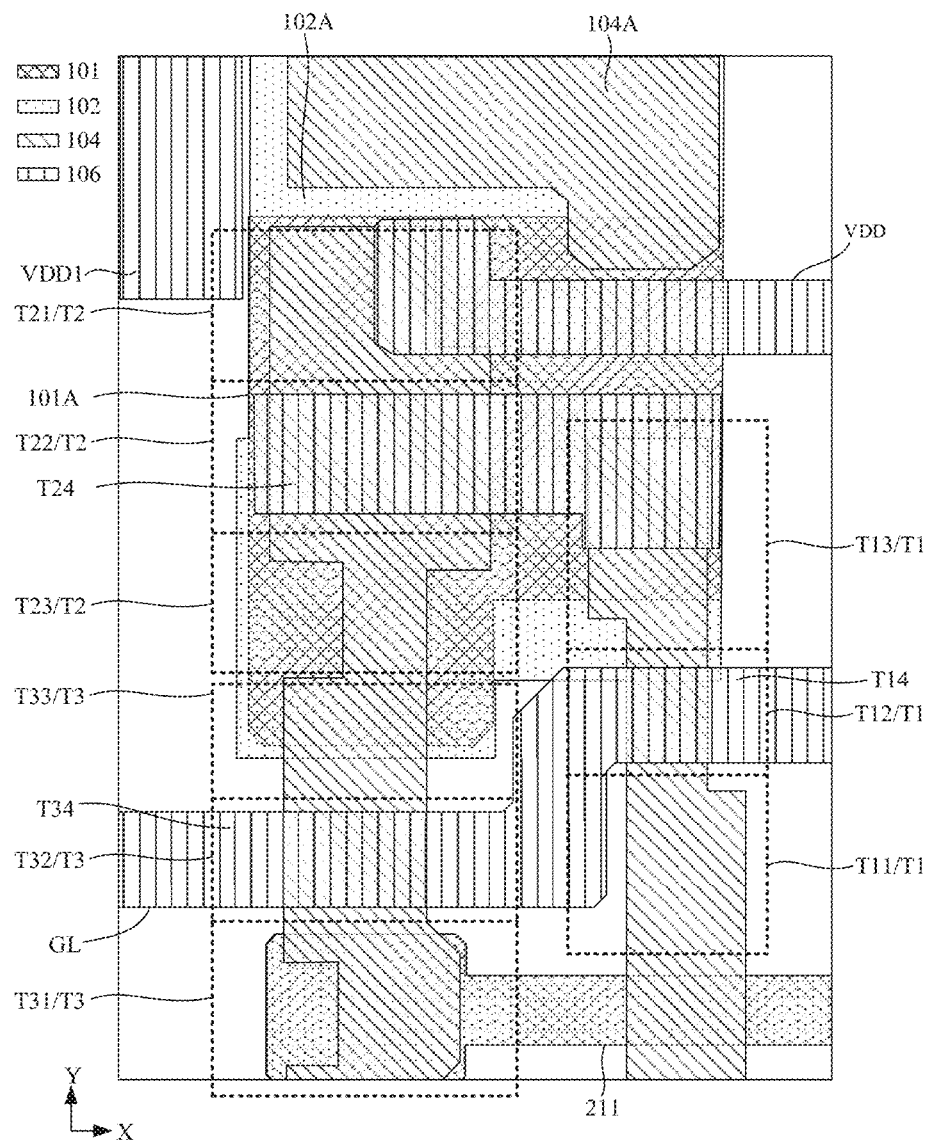
Figure 14E:
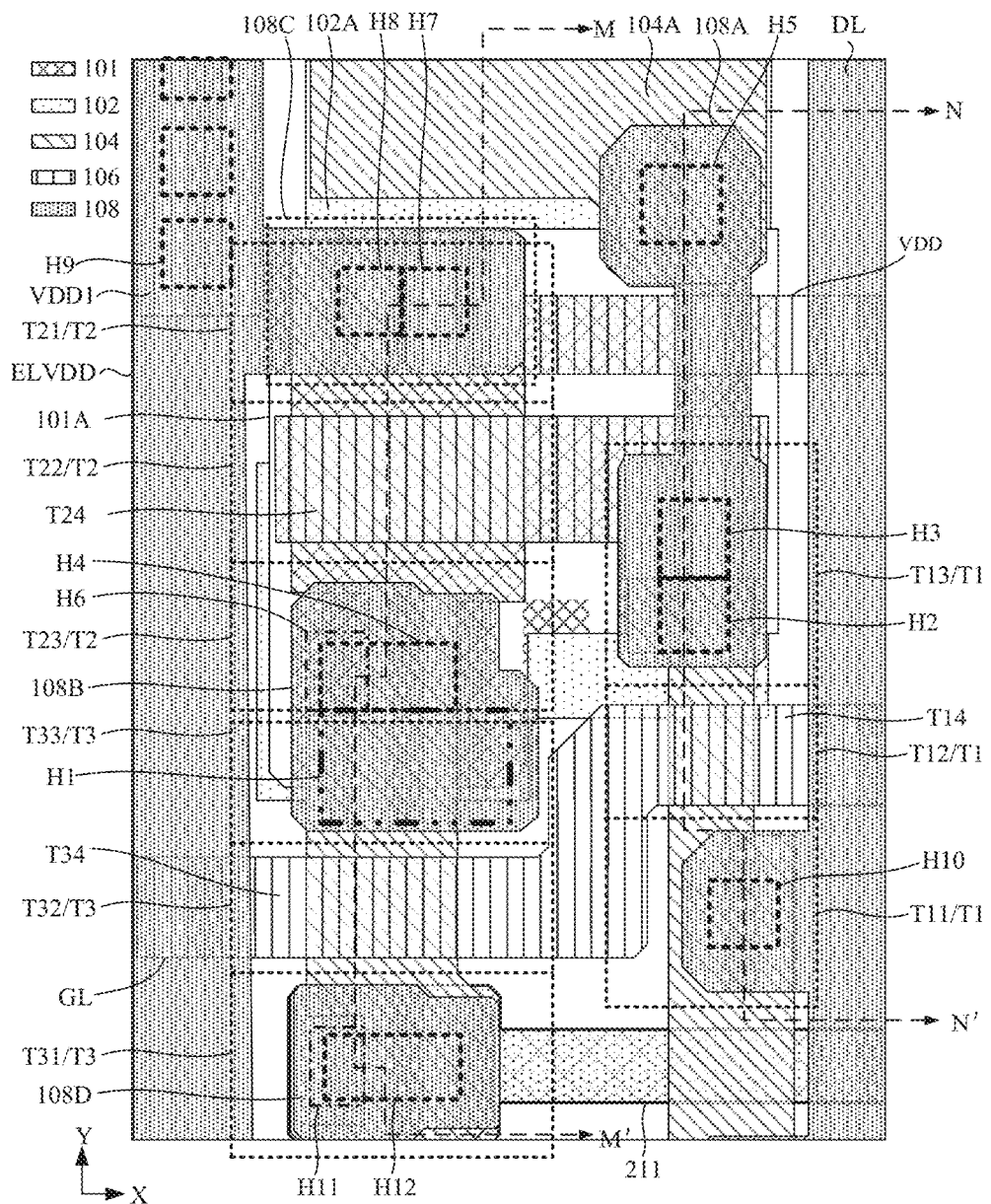
Figure 15:
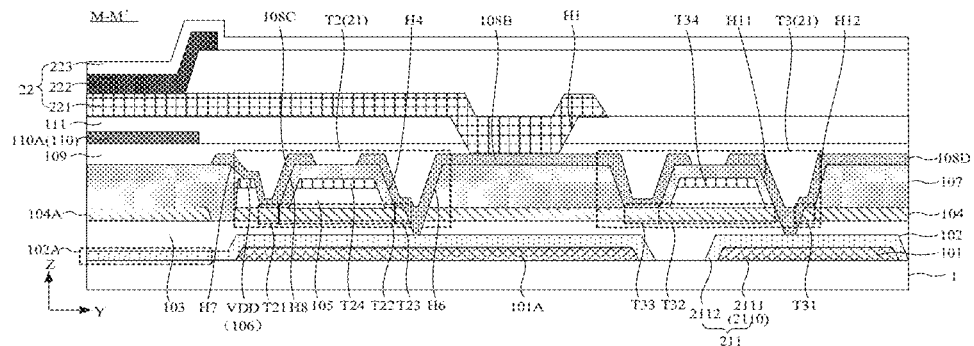
FIG. 15 is a sectional view of the structure shown in FIG. 14e taken along the section line M-M'.

Referring to FIGS. 14e and 15, the interlayer dielectric layer 107 is provided with seventh via holes H7 therein. The interlayer dielectric layer 107 and the gate insulating layer 105 are together provided with eighth via holes H8 therein. A third connection pattern 108C is electrically connected to a corresponding auxiliary power supply voltage line VDD through a seventh via hole H7, and is electrically connected to the first electrode T21 of a corresponding driving transistor T2 through an eighth via hole H8, so that the first electrode T21 of the driving transistor T2 is electrically connected to the auxiliary power supply voltage line VDD.

It can be understood that, the seventh via hole H7 and the eighth via hole H8 may be connected or disconnected.

Figure 13A:
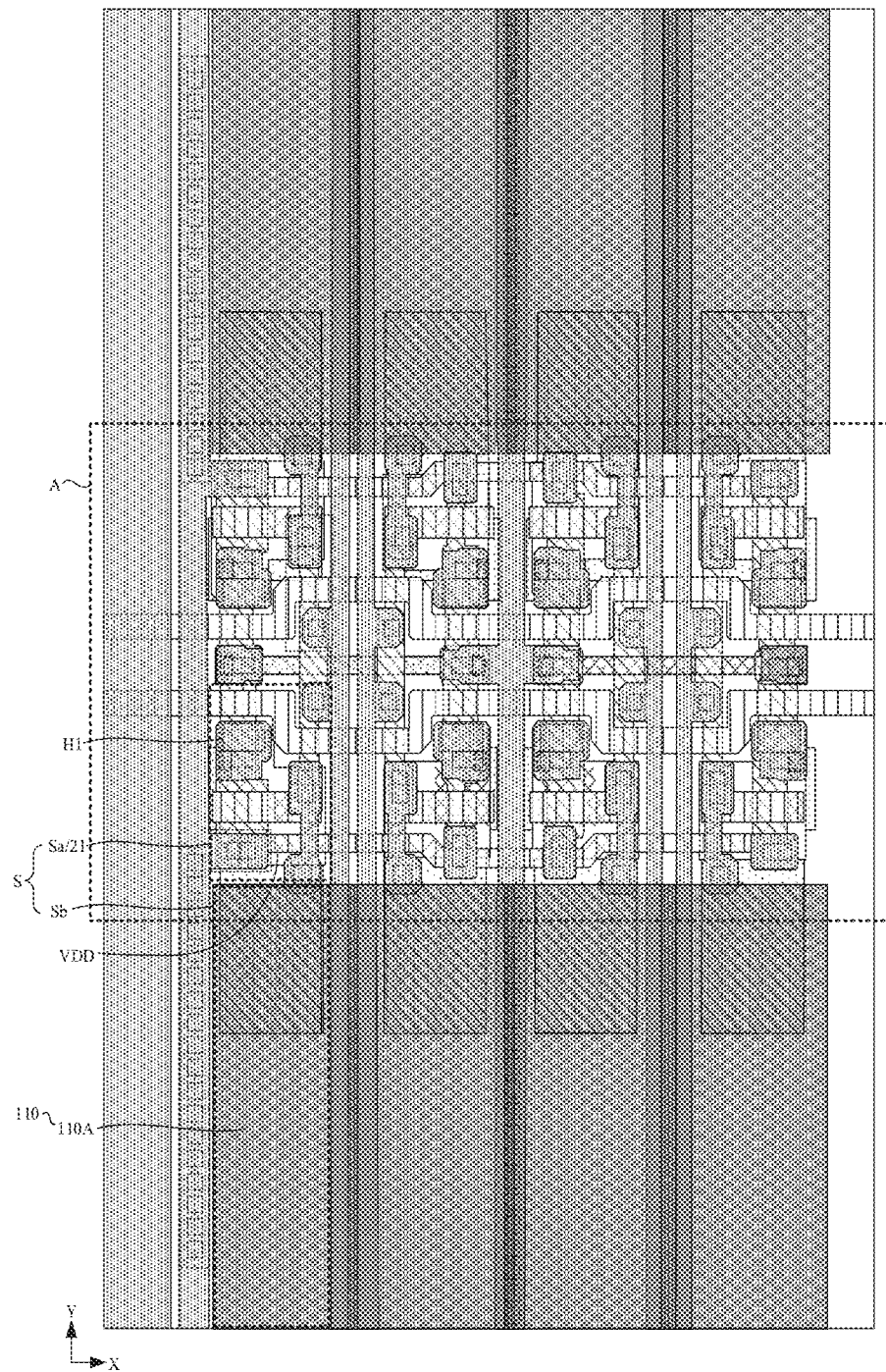
FIG. 13a is a partial enlarged view of sub-pixels, in accordance with some embodiments of the present disclosure.
Figure 13B:
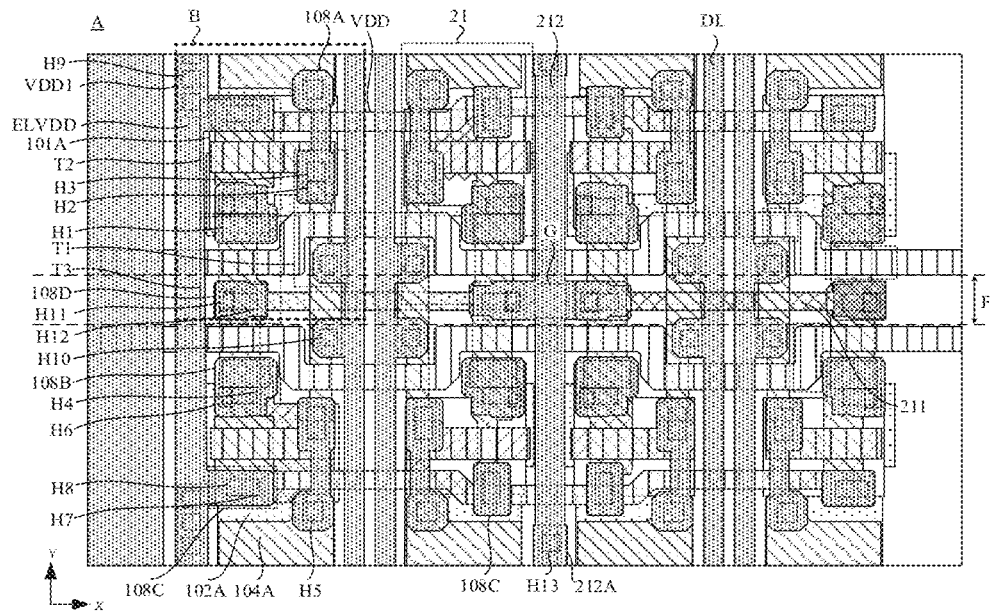

In some embodiments, as shown in FIGS. 13b and 14e, the power supply voltage lines ELVDD are located in the source-drain conductive layer 108. In the same pixel region 20, a third connection pattern 108C in third connection patterns 108C that is closest to a power supply voltage line ELVDD corresponding to the pixel region 20 is electrically connected to the power supply voltage line ELVDD. The third connection pattern 108C is electrically connected to the power supply voltage line ELVDD, so that the power supply voltage line ELVDD is electrically connected to the first electrode T21 of the driving transistor T2 and the auxiliary power supply voltage line VDD.

For example, the power supply voltage line ELVDD corresponding to the pixel region 20 and the third connection pattern 108C, closest to the power supply voltage line ELVDD, in the third connection patterns 108C in the pixel region 20 are in a one-piece structure.

In some embodiments, as shown in FIGS. 14d and 14e, the display panel 100 further includes a plurality of power supply voltage connection patterns VDD1 located in the gate conductive layer 106. An orthographic projection of the power supply voltage line ELVDD on the substrate 1 overlaps with orthographic projection(s) of at least one power supply voltage connection pattern VDD1 on the substrate 1.

Referring to FIGS. 14e and 15, the interlayer dielectric layer 107 is further provided with ninth via holes H9 therein. The power supply voltage line ELVDD is electrically connected to the at least one power supply voltage connection pattern VDD1 through ninth via hole(s) H9. By arranging the power supply voltage line ELVDD to be connected in parallel with the power supply voltage connection pattern(s) VDD1, it may be possible to reduce the resistance of the power supply voltage line ELVDD, and thus reduce the voltage drop generated during the transmission of power supply voltage signal by the power supply voltage line ELVDD.

Based on this, a layout of the pixel drive circuit 21 will be described below.

In some embodiments, as shown in FIGS. 13a and 15, the display panel 100 further includes a passivation layer 109, a color filter layer 110 and a planarization layer 111 that are disposed on the substrate 1 in sequence and located between the pixel drive circuits 21 and the light-emitting devices 22 in the sub-pixels 2. The passivation layer 109 and the planarization layer 111 are together provided with first via holes H1 each penetrating through both of the passivation layer 109 and the planarization layer 111. The pixel drive circuit 21 is electrically connected to a corresponding light-emitting device 22 through the first via hole H1.

As shown in FIGS. 13a and 15, the color filter layer 110 includes a plurality of filter portions 110A. Each filter portion 110A is disposed in the sub-pixel light-emitting region Sb of a corresponding sub-pixel region S. In the same sub-pixel region S, in the second direction Y, the filter portion 110A and the first via hole H1 have at least a portion of the pixel drive circuit 21 located in the sub-pixel region S and/or the auxiliary power supply voltage line VDD located in the sub-pixel region S therebetween.

For example, as shown in FIG. 13a and FIG. 15, in the same sub-pixel region S, in the second direction Y, the filter portion 110A and the first via hole H1 have at least a portion of the pixel drive circuit 21 located in the sub-pixel region S and the auxiliary power supply voltage line VDD located in the sub-pixel region S therebetween.

In the embodiments of the present disclosure, in the same sub-pixel region S, in the second direction Y, the filter portion 110A and the first via hole H1 have at least the portion of the pixel drive circuit 21 located in the sub-pixel region S and/or the auxiliary power supply voltage line VDD located in the sub-pixel region S therebetween, so that the first via hole H1 is away from the filter portion 110A, which prevents the filter portion 110A from covering a position, at which the first via hole H1 is formed through etching, of the passivation layer 109 and the planarization layer 111. Thus, it avoids the filter portion 110A affecting an etching selection ratio of the passivation layer 109 to the planarization layer 111 in an etching process of the first via hole H1 in the passivation layer 109 and the planarization layer 111, and ensures the first via hole H1 penetrating through the passivation layer 109 and the planarization layer 111, thereby ensuring that the pixel drive circuit 21 is electrically connected to the light-emitting device 22 through the first via hole H1.

In addition, by adopting the above arrangement, it may provide sufficient arrangement space for the filter portion 110A, so as to ensure that the filter portion 110A may cover the sub-pixel light-emitting region Sb, and avoid light leakage due to a large amount of light exiting from a region of the sub-pixel light-emitting region Sb that is not covered by the filter portion 110A.

In some embodiments, as shown in FIGS. 13a, 13b and 14e, in a same pixel drive circuit 21, the switching transistor T1 and the sensing transistor T3 are farther away from the sub-pixel light-emitting region Sb of the sub-pixel region S where the pixel drive circuit 21 is located than the driving transistor T2, so that the auxiliary power supply voltage line VDD is closer to the sub-pixel light-emitting region Sb, and the first via hole H1 is farther away from the sub-pixel light-emitting region Sb. In addition, the layout of the pixel drive circuit 21 in the sub-pixel circuit region Sa is more compact, which helps improve the PH of the display panel 100.

In some embodiments, as shown in FIG. 14e, the active layer 104 includes first electrodes T11, channel portions T12 and second electrodes T13 of the switching transistors T1, first electrodes T21, channel portions T22 and second electrodes T23 of the driving transistors T2, and first electrodes T31, channel portions T32 and second electrodes T33 of the sensing transistors T3. The gate conductive layer 106 includes control electrodes T14 of the switching transistors T1, control electrodes T24 of the driving transistors T2 and control electrodes T34 of the sensing transistors T3. The source-drain conductive layer 108 further includes first connection patterns 108A and second connection patterns 108B.

Figure 16:
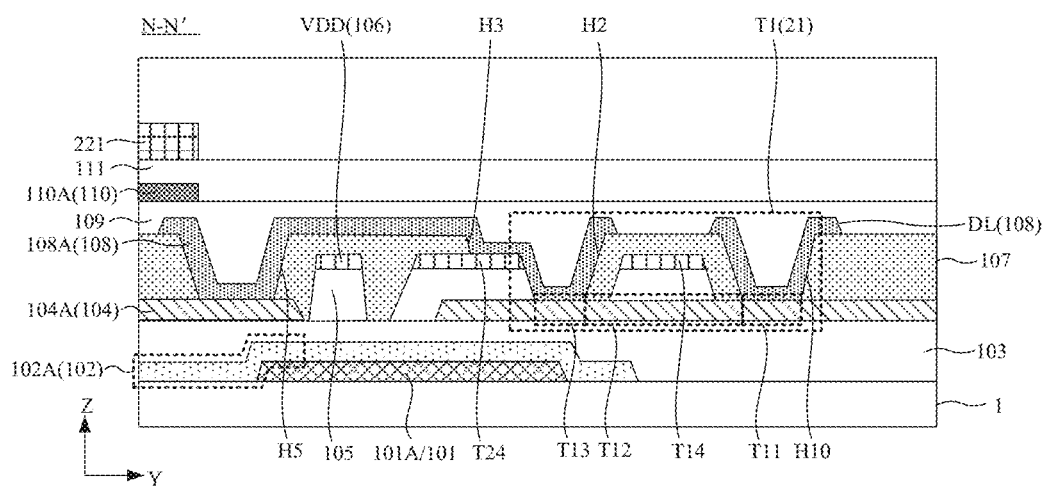
FIG. 16 is a sectional view of the structure shown in FIG. 14e taken along the section line N-N'.

As shown in FIGS. 14e and 16, the interlayer dielectric layer 107 and the gate insulating layer 105 are together provided with second via holes H2 each penetrating through both of the interlayer dielectric layer 107 and the gate insulating layer 105, and the interlayer dielectric layer 107 is provided with third via holes H3 therein. A first connection pattern 108A is electrically connected to the second electrode T13 of the switching transistor T1 through a second via hole H2, and is electrically connected to the control electrode T24 of the driving transistor T2 through a third via hole H3, so that the control electrode T24 of the driving transistor T2 is electrically connected to the second electrode T13 of the switching transistor T1.

It can be understood that, the second via hole H2 and the third via hole H3 may be connected or disconnected.

As shown in FIGS. 14e and 15, the interlayer dielectric layer 107 is provided with fourth via holes H4 therein. A second connection pattern 108B is electrically connected to the second electrode T23 of the driving transistor T2 through a fourth via hole H4.

As shown in FIGS. 14e and 15, in the same sub-pixel region S, in the second direction Y, the filter portion 110A and the first via hole H1 have the control electrode T24, the channel portion T22 and the first electrode T21 of the driving transistor T2 and the auxiliary power supply voltage line VDD therebetween, so that the first via hole H1 is away from the filter portion 110A.

In some embodiments, as shown in FIGS. 14c to 14e and 16, the display panel 100 further includes a first electrode layer 102 and a buffer layer 103 that are disposed on the substrate 1 in sequence. The first electrode layer 102 and the buffer layer 103 are located on a side of the active layer 104 proximate to the substrate 1. The first electrode layer 102 includes second electrode plates 102A of the storage capacitors Cst. The active layer 104 further includes first electrode plates 104A of the storage capacitors Cst.

The interlayer dielectric layer 107 is provided with fifth via holes H5 therein. The first connection pattern 108A is further electrically connected to the first electrode plate 104A of a corresponding storage capacitor Cst through a fifth via hole H5. The interlayer dielectric layer 107 and the buffer layer 103 are together provided with sixth via holes H6 each penetrating through both of the interlayer dielectric layer 107 and the buffer layer 103. The second connection pattern 108B is further electrically connected to the second electrode plate 102A of a corresponding storage capacitor Cst through the sixth via hole H6. The fifth via hole H5 and the sixth via hole H6 are both located on a side of the storage capacitor Cst proximate to the third gap region F.

It can be understood that, the fourth via hole H4 and the sixth via hole H6 may be connected or disconnected.

Through the above arrangement, the fifth via hole H5 and the sixth via hole H6 are both located on the side of the storage capacitor Cst proximate to the third gap region F, so that connection points of the two electrode plates of the storage capacitor Cst are distributed on the same side, which may reduce a layout space occupied by the pixel drive circuit 21 in the sub-pixel circuit region Sa. As a result, it helps improve the PPI of the display panel 100.

Figure 13C:
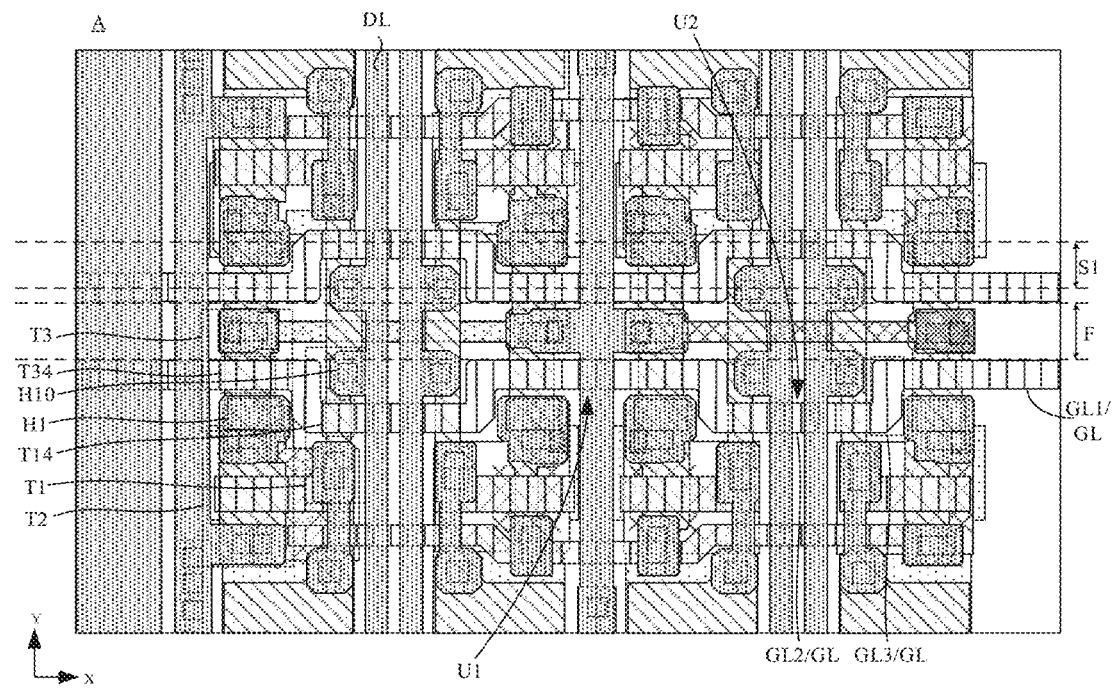

In some embodiments, as shown in FIG. 13c, each gate line GL is in a shape of a polyline and substantially extends along the first direction X. A gate line GL is electrically connected to pixel drive circuits 21 in a row of sub-pixels 2.

It can be understood that, structures shown in FIGS. 13c and 13b are the same, but reference signs are made on different structures in the figures, so that corresponding structures may be described emphatically.

According to the above descriptions, the pixel drive circuits 21 in the same row of sub-pixels 2 may be electrically connected to the same gate line GL, and control electrodes of the switching transistor T1 and the sensing transistor T3 in the same pixel drive circuit 21 may be electrically connected to the same gate line GL. By reducing the number of the gate lines GL and adopting a polyline design for the gate line GL, it may be possible to save the layout space for the gate lines GL in the display panel 100, thereby increasing the PPI of the display panel 100.

In some embodiments, as shown in FIG. 13c, the gate line GL includes a plurality of first extension segments GL1, a plurality of second extension segments GL2 and a plurality of connection segments GL3. Each first extension segment GL1 and each second extension segment GL2 substantially extend along the first direction X. The plurality of first extension segments GL1 and the plurality of second extension segments GL2 are alternately arranged, and a first extension segment GL1 and an adjacent second extension segment GL2 are connected by a connection segment GL3. In the second direction Y, a distance S1 exists between extension lines of the first extension segment GL1 and the adjacent second extension segment GL2.

The first extension segment GL1 and two connection segments GL3 connected to the first extension segment GL1 together constitute a first recess U1. An opening of the first recess U1 is disposed towards a side of the gate line GL away from the third gap region F. The second extension segment GL2 and two connection segments GL3 connected to the second extension segment GL2 together constitute a second recess U2. An opening of the second recess U2 is disposed towards the third gap region F. At least a portion of the pixel drive circuit 21 is located in the first recess U1 or the second recess U2.

Through the above arrangement, the gate line GL is arranged in the shape of polyline (that is, the gate line GL is bent for multiple times and substantially extends along the first direction X), and the at least portion of the pixel drive circuit 21 is located in the first recess U1 or the second recess U2 of the gate line GL. Therefore, in the sub-pixel region S, the gate line GL and the pixel drive circuit 21 are arranged more closely, which helps increase the PPI of the display panel 100.

For example, as shown in FIG. 13c, the switching transistor T1 is electrically connected to a corresponding data line DL through a tenth via hole H10. The driving transistor T2 and the sensing transistor T3 are electrically connected to the corresponding light-emitting device 22 through the first via hole H1. A portion of the first extension segment GL1 serves as the control electrode T34 of the sensing transistor T3, and at least a portion of an orthographic projection of the first via hole H1 on the substrate 1 is located within an orthographic projection of a first recess U1 on the substrate 1. A portion of the second extension segment GL2 serves as the control electrode T14 of the switching transistor T1, and at least a portion of an orthographic projection of the tenth via hole H10 on the substrate 1 is located within an orthographic projection of a second recess U2 on the substrate 1.

In some embodiments, as shown in FIGS. 9a to 9h and 10, the pixel drive circuit 21 may further include a first sensing signal line 211 located in the third gap region F and extending along the first direction X. As shown in FIG. 4, the first sensing signal line 211 may be electrically connected to the sensing signal terminal Sense of pixel drive circuit 21, and electrically connected to the sensing transistor T3 in the pixel drive circuit 21 through the sensing signal terminal Sense.

In some examples, as shown in FIGS. 9a to 9h, in the case where the plurality of sub-pixels 2 included in the display panel 100 are divided into the plurality of pixel units 2a, and the pixel unit 2a includes at least three sub-pixels 2 arranged in sequence in the first direction X, among sub-pixels 2 located in the second row of sub-pixel regions S2 and the third row of sub-pixel regions S3, two pixel units 2a opposite to each other in the second direction Y share a single first sensing signal line 211.

For example, the two pixel units 2a opposite to each other in the second direction Y may be electrically connected to the same first sensing signal line 211.

For example, as shown in FIG. 9a, each pixel unit 2a includes four sub-pixels 2. Pixel drive circuits 21 in eight sub-pixel 2 in two pixel units 2a adjacent to each first sensing signal line 211 is electrically connected to the first sensing signal line 211.

Since a row of pixel units 2a includes pixel units 2a, the number of the two pixel units 2a located in the sub-pixels 2 in the second row of sub-pixel regions S2 and the third row of sub-pixel region S3 and opposite to each other in the second direction Y may be multiple. Therefore, the number of first sensing signal lines 211 located in the third gap region F may also be multiple.

The two pixel units 2a opposite to each other in the second direction Y share the first sensing signal line 211. That is, sensing transistors T3 of pixel drive circuits 21 in at least six sub-pixels 2 included in the two pixel units 2a may be electrically connected to the same first sensing signal line 211.

By arranging the first sensing signal line 211 in the third gap region F, an extending direction of the first sensing signal line 211 is the same as an arrangement direction of the sub-pixels 2 included in each pixel unit 2a, which allows pixel drive circuits 21 in the sub-pixels 2 to be electrically connected to the same first sensing signal line 211, thereby reducing the number of the first sensing signal lines 211 and simplifying the structure of the pixel drive circuits 21.

Since the two pixel units 2a located in the sub-pixels 2 in the second row of sub-pixel regions S2 and the third row of sub-pixel regions S3 and opposite to each other in the second direction Y share the first sensing signal line 211, not only may a distance between the two pixel units 2a opposite to each other in the second direction Y be reduced, the dimension of the third gap region F in the second direction Y may be reduced, but also space occupancy of the pixel drive circuit 21 may also be reduced. In this way, it is possible to avoid compressing minimum line widths of the sub-pixel 2, and it is beneficial to arrange more sub-pixels 2 to increase the PPI of the display panel 100, or to increase the area of the sub-pixel light-emitting region Sb to increase the aperture ratio of the display panel 100.

In some embodiments, as shown in FIG. 10, a plurality of first sensing signal lines 211 are arranged between two adjacent rows of pixel units 2a. Two adjacent first sensing signal lines 211 are separated by the first gap region D in the first direction X.

It will be noted that, in the related art, sensing lines are designed in a grid. That is, the sensing lines include horizontal sensing lines extending along the first direction X, and vertical sensing lines extending along the second direction Y. The vertical sensing lines and the horizontal sensing lines are electrically connected to each other to constitute the grid, which may reduce a voltage drop generated during the transmission of a sensing signal by the sensing lines.

However, in the above embodiments of the present disclosure, in the first direction X, the two adjacent first sensing signal lines 211 are separated by the first gap region D, which may prevent the first sensing signal line 211 from occupying a space of the first gap region D. As a result, the first gap region D may be used to arrange the signal line and the device group 311 of the gate drive circuit 3.

In some embodiments, FIGS. 14a to 14e, and 15, the display panel 100 further includes a light-shielding layer 101 disposed on substrate 1. The light-shielding layer 101 is located on a side of the first electrode layer 102 proximate to the substrate 1. The first sensing signal lines 211 include at least one first sensing signal sub-line 2110 located in the light-shielding layer 101.

The source-drain conductive layer 108 further includes fourth connection patterns 108D. The interlayer dielectric layer 107 and the buffer layer 103 are together provided with eleventh via holes H11 each penetrating through both of the interlayer dielectric layer 107 and the buffer layer 103. The interlayer dielectric layer 107 is provided with twelfth via holes H12 therein. The fourth connection pattern 108D is electrically connected to a corresponding first sensing signal line 211 through an eleventh via hole H11, and is electrically connected to the first electrode T31 of a corresponding sensing transistor T3 through a twelfth via hole H12, so that the first electrode T31 of the sensing transistor T3 is electrically connected to the first sensing signal line 211.

It can be understood that, the eleventh via hole H11 and the twelfth via hole H12 may be connected or disconnected.

A material of the light-shielding layer 101 includes an opaque conductive material or a conductive material with low light transmittance.

For example, as shown in FIG. 15, the first sensing signal line 211 includes a first first sensing signal sub-line 2111 (i.e., the first sensing signal sub-line 2110) and a second first sensing signal sub-line 2112 that are electrically connected. An orthographic projection of the first first sensing signal sub-line 2111 on the substrate 1 overlaps with an orthographic projection of the second first sensing signal sub-line 2112 on the substrate 1. The first first sensing signal sub-line 2111 is located in the light-shielding layer 101, and the second first sensing signal sub-line 2112 is located in the first electrode layer 102. By arranging the first first sensing signal sub-line 2111 and the second first sensing signal sub-line 2112 to be connected in parallel, it may be possible to reduce a resistance of the first sensing signal line 211, thereby reducing the voltage drop generated during the transmission of the sensing signal by the first sensing signal line 211.

In some examples, as shown in FIGS. 9a to 9h and 10, the pixel drive circuit 21 may further include a second sensing signal line 212 extending along the second direction Y. The second sensing signal line 212 is located in a region between two adjacent columns of sub-pixels 2 in the two pixel units 2a opposite to each other in the second direction Y.

For example, as shown in FIGS. 9a to 9h and 10, the pixel unit 2a includes four sub-pixels 2, and the four sub-pixels 2 arranged in sequence in the first direction X may be referred to as a first sub-pixel, a second sub-pixel, a third sub-pixel, and a fourth sub-pixel. A data line DL electrically connected to a pixel drive circuit 21 in the first sub-pixel and a data line DL electrically connected to a pixel drive circuit 21 in the second sub-pixel may be disposed in a region between the first sub-pixel and the second sub-pixel. A data line DL electrically connected to a pixel drive circuit 21 in the third sub-pixel and a data line DL electrically connected to a pixel drive circuit 21 in the fourth sub-pixel may be disposed in a region between the third sub-pixel and the fourth sub-pixel. The second sensing signal line 212 electrically connected to the first sensing signal line 211 may be disposed in a region between the second sub-pixel and the third sub-pixel. The data lines DL and the second sensing signal line 212 adopt the above arrangement manner, which is beneficial to rationally using a space of the display panel 100 and reducing a complexity of the lines.

For example, as shown in FIG. 13b, the first sensing signal line 211 is electrically connected to the second sensing signal line 212 through a via hole G. For example, the second sensing signal line 212 is further electrically connected to an external sensing circuit.

That is, the first sensing signal line 211 and the second sensing signal line 212 in different layers are connected to realize an electrical connection between the pixel drive circuit 21 and the external sensing circuit. It is beneficial to simplify the layout design of the display panel 100 and reduce the space occupancy of the pixel drive circuit 21.

For example, a second sensing signal line 212 may be located in a region between two adjacent sub-pixels 2 in a column of pixel units 2a. The column of pixel units 2a includes a plurality of the two pixel units 2a opposite to each other in the second direction Y, so that the second sensing signal line 212 may be electrically connected to first sensing signal lines 211.

For example, during the operation of the pixel drive circuit 21, in the reset phase of the display period, the reset signal may be transmitted to the sensing transistor T3 through the second sensing signal line 212, the first sensing signal line 211, and the sensing signal terminal Sense in sequence; in the first phase of the blanking period, the reset signal may be transmitted to the sensing transistor T3 through the second sensing signal line 212, the first sensing signal line 211, and the sensing signal terminal Sense in sequence; and in the second phase of the blanking period, while the driving transistor T2 is charging the second node S, the driving transistor T2 may also charge the first sensing signal line 211 and the second sensing signal line 212 through the sensing transistor T3 and the sensing signal terminal Sense in sequence, and during a voltage sampling, the voltage of the second sensing signal line 212 may be sampled, and a voltage sampling result may be transmitted to the external sensing circuit.

In some examples, as shown in FIG. 13b, the second sensing signal line 212 and the plurality of data lines GL are made of the same material and disposed in the same layer. That is, the second sensing signal line 212 is located in the source-drain conductive layer.

In this way, the second sensing signal line 212 and the plurality of data lines DL may be manufactured simultaneously in a single patterning process, which is beneficial to simplifying the manufacturing process of the display panel 100.

In a same pixel region 20, in fourth connection patterns 108D located on opposite sides of the second sensing signal line 212 in the first direction X, two fourth connection patterns 108D that are closest to the second sensing signal line 212 are electrically connected to the second sensing signal line 212. By making the fourth connection patterns 108D electrically connected to the second sensing signal line 212, it is possible to make the second sensing signal line 212 electrically connected to the first electrode T31 of the sensing transistor T3 and the first sensing signal line 211.

For example, in the same pixel region 20, in the fourth connection patterns 108D located on the opposite sides of the second sensing signal line 212 in the first direction X, the two fourth connection patterns 108D that are closest to the second sensing signal line 212 and the second sensing signal line 212 are arranged in a one-piece structure.

In some embodiments, as shown in FIG. 13b, the display panel 100 further includes a plurality of sensing connection patterns 212A located in the gate conductive layer 106. An orthographic projection of the second sensing signal line 212 on the substrate 1 overlaps with orthographic projection(s) of at least one sensing connection pattern 212A on the substrate 1.

The interlayer dielectric layer 107 is further provided with thirteenth via holes H13 therein. The second sensing signal line 212 is electrically connected to the at least one sensing connection pattern 212A through thirteenth via hole(s) H13. By arranging the sensing connection pattern(s) 212A and the second sensing signal line 212 to be connected in parallel, it may be possible to reduce the resistance of the second sensing signal line 212, thereby reducing the voltage drop during the transmission of the sensing signal by the second sensing signal line 212.

In some embodiments, as shown in FIGS. 9a to 9h, the gate drive circuit 3 may further include a plurality of transmission signal lines 36 located in second gap regions E and extending along the first direction X.

In some examples, as shown in FIGS. 9a to 9h, two shift registers 31 electrically connected to sub-pixels 2 located in the first row of sub-pixel regions S1 and sub-pixels 2 located in the second row of sub-pixel regions S2 share at least one of the plurality of transmission signal lines 36.

For example, the two shift registers 31 may share one, two, or three transmission signal lines 36, and may even share the plurality of transmission signal lines 36.

By arranging the sub-pixel circuit regions Sa and the sub-pixel light-emitting regions Sb in the first row of sub-pixel regions S1, the second row of sub-pixel regions S2, and the third row of sub-pixel regions S3 in accordance with the above-mentioned manner, it is possible to make the sub-pixel circuit regions Sa in the second row of sub-pixel regions S2 and the sub-pixel circuit regions Sa in the third row of sub-pixel region S3 close together (that is, a dimension of the third gap region F in the second direction Y is small). As a result, a dimension, in the second direction Y, of the second gap region E between the sub-pixel light-emitting regions Sb in the first row of sub-pixel regions S1 and the sub-pixel light-emitting regions Sb in the second row of sub-pixel regions S2 is large (the dimension of the second gap region E in the second direction Y is greater than the dimension of the third gap region F in the second direction Y), and further, a spacing of the sub-pixel light-emitting regions Sb in the rows of sub-pixel regions S may be made equal or substantially equal, which ensures an uniformity of light emitted by the display panel 100.

Based on this, wirings required in each shift register 31 and wirings required between the shift register 31 and control signal lines 33 may be disposed in the second gap region E adjacent to the shift register 31. The plurality of transmission signal lines 36 may include, for example, wirings required in the two shift registers 31 electrically connected to the sub-pixels 2 located in the first row of sub-pixel regions S1 and the sub-pixels 2 located in the second row of sub-pixel regions S2 and wirings required between the two shift registers 31 and control signal lines 33.

In some embodiments of the present disclosure, since the two shift registers 31 share the at least one of the plurality of transmission signal lines 36, it may be possible to reduce the number of transmission signal lines 36 disposed in the second gap region E, and reduce space occupancy of the transmission signal lines 36 in the second gap region E. In this way, the dimension of the second gap region E in the second direction Y is reduced; and more sub-pixels 2 may be provided to increase the PPI of the display panel 100, or an area of the sub-pixel light-emitting region Sb is increased, so that an aperture ratio of the display panel 100 is increased.

In some embodiments, the plurality of transmission signal lines 36 and the plurality of gate lines GL may be made of the same material and arranged in the same layer.

In this way, the plurality of transmission signal lines 36 and the plurality of gate lines GL may be manufactured simultaneously in a single patterning process, which is beneficial to simplify the manufacturing process of the display panel 100. Moreover, since the transmission signal lines 36 extends along the first direction X, by arranging the transmission signal lines 36 and the gate lines GL in the same layer, it may be possible to prevent the transmission signal lines 36 from being short-circuited to the control signal lines 33, the cascade input signal lines 34, and the cascade display reset signal lines 35 extending along the second direction Y, and may also be possible to avoid an increase in a thickness of the display panel 100 and an increase in the manufacturing processes of the display panel 100 due to a separate manufacturing of the transmission signal lines 36.

Here, there are various types of the plurality of transmission signal lines 36, which may be selectively set according to actual needs.

In some examples, as shown in FIGS. 9a to 9g, the gate drive circuit 3 may further include: first voltage signal line(s) 36a, second voltage signal line(s) 36b, and third voltage signal line(s) 36c.

For example, as shown in FIG. 9a, a first voltage signal line 36a may be electrically connected to the first voltage signal terminals VDD of the two shift registers 31.

Since the leakage prevention circuits 3102 in the two shift registers 31 are both electrically connected to the first voltage signal terminal VDD, electrical connections between the first voltage signal line 36a and both the leakage prevention circuits 3102 in the two shift registers 31 may be realized. During an operation of each leakage prevention circuit 3102, the first voltage signal may be transmitted to a corresponding leakage prevention circuit 3102 through the first voltage signal line 36a.

For example, as shown in FIGS. 9a to 9f and 12, a second voltage signal line 36b may be electrically connected to the second voltage signal terminals VGL1 of the two shift registers 31.

Since the control circuits 3104, the first reset circuits 3105, the second reset circuits 3106, the third reset circuits 3107, the fourth reset circuits 3108, and the fifth reset circuits 3109 in the two shift registers 31 are all electrically connected to the second voltage signal line 36b, electrical connections between the second voltage signal line 36b and both the control circuits 3104 and the reset circuits in the two shift registers 31 may be realized. In this way, during operations of each control circuit 3104 and each reset circuit, the second voltage signal may be transmitted to a corresponding control circuit 3104 or a corresponding reset circuit through the second voltage signal line 36b.

For example, as shown in FIG. 9g, a third voltage signal line 36c may be electrically connected to the third voltage signal terminals VGL2 of the two shift registers 31.

Since the fourth reset circuits 3108 in the two shift registers 31 are both electrically connected to the third voltage signal terminal VGL2, electrical connections between the third voltage signal line 36c and both the fourth reset circuits 3108 in the two shift registers 31 may be realized. During an operation of each fourth reset circuit 3108, the third voltage signal may be transmitted to a corresponding fourth reset circuit 3108 through the third voltage signal line 36c.

Based on this, the two shift registers 31 may share at least one of the first voltage signal line 36a, the second voltage signal line 36b, and the third voltage signal line 36c. A transmission signal line 36 may be the first voltage signal line 36a, the second voltage signal line 36b, or the third voltage signal line 36c.

In addition, in a case where the gate drive circuit 3 adopts the structure as shown in FIG. 9a to 9h or 10, the input signal terminal put of the first shift register 31 and the input signal terminal Iput of the second shift register 31 may be electrically connected to the twenty-first clock signal line CLK_21 in the control signal lines 33. In this case, the first shift register 31 and the second shift register 31 may share a transmission signal line 36 used for connecting the input signal terminals Iput of the two shift registers 31 and the twenty-first clock signal line CLK_21, so that the twenty-first clock signal line CLK_21 may transmit the start signal (i.e., the input signal) to the first input circuits 3101 and the fifth reset circuits 3109 in corresponding shift registers 31 through the transmission signal line 36.

In the case where the date drive circuit 3 adopts the structure as shown in FIG. 9a to 9h or 10, the display reset signal terminals SDT of the last four shift registers 31 may be electrically connected to the twenty-second clock signal line CLK_22. In this case, in the last four shift registers 31, a shift register 31 corresponding to the first row of sub-pixel regions S1 and a shift register 31 corresponding to the second row of sub-pixels S2 may share a transmission signal line 36 used for connecting the display reset signal terminals SDT of the two shift registers 31 and the twenty-second clock signal line CLK_22, so that the twenty-second clock signal line CLK_22 may transmit the display reset signal to the second reset circuits 3106 in corresponding shift registers 31 through the transmission signal line 36.

In some other examples, as shown in FIGS. 9a to 9g, the gate drive circuit may further include a plurality of node voltage transmission lines 36d located in the second gap region E. A transmission signal line 36 may be the node voltage transmission line 36d.

Here, the node voltage transmission line 36d may be used to connect device groups 311 in the same shift register 31, or may be used to connect device groups 311 in different shift registers 31.

For example, as shown in FIGS. 9a to 9g, in the same shift register 31, at least two device groups 311 are electrically connected to a same node through a node voltage transmission line 36d.

The first input circuit 3101, the output circuit 3103, and the leakage prevention circuit 3102 in the same shift register 31 each include at least one device group 311.

In an example where the first input circuit 3101 includes six device groups 311, the leakage prevention circuit 3102 includes one device group 311, and the output circuit 3103 includes thirteen device groups 311, the six device groups 311 included in the first input circuit 3101 are connected in parallel, and each device group 311 includes the first transistor M1 and the second transistor M2; the one device group 311 included in the leakage prevention circuit 3102 includes the third transistor M3; and in the thirteen device groups 311 included in the output circuit 3103, one device group 311 includes the fourth transistor M4, each of another two device groups 311 connected in parallel includes the first capacitor C1, and each of the remaining ten device groups 311 connected in parallel includes the fifth transistor M5.

Since the first input circuit 3101 and the output circuit 3103 are both electrically connected to the pull-up node Q<N>, the device group 311 used to be electrically connected to the pull-up node Q<N> in the first input circuit 3101 and the device group 311 used to be electrically connected to the pull-up node Q<N> in the output circuit 3103 may be electrically connected to the pull-up node Q<N> through a same node voltage transmission line 36d.

For example, second electrodes of second transistors M2 in the six device groups 311 included in the first input circuit 3101, the control electrode of the third transistor M3 in the one device group 311 included in the leakage prevention circuit 3102, and the control electrode of the fourth transistor M4, control electrodes of fifth transistors M5, and first terminals of first capacitors C1 in the thirteen device groups 311 included in the output circuit 3103 may be electrically connected to the pull-up node Q<N> through the same node voltage transmission line 36d.

Of course, in the same shift register 31, device group(s) 311 used to be electrically connected to the pull-up node Q<N> in the control circuit 3104, device group(s) 311 used to be electrically connected to the pull-up node Q<N> in the first reset circuit 3105, device group(s) 311 used to be electrically connected to the pull-up node Q<N> in the second reset circuit 3106, and device group(s) 311 used to be electrically connected to the pull-up node Q<N> in the third reset circuit 3107 may also be electrically connected to the pull-up node Q<N> through the same voltage transmission line 36d.

Since the first input circuit 3101 and the leakage prevention circuit 3102 are both electrically connected to the leakage prevention node OFF<N>, device group(s) 311 used to be electrically connected to the leakage prevention node OFF<N> in the first input circuit 3101 and device group(s) 311 used to be electrically connected to the leakage prevention node OFF<N> in the leakage prevention circuit 3102 may be electrically connected to the leakage prevention node OFF<N> through a same node voltage transmission line 36d.

For example, first electrodes of the second transistors M2 in the six device groups 311 included in the first input circuit 3101 and the second electrode of the third transistor M3 in the one device group 311 included in the leakage prevention circuit 3102 may be electrically connected to the leakage prevention node OFF<N> through the same node voltage transmission line 36d.

Of course, in the same shift register 31, device group(s) 311 used to be electrically connected to the leakage prevention node OFF<N> in the first reset circuit 3105, device group(s) 311 used to be electrically connected to the leakage prevention node OFF<N> in the second reset circuit 3106, and device group(s) 311 used to be electrically connected to the leakage prevention node OFF<N> in the third reset circuit 3107 may also be electrically connected to the leakage prevention node OFF<N> through the same node voltage transmission line 36d.

For example, as shown in FIG. 9a, in two shift registers 31 respectively electrically connected to the sub-pixels 2 located in the first row of sub-pixel regions S1 and the sub-pixels 2 located in the second row of sub-pixel regions S2, at least two device groups 311 are electrically connected to a same node through a node voltage transmission line 36d.

For example, the gate drive circuit 3 adopts the structure as shown in FIGS. 9a to 9h, and the blanking input circuit 32 is electrically connected to the two shift registers 31.

The selection control circuit 3201, the second input circuit 3202, and the two transmission circuits 3203 in the blanking input circuit 32 each include at least one device group 311. Each device group 311 is located in a region between two adjacent sub-pixels 2 in a row of sub-pixels 2 where a corresponding shift register 31 is located.

For example, as shown in FIG. 9a, the selection control circuit 3201 may include two device groups 311. One of the device groups 311 includes the twenty-first transistor M21, the twenty-second transistor M22, and the twenty-third transistor M23, and is located in a region between two adjacent sub-pixels 2 in sub-pixels 2 in the first row of sub-pixel regions S1; and the other device group 311 includes the third capacitor C3 and is located in a region between two adjacent sub-pixels 2 in sub-pixels 2 in the second row of sub-pixel regions S1.

For example, as shown in FIG. 9a, the second input circuit 3202 may include one device group 311. The device group 311 includes the twenty-fourth transistor M24, and is located in a region between two adjacent sub-pixels 2 in the sub-pixels 2 in the first row of sub-pixel regions S1.

For example, as shown in FIG. 9a, each of the two transmission circuits 3203 includes one device group 311, and the device group 311 includes the twenty-fifth transistor M25 and the twenty-sixth transistor M26. The device group 311 included in one of the transmission circuits 3203 is located in a region between two adjacent sub-pixels 2 in the sub-pixels 2 in the first row of sub-pixel regions S1, and the device group 311 included in the other transmission circuit 3203 is located in a region between two adjacent sub-pixels 2 in the sub-pixels 2 in the second row of sub-pixel regions S1.

Since the second input circuit 3202 and the two transmission circuits 3203 are all electrically connected to the second blanking node N, the device group 311 used to be electrically connected to the second blanking node N in the second input circuit 3202 and the device groups 311 used to be electrically connected to the second blanking node N in the two transmission circuits 3203 may be electrically connected to the second blanking node N through a same node voltage transmission line 36d.

For example, the second electrode of the twenty-fourth transistor M24 in the device group 311 included in the second input circuit 3202 and first electrodes of twenty-fifth transistors M25 in the device groups included in the two transmission circuits 3203 may be electrically connected to the second blanking node N through the same node voltage transmission line 36d.

In yet other examples, as shown in FIG. 10, at least one cascade input signal line 34 includes a first input signal sub-line 341 and a second input signal sub-line 342 that are located in different first gap regions D. The gate drive circuit 3 may further include an input signal connection line 36e located in the second gap region E and electrically connected to the first input signal sub-line 341 and the second input signal sub-line 342. A transmission signal line 36 may be the input signal connection line 36e.

For example, as shown in FIG. 10, in different shift registers 31, device groups 311 with the same structure may be located in the same first gap region D to facilitate reduction in the difficulty of layout design of the display panel 100.

For example, as shown in FIG. 10, in different shift registers 31, device groups 311 including first input circuits 3101 (each including the first transistor M1) are located in a same first gap region D. As another example, in different shift registers 31, device groups 311 including output circuits 3103 (each including the fourth transistor M4) are located in a same first gap region D. In different shift registers 31, the first gap region D where the first input circuit 3101 is located is different from the first gap region D where the output circuit 3103 is located.

Based on this, for example, as shown in FIG. 10, in a cascade input signal line 34, the first input signal sub-line 341 may be electrically connected to the shift signal terminal CR<N> of the output circuit 3103 in a shift register 31, and located in the same first gap region D as or different first gap regions D from the output circuit 3103, and the second input signal sub-line 342 may be electrically connected to the input signal terminal Iput of the first input circuit 3101 in another shift register 31, and located in the same first gap region D as the first input circuit 3101. The first gap region D where the first input circuit 3101 is located is different from the first gap region D where the first input signal sub-line 341 is located. Therefore, the input signal connection line 36*e* may be disposed to connect the first input signal sub-line 341 and the second input signal sub-line 342 that are located in different first gap regions D.

Here, since the shift signal terminal CR<N> of the N-th shift register 31 is electrically connected to the input signal terminals Iput of the (N+2)-th shift register 31 (e.g., corresponding to the first row of sub-pixel regions S1) and the (N+3)-th shift register 31 (e.g., corresponding to the second row of sub-pixel regions S2), the input signal connection line 36*e* may be disposed in the second gap region E, and the two shift registers 31 may share one input signal connection line 36*e* to realize the electrical connection with the N-th shift register 31. The two shift registers 31 may further share one second input signal sub-line 342.

For example, as shown in FIG. 10, for the output circuit 3103 in the first shift register 31, the first input circuit 3101 in the third shift register 31, and the first input circuit 3101 in the fourth shift register 31, the first input signal sub-line 341 may be electrically connected to the shift signal terminal CR<1> of the output circuit 3103; the second input signal sub-line 342 may be located in a same first gap region D as the two first input circuits 3101, and electrically connected to input signal terminals Iput of the two first input circuits 3101; and the input signal connection line 36*e* may be located in a second gap region E between the third shift register 31 and the fourth shift register 31, and electrically connected to the first input signal sub-line 341 and the second input signal sub-line 342. In this way, the two shift registers 31 may share the same input signal connection line 36*e*.

In yet other examples, as shown in FIG. 10, at least one cascade display reset signal line 35 includes a first display reset signal sub-line 351 and a second display reset signal sub-line 352 that are located in different first gap regions D. The gate drive circuit 3 may further include a display reset connection line 36*f* located in the second gap region E and electrically connected to the first display reset signal sub-line 351 and the second display reset signal sub-line 352. A transmission signal line 36 may be the display reset connection line 36*f*.

For example, in different shift registers 31, the device groups 311 with the same structure may be located in the same first gap region D to facilitate the reduction in the difficulty of layout design of the display panel 100.

For example, in different shift registers 31, the device groups 311 including the first input circuits 3101 (each including the first transistor M1) are located in the same first gap region D. As another example, in different shift registers 31, device groups 311 including the second reset circuits 3106 (each including the thirteenth transistor M13 and the fourteenth transistor M14) are located in the same first gap region D. In different shift registers 31, the first gap region D where the first input circuit 3101 is located is different from the first gap region D where the second reset circuit 3106 is located.

Based on this, for example, as shown in FIG. 10, in a cascade display reset signal line 35, the first display reset signal sub-line 351 may be electrically connected to the shift signal terminal CR<N> of the output circuit 3103 in a shift register 31, and located in the same first gap region D as or different first gap regions D from the output circuit 3103, and the second display reset signal sub-line 352 may be electrically connected to the display reset signal terminal STD of the second reset circuit 3106 in another shift register 31, and located in the same first gap region D as the second reset circuit 3106. The first gap region D where the output circuit 3103 is located is different from the first gap region D where the second display reset signal sub-line 352 is located. Therefore, the display reset connection line 36*f* may be disposed to connect the first display reset signal sub-line 351 and the second display reset signal sub-line 352 that are located in different first gap regions D.

Here, since the shift signal terminal CR<N> of the (N+4)-th shift register 31 is electrically connected to the display reset signal terminals STD of the N-th shift register 31 (e.g., corresponding to the first row of sub-pixel regions S1) and the (N+1)-th shift register 31 (e.g., corresponding to the second row of sub-pixel regions S2), the display reset connection line 36*f* may be disposed in the second gap region E, and the two shift registers 31 may share one display reset connection line 36*f* to realize the electrical connection with the (N+4)-th shift register 31. The two shift register 31 may further share one second display reset signal sub-line 352.

For example, as shown in FIG. 10, for the output circuit 3103 in the fifth shift register 31, the second reset circuit 3106 in the first shift register 31, and the second reset circuit 3106 in the second shift register 31, the first display reset signal sub-line 351 may be located in a same first gap region D as the output circuit 3103, and electrically connected to the shift signal terminal CR<N> of the output circuit 3103; the second display reset signal sub-line 352 may be located in a same first gap region D as two second reset circuits 3106, and electrically connected to display reset signal terminals STD of the two second reset circuits 3106; and the display reset connection line 36*f* may be located in a second gap region E between the first shift register 31 and the second shift register 31 and electrically connected to the first display reset signal sub-line 351 and the second display reset signal sub-line 352. In this way, the two shift register 31 may share the same display reset connection line 36*f*.

In some embodiments, as shown in FIGS. 14*a* to 14*e*, and 15, the display panel 100 further includes light-shielding patterns 101A located in the light-shielding layer 101. Orthographic projections of channel portions of the switching transistor T1 and the driving transistor T2 on the substrate 1 are within orthographic projections of respective light-shielding patterns 101A on the substrate. In this way, the light-shielding patterns 101A may be used to shield light incident on the channel portions of the switching transistor T1 and the driving transistor T2 from the substrate 1, which avoids an influence on performances of the switching transistor T1 and the driving transistor T2.

In an example where the light-shielding patterns 101A in FIG. 15 are made of the metal material. The light-shielding patterns 101A may be electrically connected to respective connection patterns of the source-drain conductive layer 108 corresponding to the switching transistor T1, the driving transistor T2, and the sensing transistor T3 to form structures similar to upper-lower double channels in the switching transistor T1, the driving transistor T2 and the sensing transistor T3, so as to improve electrical performances of the transistors. The source-drain conductive layer 108 includes connection patterns electrically connected to the first electrode and the second electrode of each transistor and the plurality of data lines DL.

The light-shielding pattern 101A may be of a single-layer structure, or may be of a multi-layer structure composed of multiple films sequentially laminated.

The light-emitting device 22 includes the anode 221, a light-emitting layer 222, and the cathode 223 that are sequentially stacked. The anode 221 is electrically connected to the second electrode of the driving transistor T2.

For example, at least one of the anode 221 and the cathode 223 is a light-transmissive layer. That is, at least one of the anode 221 and the cathode 223 may be made of a conductive material with high light transmittance.

For example, the conductive material with high light transmittance may be indium tin oxide (ITO).

In a case where the anode 221 is the light-transmissive layer, light emitted by the light-emitting device 22 may exit from a direction pointing to the substrate 1, and in this case, the display panel 100 may be a bottom-emission display panel. In a case where the cathode 223 is the light-transmissive layer, the light emitted by the light-emitting device 22 may exit from a direction facing away from the substrate 1, and in this case, the display panel 100 may be a top-emission display panel. In a case where the anode 221 and the cathode 223 are both light-transmissive layers, the display panel 100 may emit light on both sides.

The display panel 100 provided in the embodiments of the present disclosure achieves a layout design with a high aperture ratio, and an average aperture ratio of each region of the display region AA of the display panel 100 may reach 32% to 38.5%, such as 32%, 34%, 35.25%, 36% or 38.5%.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. The display panel, comprising:
    a substrate;
    a plurality of sub-pixels on a side of the substrate; the plurality of sub-pixels being arranged in a plurality of rows and a plurality of columns, sub-pixels in a row being arranged in a first direction and sub-pixels in a column being arranged in a second direction; and a sub-pixel including a pixel drive circuit and a light-emitting device electrically connected to the pixel drive circuit;
    a gate drive circuit located on a same side of the substrate as the plurality of sub-pixels, wherein the gate drive circuit includes a plurality of cascaded shift registers, and a shift register is electrically connected to a plurality of pixel drive circuits in a row of sub-pixels; the shift register includes a plurality of device groups, and a device group is located in a region between two adjacent sub-pixels in the corresponding row of sub-pixels; and the device group includes at least one transistor and/or at least one capacitor;
    a plurality of power supply voltage lines extending along the second direction; and
    a plurality of auxiliary power supply voltage lines extending along the first direction, each power supply voltage line being electrically connected to auxiliary power supply voltage lines,
    wherein the gate drive circuit further includes a plurality of cascade input signal lines and a plurality of cascade display reset signal lines;
    a cascade input signal line is configured to connect a shift signal terminal of one shift register and an input signal terminal of another shift register; a cascade display resit signal line is configured to connect a shift signal terminal of one shift register and a display reset signal terminal of another shift register; and
    the display panel has a plurality of sub-pixel regions for arranging the plurality of sub-pixels and first gap regions each located between two adjacent columns of sub-pixels regions; and the cascade display reset signal lines and the cascade input signal lines are disposed in the first gap regions, and both are disposed in different first gap regions;
    wherein each sub-pixel region includes a sub-pixel circuit region for arranging a corresponding pixel drive circuit and a sub-pixel light-emitting region for arranging a corresponding light-emitting device that are arranged in the second direction;
    in the second direction, any three adjacent rows of sub-pixel regions are a first row of sub-pixel regions, a second row of sub-pixel regions, and a third row of sub-pixel regions; and
    a region between the first row of sub-pixel regions and the second row of sub-pixel regions is a second gap region, and a region between the second row of sub-pixel regions and the third row of sub-pixel regions is a third gap region;
    wherein in the first row of sub-pixel regions and the second row of sub-pixel regions, sub-pixel light emitting regions are all closer to the second gap region than sub-ixel circuit regions; and
    in the second row of sub-pixel regions and the third row of sub-pixel regions, sub-pixel circuit regions are all closer to the thir gap region than sub-pixel light-emitting regions; and
    wherein at least three sub-pixel regions constitute a pixel region, each row of pixel regions corresponds to at least one auxiliary power supply voltage line; and
    pixel drive circuits in sub-pixels in at least one pixel region corresponding to any auxiliary power supply voltage line are all electrically connected to the auxiliary power supply voltage line.

2. The display panel according to claim 1, further comprising:
    a passivation layer, a color filter layer and a planarization layer that are disposed on the substrate in sequence and located between pixel drive circuits and light-emitting devices in the plurality of sub-pixels,
    wherein the passivation layer and the planarization layer are together provided with first via holes each penetrating through both of the passivation layer and the planarization layer; the pixel drive circuit is electrically connected to the light-emitting device through a first via hole in the first via holes;
    the color filter layer includes a plurality of filter portions, each filter portion is disposed in a sub-pixel light-emitting region of a corresponding sub-pixel region;
    in a same sub-pixel region, in the second direction, a filter portion and the first via hole have at least a portion of the pixel drive circuit located in the sub-pixel region and/or an auxiliary power supply voltage line located in the sub-pixel region therebetween.

3. The display panel according to claim 2, further comprising:

gate lines for transmitting gate signals, data lines for transmitting data signals, and first sensing signal lines for transmitting sensing signals;

wherein the pixel drive circuit includes:

a switching transistor, a control electrode of the switching transistor being electrically connected to a gate line in the gate lines, and a first electrode of the switching transistor being electrically connected to a data line in the data lines;

a storage capacitor, a first electrode plate of the storage capacitor being electrically connected to a second electrode of the switching transistor, and a second electrode plate of the storage capacitor being electrically connected to the light-emitting device;

a driving transistor, a control electrode of the driving transistor being electrically connected to the second electrode of the switching transistor and the first electrode plate of the storage capacitor, a first electrode of the driving transistor being electrically connected to the auxiliary power supply voltage line, and a second electrode of the driving transistor being electrically connected to the light-emitting device and the second electrode plate of the storage capacitor; and a sensing transistor, a control electrode of the sensing transistor being electrically connected to the gate line, a first electrode of the sensing transistor being electrically connected to a first sensing signal line in the first sensing signal lines, and a second electrode of the sensing transistor being electrically connected to the light-emitting device, the second electrode plate of the storage capacitor and the second electrode of the driving transistor, wherein the switching transistor and the sensing transistor are farther away from the sub-pixel light-emitting region of the sub-pixel region where the pixel drive circuit is located than the driving transistor.

4. The display panel according to claim 3, further comprising:

an active layer, a gate insulating layer, a gate conductive layer, an interlayer dielectric layer and a source-drain conductive layer that are disposed on the substrate in sequence, wherein the active layer includes first electrodes, channel portions and second electrodes of the switching transistor, the driving transistor and the sensing transistor;

the gate conductive layer includes control electrodes of the switching transistor, the driving transistor and the sensing transistor; and the source-drain conductive layer includes first connection patterns and second connection patterns;

the interlayer dielectric layer and the gate insulating layer are together provided with second via holes each penetrating through both of the interlayer dielectric layer and the gate insulating layer, and the interlayer dielectric layer is provided with third via holes therein;

a first connection pattern in the first connection patterns is electrically connected to the second electrode of the switching transistor through a second via hole in the second via holes, and is electrically connected to the control electrode of the driving transistor through a third via hole in the third via holes;

the interlayer dielectric layer is further provided with fourth via holes therein, and a second connection pattern in the second connection patterns is electrically connected to the second electrode of the driving transistor through a fourth via hole in the fourth via holes; and in the same sub-pixel region, in the second direction, the filter portion and the first via hole have the control electrode, the channel portion and the first electrode of the driving transistor and the auxiliary supply voltage line therebetween.

5. The display panel according to claim 3, futher comprising:

the active layer, the gate insulating layer, the gate conductive layer, the interlayer dielectric layer and the source-drain conductive layer that are disposed on the substrate in sequence;

wherein the active layer includes the first electrodes, the channel portions and the second electrodes of the switching transistor, the driving transistor and the sensing transistor; the gate conductive layer includes the control electrodes of the switching transistor, the driving transistor and the sensing transistor; the source-drain conductive layer includes the first connection patterns and the second connection patterns;

the interlayer dielectric layer and the gate insulating layer are together provided with the second via holes each penetrating through both of the interlayer dielectric layer and the gate insulating layer, and the interlayer dielectric layer is provided with the third via holes therein; the first connection pattern in the first connection patterns is electrically connected to the second electrode of the switching transistor through the second via hole in the second via holes, and is electrically connected to the control electrode of the driving transistor through the third via hole in the third via holes;

the interlayer dielectric layer is further provided with the fourth via holes therein, and the second connection pattern in the second connection patterns is electrically connected to the second electrode of the driving transistor through the fourth via hole in the fourth via holes; and in the same sub-pixel region, in the second direction, the filter portion and the first via hole have the control electrode, the channel portion and the first electrode of the driving transistor and the auxiliary supply voltage line therebetween; and the display panel further comprising:

a first electrode layer and a buffer layer that are disposed on the substrate in sequence, wherein the first electrode layer and the buffer layer are located on a side of the active layer proximate to the substrate; the first electrode layer includes the second electrode plate of the storage capacitor, and the active layer further includes the first electrode plate of the storage capacitor;

the interlayer diecltric layer is further provided with fifth via holes therein, the first connection pattern is further electrically connected to the first electrode plate of the storage capacitor through a fifth via hole in the fifth via holes; the interlayer dielectric layer and the buffer layer are together provided with sixth via holes each penetrating through both of the interlayer dielectric layer and the buffer layer, and the second connection pattern is further electrically connected to the second electrode plate of the storage capacitor through a sixth via hole in the sixth via holes; and the fith via hole and the sixth via hole are both located on a side of the storage capacitor proximate to the third gap region.

6. The display panel according to claim 1, wherein each row of pixel regions corresponds to auxiliary power supply voltage lines; in the first direction, two adjacent auxiliary power supply voltage lines are separated by the first gap region.

7. The display panel according to claim 1, wherein the gate drive circuit further includes a plurality of transmission signal lines located in second gap regions and extending along the first direction; and
  two shift registers electrically connected to sub-pixels located in the first row of sub-pixel regions and sub-pixels located in the second row of sub-pixel regions share at least one of the plurality of transmission signal lines; or
  the gate drive circuit further includes the plurality of transmission signal lines located in the second gap regions and extending along the first direction;
  the two shift registers electrically connected to the sub-pixels located in the first row of sub-pixel regions and the sub-pixels located in the second row of sub-pixel regions share the at least one of the plurality of transmission signal lines; and
  the display panel further comprises a plurality of gate lines extending along the first direction; a gate line is electrically connected to the pixel drive circuits in the row of sub-pixels;
  wherein the plurality of transmission signal lines and the plurality of gate lines are made of a same material and disposed in a same layer.

8. The display panel according to claim 7, wherein the gate drive circuit further includes:
  a first voltage signal line electrically connected to first voltage signal terminals of the two shift registers;
  a second voltage signal line electrically connected to second voltage signal terminals of the two shift registers; and
  a third voltage signal line electrically connected to third voltage signal terminals of the two shift registers;
  wherein a transmission signal line of the plurality of transmission signal lines is the first voltage signal line, the second voltage signal line, or the third voltage signal line; and/or
  at least one cascade input signal line includes a first input signal sub-line and a second input signal sub-line that are located in different first gap regions;
  the gate drive circuit further includes an input signal connection line located in a second gap region and electrically connected to the first input signal sub-line and the second input signal sub-line; and
  a transmission signal line of the plurality of transmission signal lines is the input signal connection line; and/or
  at least one cascade display rest signal line includes a first display reset signal sub-line and a second display reset signal sub-line that are located in different first gap regions;
  the gate drive circuit further includes a display reset connection line located in a second gap region and electrically connected to the first display reset signal sub-line and the second display reset signal sub-line; and
  a transmission signal line of the plurality of transmission signal lines is the display reset connection line.

9. The display panel according to claim 7, wherein the gate drive circuit further includes a plurality of node voltage transmission lines located in the second gap regions;
  in a same shift register, at least two device groups are electrically connected to a same node through a node voltage transmission line;
  in the two shift registers, at least two device groups are electrically connected to a same node through a node voltage transmission line; and
  transmission signal lines of the plurality of transmission signal lines are the node voltage transmission lines.

10. The display panel according to claim 9, wherein the shift register includes:
  a first input circuit electrically connected to the input signal terminal, a pull-up node, and a leakage prevention node; the first input circuit being configured to, during a display period of a frame display phase, transmit an input signal to the pull-up node and the leakage prevention node in response to the input signal received at the input signal terminal;
  an output circuit electrically connected to the pull-up node, a first clock signal terminal, and a first output signal terminal; the output circuit being configured to, during the display period of the frame display phase, transmit a first clock signal received at the first clock signal terminal to the first output signal terminal under control of a voltage of the pull-up node; and
  a leakage prevention circuit electrically connected to the pull-up node, the first voltage signal terminal and the leakage prevention node; the leakage prevention circuit being configured to transmit a first voltage signal received at the first voltage signal terminal to the leakage prevention node under control of the voltage of the pull-up node, so as to prevent leakage of the pull-up node;
  wherein the first input circuit, the output circuit, and the leakage prevention circuit each include at least one device group;
  at least one device group used to be electrically connected to the pull-up node in the first input circuit and at least one device group used to be electrically connected to the pull-up node in the output circuit are electrically connected to the pull-up node through a node voltage transmission line; and
  at least one device group used to be electrically connected to the leakage prevention node in the first input circuit and at least one device group used to be electrically connected to the leakage prevention node in the leakage prevention circuit are electrically connected to the leakage prevention node through another node voltage transmission line.

11. The display panel according to claim 10, wherein the gate drive circuit further includes a plurality of blanking input circuits; a blanking input circuit is electrically connected to at least two adjacent shift registers;
  the blanking input circuit is configured to, during a blanking period of the frame display phase, control a corresponding shift register to input a blanking control signal to pixel drive circuits in a corresponding row, so that the pixel drive circuits obtain sensing signals;
  the blanking input circuit includes:
  a selection control circuit electrically connected to a selection control signal terminal, a shift signal terminal, a second voltage signal terminal, and a first blanking node; and the selection control circuit being configured to transmit a shift signal received at the shift signal terminal to the first blanking node under control of a selection control signal transmitted by the selection control signal terminal;

a second input circuit electrically connected to the first blanking node, a second blanking node, and a second clock signal terminal or the first voltage signal terminal; and the second input circuit being configured to transmit a second clock signal received at the second clock signal terminal or the first voltage signal received at the first voltage signal terminal to the second blanking node under control of a voltage of the first blanking node; and at least two transmission circuits, a transmission circuit being electrically connected to the pull-up node of a corresponding shift register; the transmission circuit being further electrically connected to the second blanking node and the second clock signal terminal; and the transmission circuit being configured to transmit the second clock signal or the first voltage signal received at the second blanking node to the pull-up node under control of the second clock signal transmitted by the second clock signal terminal;

wherein the second input circuit and the transmission circuit each include at least one device group; and each of device groups included in the second input circuit and the transmission circuit is located in a region between two adjacent sub-pixels in a row of sub-pixels where a corresponding shift register is located; and at least one device group used to be electrically connected to the second blanking node in the second input circuit and at least one device group used to be electrically connected to the second blanking node in the at least two transmission circuits are electrically connected to the second blanking node through a node voltage transmission line.

12. The display panel according to claim 1, wherein the gate drive circuit further includes a plurality of control signal lines extending along the second direction; and the shift register is electrically connected to at least part of the plurality of control signal lines; and the shift register is configured to provide an output signal to the pixel drive circuits in the corresponding row of sub-pixels under control of the at least part of the control signal lines electrically connected to the shift register; or the gate drive circuit further includes the plurality of control signal lines extending along the second direction; and the shift register is electrically connected to the at at least part of the plurality of control signal lines;

the shift register is configured to provide the output signal to the pixel drive circuits in the corresponding row of sub pixels under control of the at least part of the control signal lines electrically connected to the shift register; and at least one of the plurality of control signal lines is located in a first gap region.

13. A display apparatus, comprising the display panel according to claim 1.

14. The display panel according to claim 1, wherein each column of pixel regions corresponds to one power supply voltage line, and the power supply voltage line is located on a side of opposite sides of the column of pixel regions in the first direction; and each pixel region corresponds to one axuliary power supply voltage line, and each auxiliary power supply voltage line is electrically connected to the pixel drive circuits in the sup-pixles in the corresponding pixel region.

15. The display panel according to claim 1, further comprising:

an active layer, a gate insulating layer, a gate conductive layer, an interlayer dielectric layer and a source-drain conductive layer that are disposed on the substrate in sequence, wherein the pixel drive circuit includes a driving transistor, the active layer includes a first electrode, a channel portion and a second electrode of the drivining transistor; the source-drain conductive layer includes a plurality of third connection patterns; the plurality of auxiliary power supply voltage lines are located in the gate conductive layer;

the interlayer dielectric layer is provided with seventh via holes therein, and the interlayer dielectric layer and the gate insulating layer are together provided with eighth via holes therein; a third connection pattern in the plurality of third connection patterns is electrically connected to a corresponding auxiliary power supply voltage line through a seventh via hole in the seventh via holes; and is electrically connected to the first electrode of the driving transistor through an eight via hole in the eighth via holes; and the power supply voltage lines are located in the source-drain concutive layer; and in a same pixel region, a third connection pattern in third connection patterns that is closest to a power supply voltage line corresponding to the pixel region is electrically connected to the power supply voltage line.

16. a display panel comprising:

a substrate;

a plurality of sub-pixels disposed on a side of the substrate; the plurality of sub-pixels being arranged in a plurality of rows and a plurality of columns, sub-pixels in a row being arranged in a first direction and sub-pixels in a column being arranged in a second direction; and a sub-pixel including a pixel drive circuit and a light-emitting device electrically connected to the pixel drive circuit; and a gate drive circuit located on a same side of the substrate as the plurality of sub-pixels, wherein the gate drive circuit includes a plurality of cascaded shift registers, and a shift register is electrically connected to a plurality of pixel drive circuits in a row of sub-pixels; the shift register includes a plurality of device groups, and a device group is located in a region between two adjacent sub-pixels in the corresponding row of sub-pixels; and the device group includes at least one transistor and/or at least one capacitor;

wherein the gate drive circuit further includes a plurality of cascade input signal lines and a plurality of cascade display reset signal lines; a cascade input signal line is configured to connect a shift signal terminal of one shift register and an input signal terminal of another shift register; and a cascade display reset signal line is configured to connect a shift signal terminal of one shift register and a display reset signal terminal of another shift register; and the display panel has a plurality of sub-pixel regions for arranging the plurality of sub-pixels and first gap regions each located between two adjacent columns of sub-pixels regions; and the cascade display reset signal lines and the cascade input signal lines are disposed in the first gap regions, and both are disposed in different first gap regions;

wherein each sub-pixel region includes a sub-pixel circuit region for arranging a corresponding pixel drive circuit and a sub-pixel light-emitting region for arranging a corresponding light-emitting device that are arranged in the second direction;

in the second direction, any three adjacent rows of sub-pixel regions are a first row of sub-pixel regions, a second row of sub-pixel regions, and a third row of sub-pixel regions; and a region between the first row of sub-pixel regions and the second row of sub-pixel regions is a second gap region, and a region between the second row of sub-pixel regions and the third row of sub-pixel regions is a third gap region;

wherein in the rist row of sub-pixel regions and the second row of sub-pixel regions, sub-pixel light-emitting regions are all closer to the second gap region than sub-pixel cricuit regions; and in the second row of sub-pixel regions and the third row of sub-pixel regions, sub-pixel circuit regions are all closer to the third gap region than sub-pixel light-emitting regions;

the display panel further comprising:

a plurality of gate lines, wherein each of the gate lines is in a shape of a polyline and substantially extends along the first direction, and a gate line is electrically connected to pixel drive circuits in a row of sub-pixels;

wherein the gate line includes a plurality of first extension segments, a plurality of second extension segments and a plurality of connection segments, each of the first extension segments and each of the second extension segments substantially extend along the first direction, the plurality of first extension segments and the plurality of second extension segments are alternately arranged, and a first extension segment and an adjacent second extension segment are connected by a connection segment; and in the second direction, a distance exists between extension lines of the first extension segment and the adjacent second extension segment;

the first extension segment and two connection segments connected to the first extension segment together constitute a first recess, and an opening of the first recess is disposed towards a side of the gate line away from the third gap region;

the second extension segment and two connection segments connected to the second extension segment together constitute a second recess, and an opening of the second recess is disposed towards the third gap region; and at least a portion of the pixel drive circuit is located in the first recess or the second recess.

* * * * *